US012795925B2

(12) United States Patent
Ehara et al.

(10) Patent No.: US 12,795,925 B2
(45) Date of Patent: Nov. 10, 2026

(54) THREE-DIMENSIONAL MEMORY DEVICE WITH DIELECTRIC FINS IN STAIRCASE REGION AND METHODS OF MAKING THEREOF

(71) Applicant: Sandisk Technologies, Inc., Milpitas, CA (US)

(72) Inventors: Ryoichi Ehara, Yokkaichi (JP); Kenji Sugiura, Kanagawa (JP); Katsufumi Okamoto, Yokkaichi (JP); Yudai Tanaka, Yokkaichi (JP); Kota Funayama, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 439 days.

(21) Appl. No.: 18/350,595

(22) Filed: Jul. 11, 2023

(65) Prior Publication Data

US 2024/0196610 A1 Jun. 13, 2024

Related U.S. Application Data

(60) Provisional application No. 63/386,368, filed on Dec. 7, 2022.

(51) Int. Cl.
*H10B 43/27* (2023.01)
*H10B 41/27* (2023.01)

(52) U.S. Cl.
CPC ............. *H10B 43/27* (2023.02); *H10B 41/27* (2023.02)

(58) Field of Classification Search
CPC ................................ H10B 43/27; H10B 41/27
See application file for complete search history.

(56) References Cited

U.S. PATENT DOCUMENTS 9,236,391 B2 1/2016 Chen et al.
9,236,392 B1 1/2016 Izumi et al.
(Continued)

FOREIGN PATENT DOCUMENTS

KR 20200039800 A 4/2020
KR 20210091274 A 7/2021

OTHER PUBLICATIONS

IPRP-WO—Notification Concerning Transmittal of International Preliminary Report on Patentability and Written Opinion of the International Searching Authority for International Patent Application No. PCT/US2023/077035, mailed Jun. 19, 2025, 6 pages.
(Continued)

*Primary Examiner* — Mohammad M Choudhry
(74) *Attorney, Agent, or Firm* — THE MARBURY LAW GROUP PLLC

(57) ABSTRACT

A memory device is formed by forming an alternating stack of insulating layers and sacrificial material layers over a substrate, forming memory openings through the alternating stack, forming memory opening fill structures in the memory openings, forming an access trench through a portion of the alternating stack forming an access trench fill structure in the access cavity, and iteratively performing multiple instances of a unit processing sequence. Each instance of the unit processing sequence includes a vertical recess etch step that vertically recesses the access trench fill structure and an isotropic etch step that isotropically recesses the sacrificial material layers. A finned access cavity is formed after the multiple instances of the unit processing sequence. A finned dielectric support structure is formed in the finned access cavity, and the sacrificial material layers are replaced with electrically conductive layers.

10 Claims, 83 Drawing Sheets

(56) References Cited

U.S. PATENT DOCUMENTS

| | | | | |
|---|---|---|---|---|
| 9,401,309 | B2 | 7/2016 | Izumi et al. | |
| 9,524,901 | B2 | 12/2016 | Izumi et al. | |
| 9,601,502 | B2 | 3/2017 | Sano et al. | |
| 9,691,778 | B2 | 6/2017 | Izumi et al. | |
| 9,853,038 | B1 | 12/2017 | Cui | |
| 9,960,181 | B1 | 5/2018 | Cui et al. | |
| 11,282,783 | B2 | 3/2022 | Otsu et al. | |
| 11,450,679 | B2 | 9/2022 | Tanaka et al. | |
| 11,488,975 | B2 | 11/2022 | Totoki et al. | |
| 11,495,612 | B2 | 11/2022 | Tanaka et al. | |
| 2016/0148946 | A1 | 5/2016 | Hironaga | |
| 2019/0172838 | A1 | 6/2019 | Jo et al. | |
| 2021/0210424 | A1* | 7/2021 | Otsu | H10B 43/10 |
| 2021/0305266 | A1* | 9/2021 | Lee | H10B 41/10 |
| 2022/0189982 | A1 | 6/2022 | Luo et al. | |
| 2022/0352093 | A1 | 11/2022 | Yamada et al. | |
| 2022/0375958 | A1 | 11/2022 | Shimabukuro et al. | |
| 2023/0038557 | A1 | 2/2023 | Ogawa et al. | |
| 2023/0041950 | A1 | 2/2023 | Chibvongodze et al. | |
| 2023/0045001 | A1 | 2/2023 | Ogawa et al. | |

OTHER PUBLICATIONS

Endoh et al., "Novel Ultra High-Density Memory with a Stacked-Surrounding Gate Transistor (S-SGT) Structured Cell," IEDM Proc. (2001) 33-36.

U.S. Appl. No. 17/244,258, filed Apr. 29, 2021, SanDisk Technologies LLC.

U.S. Appl. No. 17/244,311, filed Apr. 29, 2021, SanDisk Technologies LLC.

U.S. Appl. No. 17/328,302, filed May 24, 2021, SanDisk Technologies LLC.

U.S. Appl. No. 17/462,446, filed Aug. 31, 2021, SanDisk Technologies LLC.

U.S. Appl. No. 17/663,951, filed May 18, 2022, SanDisk Technologies LLC.

U.S. Appl. No. 17/684,922, filed Mar. 2, 2022, SanDisk Technologies LLC.

U.S. Appl. No. 17/804,184, filed May 26, 2022, SanDisk Technologies LLC.

U.S. Appl. No. 17/806,390, filed Jun. 10, 2022, SanDisk Technologies LLC.

U.S. Appl. No. 17/806,579, filed Jun. 13, 2022, SanDisk Technologies LLC.

U.S. Appl. No. 17/807,804, filed Jun. 20, 2022, SanDisk Technologies LLC.

U.S. Appl. No. 17/936,012, filed Sep. 28, 2022, SanDisk Technologies LLC.

U.S. Appl. No. 17/936,479, filed Sep. 29, 2022, SanDisk Technologies LLC.

U.S. Appl. No. 63/385,083, filed Nov. 28, 2022, SanDisk Technologies LLC.

U.S. Appl. No. 63/385,089, filed Nov. 28, 2022, SanDisk Technologies LLC.

ISR—Notification of Transmittal of The International Search Report and Written Opinion of the International Searching Authority for International Patent Application No. PCT/US2023/077035, mailed Feb. 15, 2024, 8 pages.

* cited by examiner

THREE-DIMENSIONAL MEMORY DEVICE WITH DIELECTRIC FINS IN STAIRCASE REGION AND METHODS OF MAKING THEREOF

FIELD

The present disclosure relates generally to the field of semiconductor devices, and particularly to three-dimensional memory device and methods of making the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device is provided, which comprises: an alternating stack of insulating layers and electrically conductive layers located over a substrate, the electrically conductive layers having different lateral extents in a contact region that decrease with a vertical distance from a top surface of the substrate; memory openings vertically extending through the alternating stack and located in a memory array region in which each of the electrically conductive layers is present; memory opening fill structures located in the memory openings and comprising a respective vertical semiconductor channel and a vertical stack of memory elements located at levels of the electrically conductive layers; and a finned dielectric support structure located in the contact region and comprising a dielectric wall portion that continuous vertically extends from the substrate at least to a horizontal plane including top surfaces of the memory opening fill structures, and further comprises dielectric fin structures that are located at levels of the electrically conductive layers and laterally protrude outward from the dielectric wall portion.

According to another aspect of the present disclosure, a method of forming a memory device is provided, which comprises: forming an alternating stack of insulating layers and sacrificial material layers over a substrate; forming memory openings through the alternating stack; forming memory opening fill structures in the memory openings, wherein each of the memory opening fill structures comprises a respective vertical semiconductor channel and a vertical stack of memory elements; forming an access trench through a portion of the alternating stack; forming an access trench fill structure in the access cavity; iteratively performing multiple instances of a unit processing sequence, wherein each instance of the unit processing sequence comprises a vertical recess etch step that vertically recesses the access trench fill structure and an isotropic etch step that isotropically recesses physically exposed portions of the sacrificial material layers around a cavity that overlies the access trench fill structure, whereby a finned access cavity is formed after the multiple instances of the unit processing sequence; forming a finned dielectric support structure in the finned access cavity; and replacing the sacrificial material layers with electrically conductive layers.

DETAILED DESCRIPTION

Figure 1:
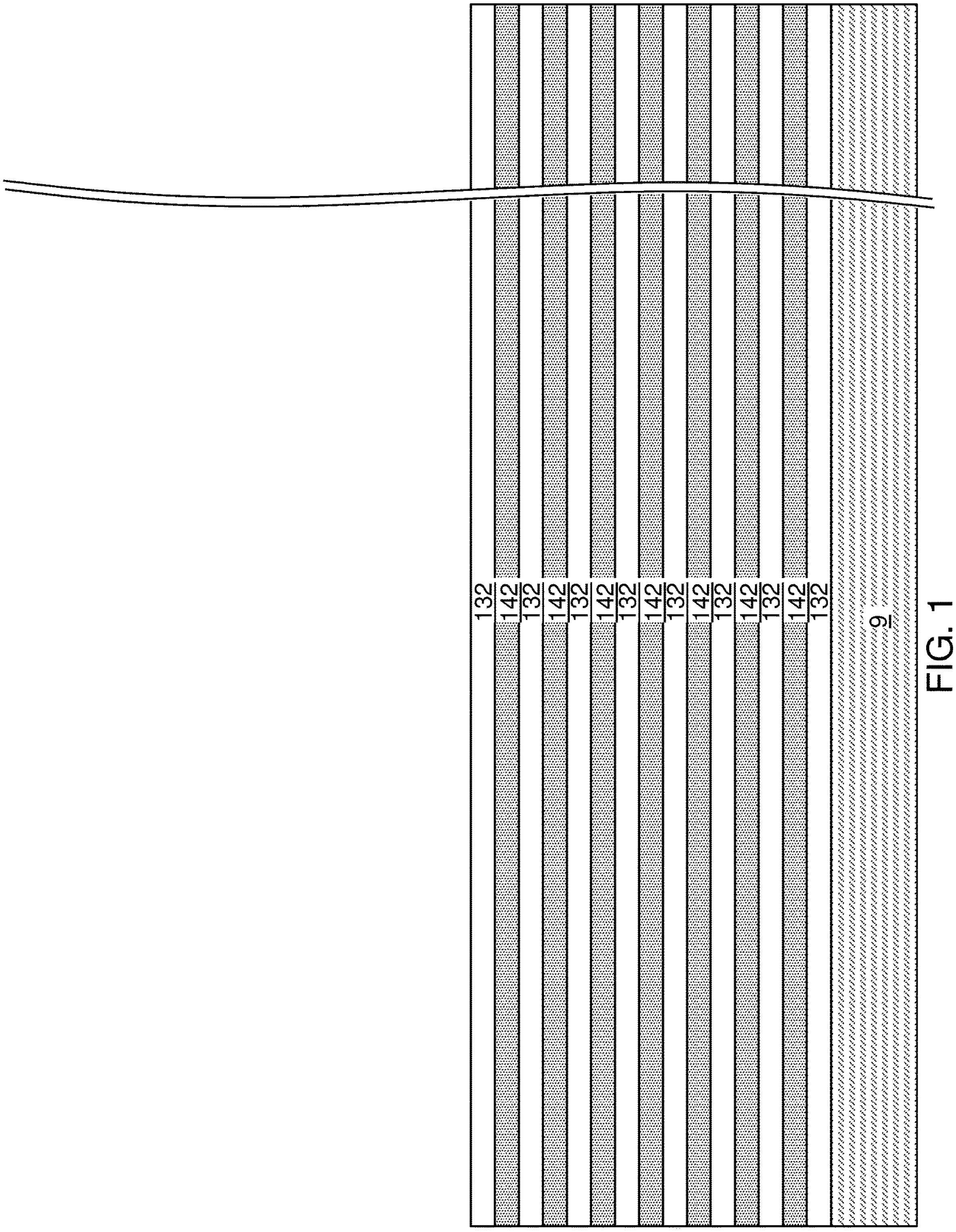
FIG. 1 is a vertical cross-sectional view of a first exemplary structure after formation of a first alternating stack of first insulating layers and first sacrificial material layers according to a first embodiment of the present disclosure.

As discussed above, the embodiments of the present disclosure are directed to a three-dimensional memory device with dielectric fins in the contact region, and methods of making thereof, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first exemplary structure according to a first embodiment of the present disclosure is illustrated. The first exemplary structure comprises a substrate 9. The substrate may comprise a semiconductor wafer, such as a silicon wafer, or silicon on insulator substrate. The substrate may include a semiconductor material layer at least within an upper portion. The semiconductor material layer may comprise a doped well in a silicon substrate or an epitaxial semiconductor layer grown on a silicon substrate, and may comprise a semiconductor material having a doping of a first conductivity type, which may be p-type or n-type. In one embodiment, the semiconductor material layer comprises single crystalline silicon layer.

An alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulting layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While an embodiment in which sacrificial material layers are replaced with electrically conductive layers is described below, other embodiments in which the spacer material layers are formed as electrically conductive layers (thereby obviating the need to perform the replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material which is different from the first insulating material. An alternating plurality of first insulating layers 132 and first sacrificial material layers 142 is formed over the substrate 9. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers 142 can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first-tier alternating stack (132, 142) can have a uniform thickness that is substantially invariant within each respective first sacrificial material layer 142.

Figure 2A:
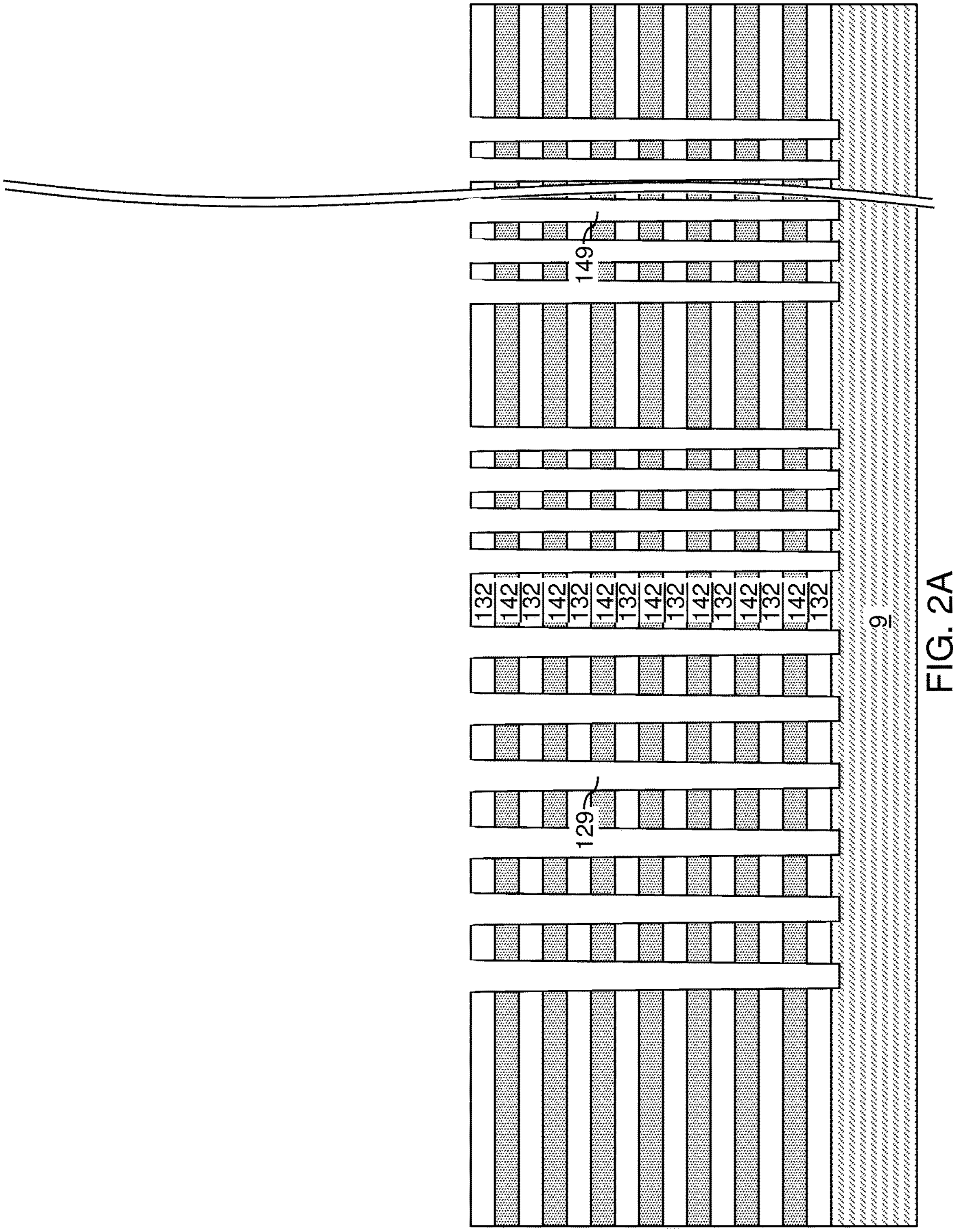
FIG. 2A is a vertical cross-sectional view of the first exemplary structure after formation of first-tier memory openings and first-tier support openings according to the first embodiment of the present disclosure.
Figure 2B:
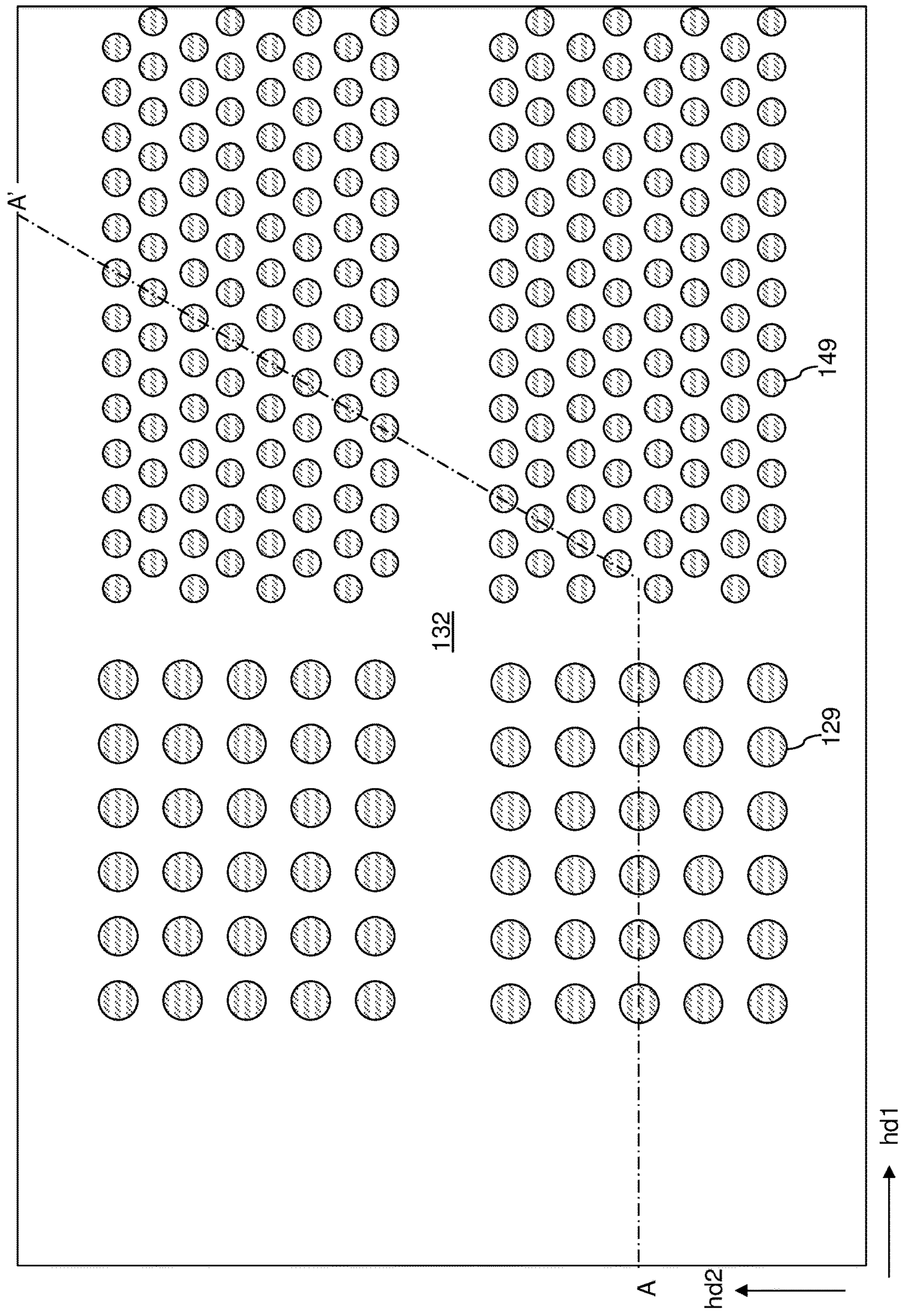
FIG. 2B is a top-down view of the first exemplary structure of FIG. 2A. The vertical plane A-A' is the cut plane of the vertical cross-sectional view of FIG. 2A.

Referring to FIGS. 2A and 2B, first-tier openings (149, 129) can be formed through the first-tier alternating stack (132, 142) and into an upper portion of the substrate 9. For example, a photoresist layer (not shown) can be applied over the first-tier alternating stack (132, 142), and can be lithographically patterned to form various openings therethrough. The pattern of openings in the photoresist layer can be transferred through the first-tier alternating stack (132, 142) and into an upper portion of the substrate 9 by a first anisotropic etch process to form the first-tier openings (149, 129) concurrently, i.e., during the first anisotropic etch process.

The first-tier openings (149, 129) can include first-tier memory openings 149 and first-tier support openings 129. The first-tier memory openings 149 are openings that are formed in a memory array region through the first alternating stack (132, 142) and are subsequently employed to form memory stack structures therein.

The first-tier support openings 129 are openings that are subsequently employed to form support structures for providing structural support to the first exemplary structure during replacement of sacrificial material layers with electrically conductive layers. In case the first spacer materials are formed as first electrically conductive layers, the first-tier support openings 129 can be omitted. The first-tier support openings 129 may have a larger width (e.g., diameter) than the first-tier memory openings 149.

In one embodiment, the first-tier memory openings 149 can be formed as clusters that extend in a first horizontal direction (e.g., word line direction) hd1, and are laterally spaced from each other along a perpendicular second horizontal direction (e.g., bit line direction) hd2. Each cluster of first-tier memory openings 149 can include a respective two-dimensional array of first-tier memory openings 149 having a first pitch along one horizontal direction and a second pitch along another horizontal direction. In one embodiment, the direction of the first memory structure pitch can be the first horizontal direction (e.g., word line direction) hd1 and the direction of the second memory structure pitch can be the second horizontal direction (e.g., bit line direction) hd2, or vice versa.

Figure 3A:
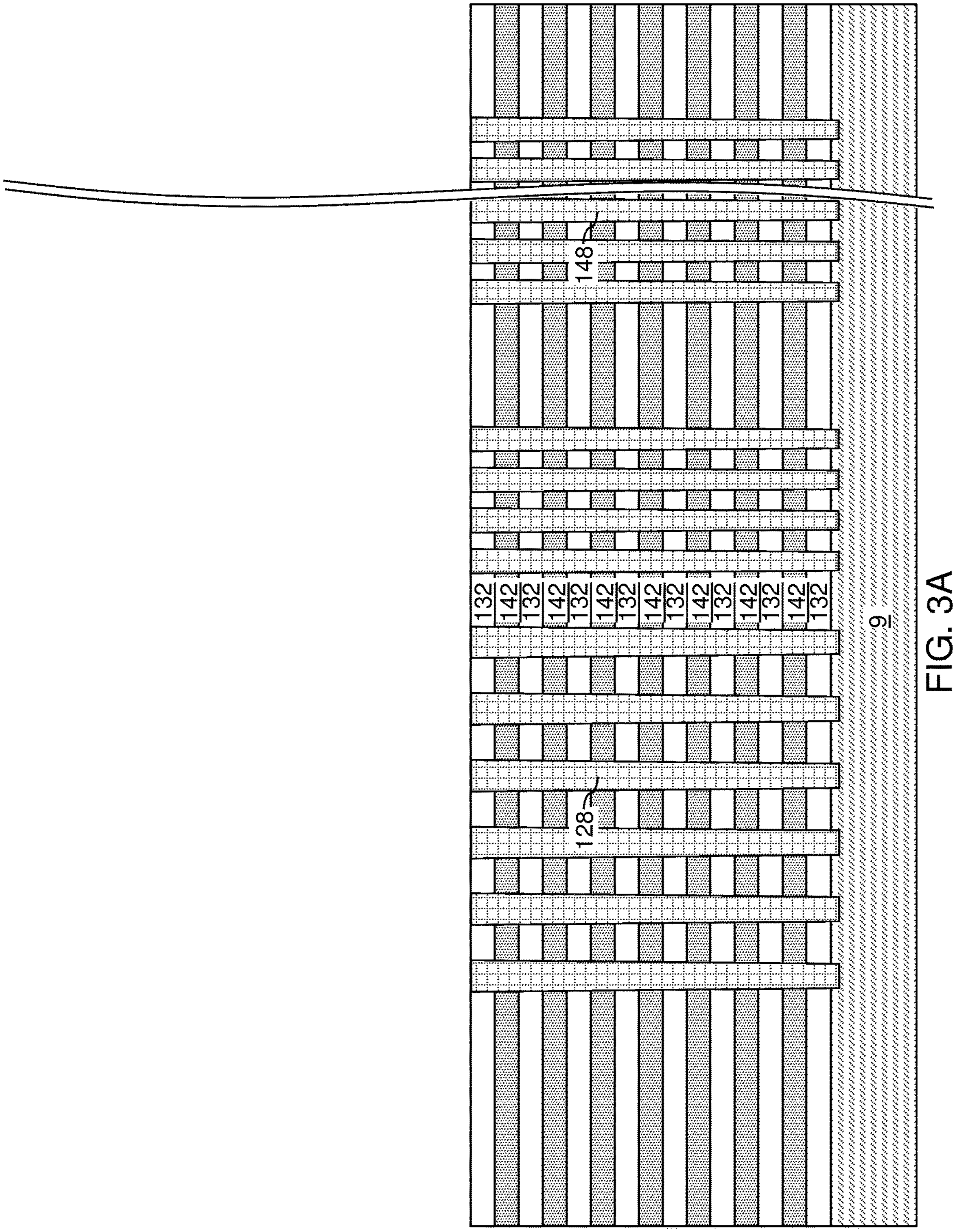
FIG. 3A is a vertical cross-sectional view of the first exemplary structure after formation of first-tier opening fill structures according to the first embodiment of the present disclosure.
Figure 3B:
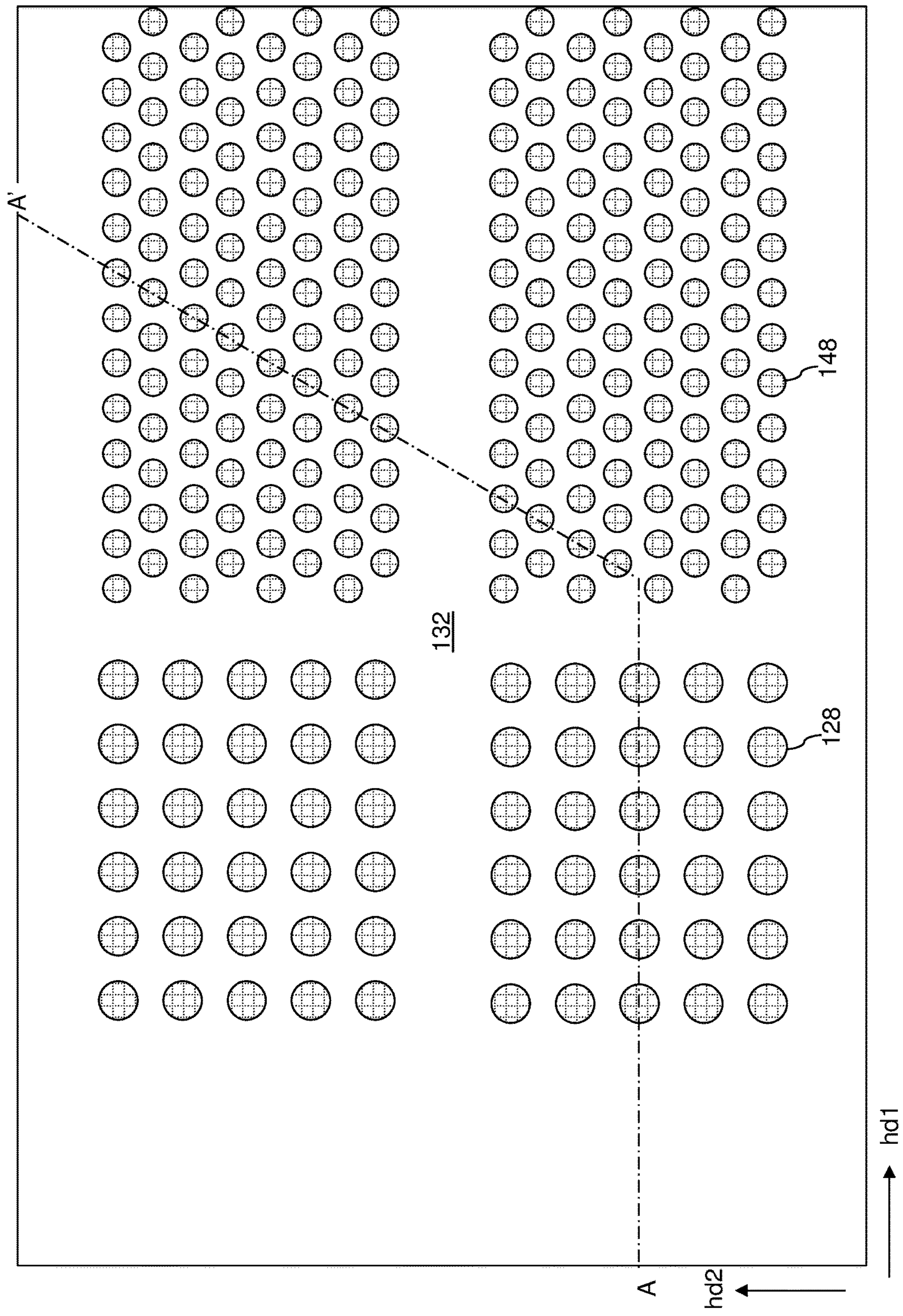
FIG. 3B is a top-down view of the first exemplary structure of FIG. 3A. The vertical plane A-A' is the cut plane of the vertical cross-sectional view of FIG. 3A.

Referring to FIGS. 3A and 3B, first-tier sacrificial opening fill portions (148, 128) can be formed in the respective first-tier openings (149, 129). For example, a sacrificial fill material is deposited concurrently deposited in each of the first-tier openings (149, 129). The sacrificial fill material includes a material that can be subsequently removed selective to the materials of the first insulating layers 132 and the first sacrificial material layers 142.

In one embodiment, the sacrificial fill material can include a semiconductor material such as silicon (e.g., a —Si or polysilicon), a silicon-germanium alloy, germanium, a III-V compound semiconductor material, or a combination thereof. Optionally, a thin etch stop layer (such as a silicon oxide layer or a silicon nitride layer having a thickness in a range from 1 nm to 3 nm) may be employed prior to depositing the first-tier sacrificial fill material. The sacrificial fill material may be formed by a non-conformal deposition or a conformal deposition method.

In another embodiment, the sacrificial fill material can include a carbon-containing material (such as amorphous carbon or diamond-like carbon) that can be subsequently removed by ashing, or a silicon-based polymer that can be subsequently removed selective to the materials of the first alternating stack (132, 142).

Portions of the deposited sacrificial fill material can be removed from above the topmost layer of the first vertically alternating sequence (132, 142), such as from above the first-tier alternating stack (132, 142). For example, the sacrificial fill material can be recessed to a top surface of the first-tier alternating stack (132, 142) employing a planarization process. The planarization process can include a recess etch, chemical mechanical planarization (CMP), or a combination thereof. The top surface of the first-tier alternating stack (132, 142) can be employed as an etch stop layer or a planarization stop layer.

Remaining portions of the sacrificial fill material comprise the first-tier sacrificial opening fill portions (148, 128). Specifically, each remaining portion of the sacrificial material in a first-tier memory opening 149 constitutes a first-tier sacrificial memory opening fill portion 148. Each remaining portion of the sacrificial material in a first-tier support opening 129 constitutes a first-tier sacrificial support opening fill portion 128. The top surfaces of the first-tier sacrificial opening fill portions (148, 128) can be coplanar with the top surface of the first-tier alternating stack (132, 142). Each of the first-tier sacrificial opening fill portions (148, 128) may, or may not, include cavities therein.

Figure 4:
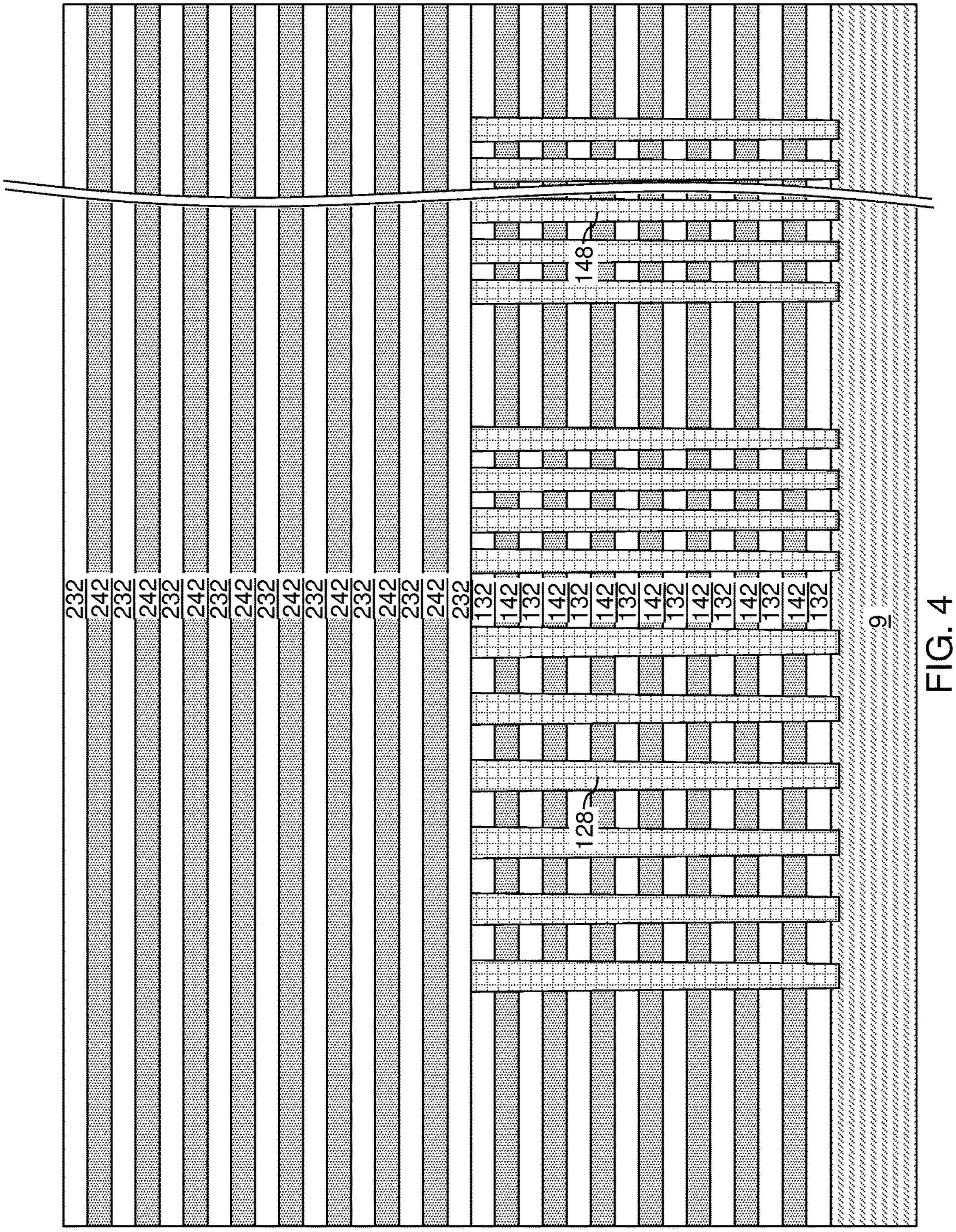
FIG. 4 is a vertical cross-sectional view of the first exemplary structure after formation of a second alternating stack of second insulating layers and second sacrificial material layers according to the first embodiment of the present disclosure.

Referring to FIG. 4, a second-tier structure can be formed over the first-tier structure (132, 142, 148, 128). The second-tier structure can include an additional vertically alternating sequence of additional insulating layers and additional spacer material layers, which can be additional sacrificial material layers. The second vertically alternating sequence is also referred to as a second alternating stack. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be an insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Optionally, drain-select-level isolation structures (not illustrated) can be formed through a subset of layers in an upper portion of the second vertically alternating sequence (232, 242). The second sacrificial material layers 242 that are cut by the select-drain-level shallow trench isolation structures correspond to the levels in which drain-select-level electrically conductive layers (e.g., drain side select gate electrodes) are subsequently formed. The drain-select-level isolation structures include a dielectric material, such as silicon oxide. The drain-select-level isolation structures can laterally extend along the first horizontal direction hd1, and can be laterally spaced apart along the second horizontal direction hd2 that is perpendicular to the first horizontal direction hd1.

Figure 5:
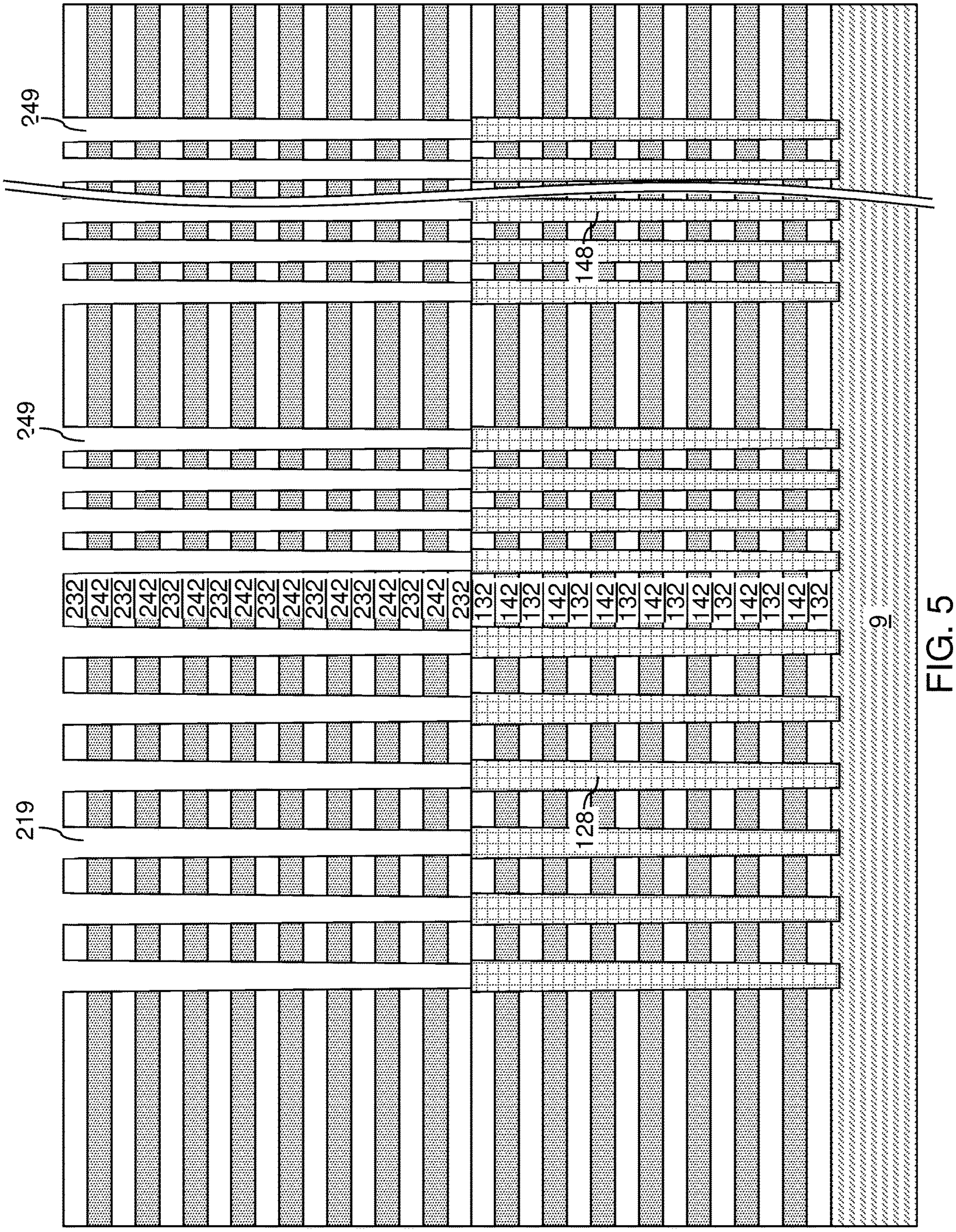
FIG. 5 is a vertical cross-sectional view of the first exemplary structure after formation of second-tier memory openings and second-tier support openings according to the first embodiment of the present disclosure.

Referring to FIG. 5, second-tier openings (249, 229) can be formed through the second-tier alternating stack (232, 242). A photoresist layer (not shown) can be applied over the second-tier alternating stack (232, 242), and can be lithographically patterned to form various openings therethrough. The pattern of the openings can be the same as the pattern of the various first-tier openings (149, 129), which is the same as the first-tier sacrificial opening fill portions (148, 128). Thus, the lithographic mask employed to pattern the first-tier openings (149, 129) can be employed to pattern the photoresist layer.

The pattern of openings in the photoresist layer can be transferred through the second-tier alternating stack (232, 242) by a second anisotropic etch process to form second-tier openings (249, 229) concurrently, i.e., during the second anisotropic etch process. The second-tier openings (249, 229) can include second-tier memory openings 249 and second-tier support openings.

The second-tier memory openings 249 are formed directly on a top surface of a respective one of the first-tier sacrificial memory opening fill portions 148. The second-tier support openings 229 are formed directly on a top surface of a respective one of the first-tier sacrificial support opening fill portions 128.

Figure 6:
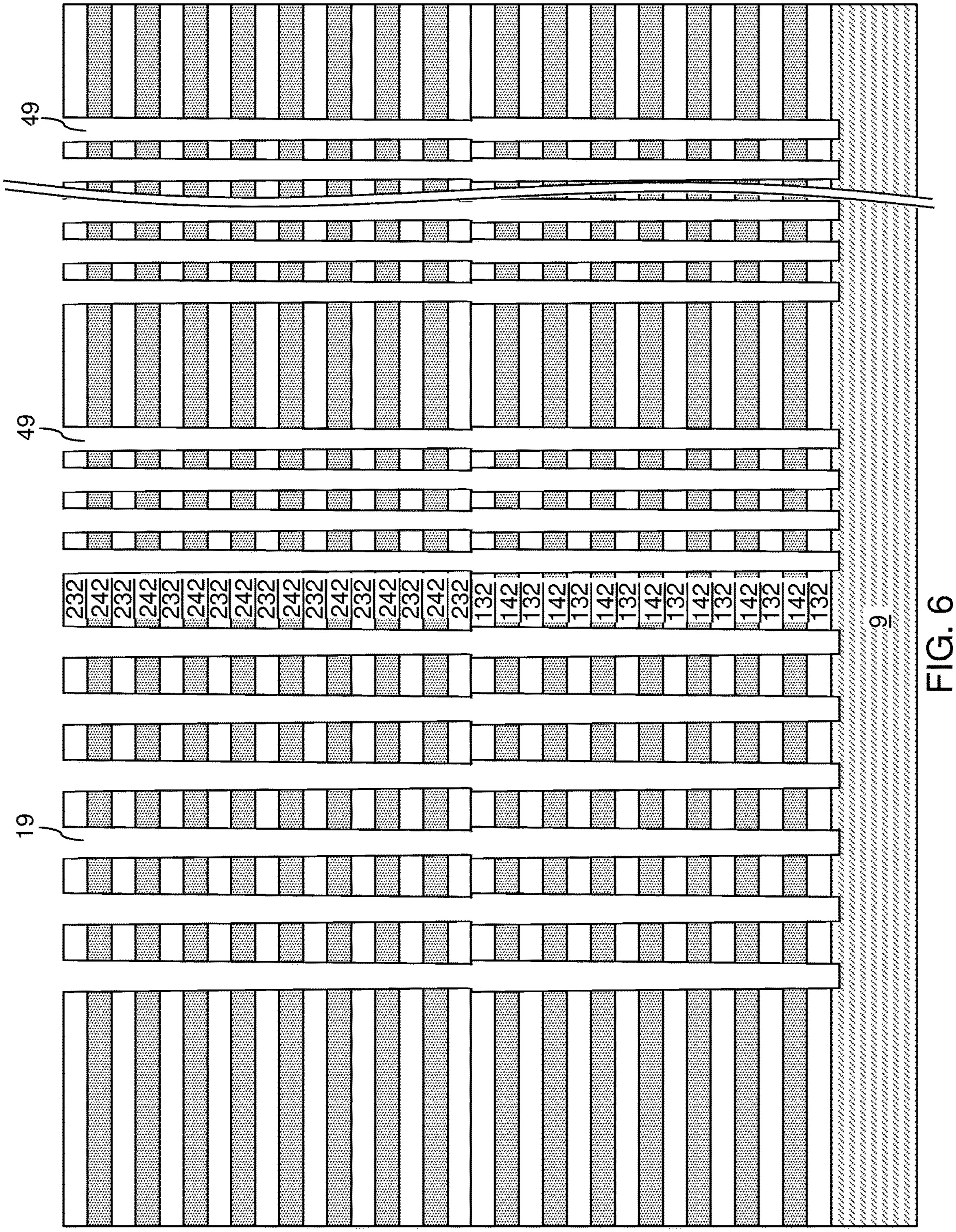
FIG. 6 is a vertical cross-sectional view of the first exemplary structure after formation of inter-tier memory openings and inter-tier support openings according to the first embodiment of the present disclosure.

Referring to FIG. 6, the sacrificial fill material can be removed from underneath the second-tier memory openings 249 and the second-tier support openings 229 employing an etch process that etches the sacrificial fill material selective to the materials of the first and second insulating layers (132, 232) and the first and second sacrificial material layers (142, 242). A memory opening 49, which is also referred to as an inter-tier memory opening 49, is formed in each volume from which a first-tier sacrificial memory opening fill portion 148 is removed. A support opening 19, which is also referred to as an inter-tier support opening 19, is formed in each volume from which a first-tier sacrificial support opening fill portion 128 is removed. The support openings may have a larger width (e.g., diameter) than the memory openings 49.

Figure 7A:
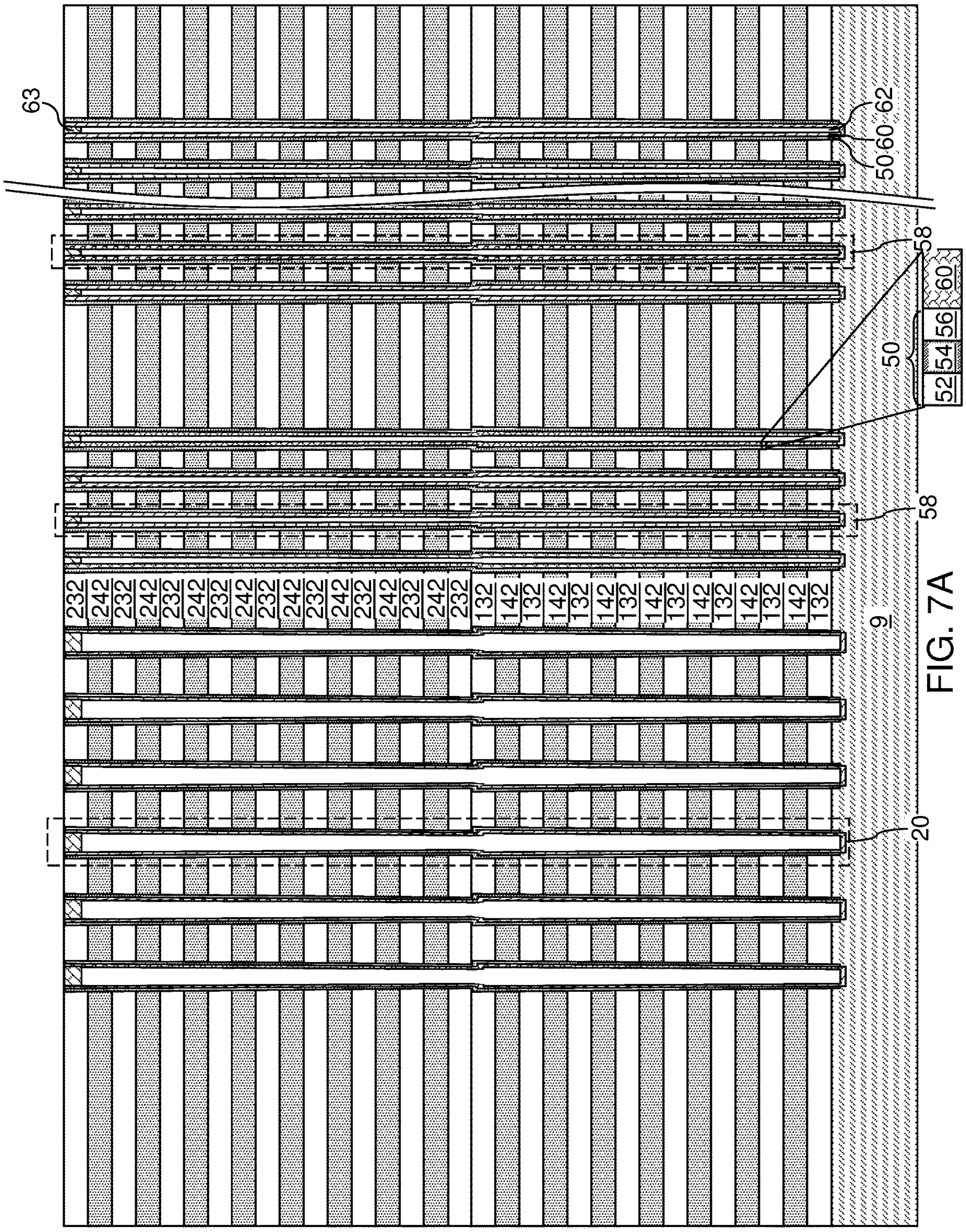
FIG. 7A is a vertical cross-sectional view of the first exemplary structure after formation of memory opening fill structures and support pillar structures according to the first embodiment of the present disclosure.
Figure 7B:
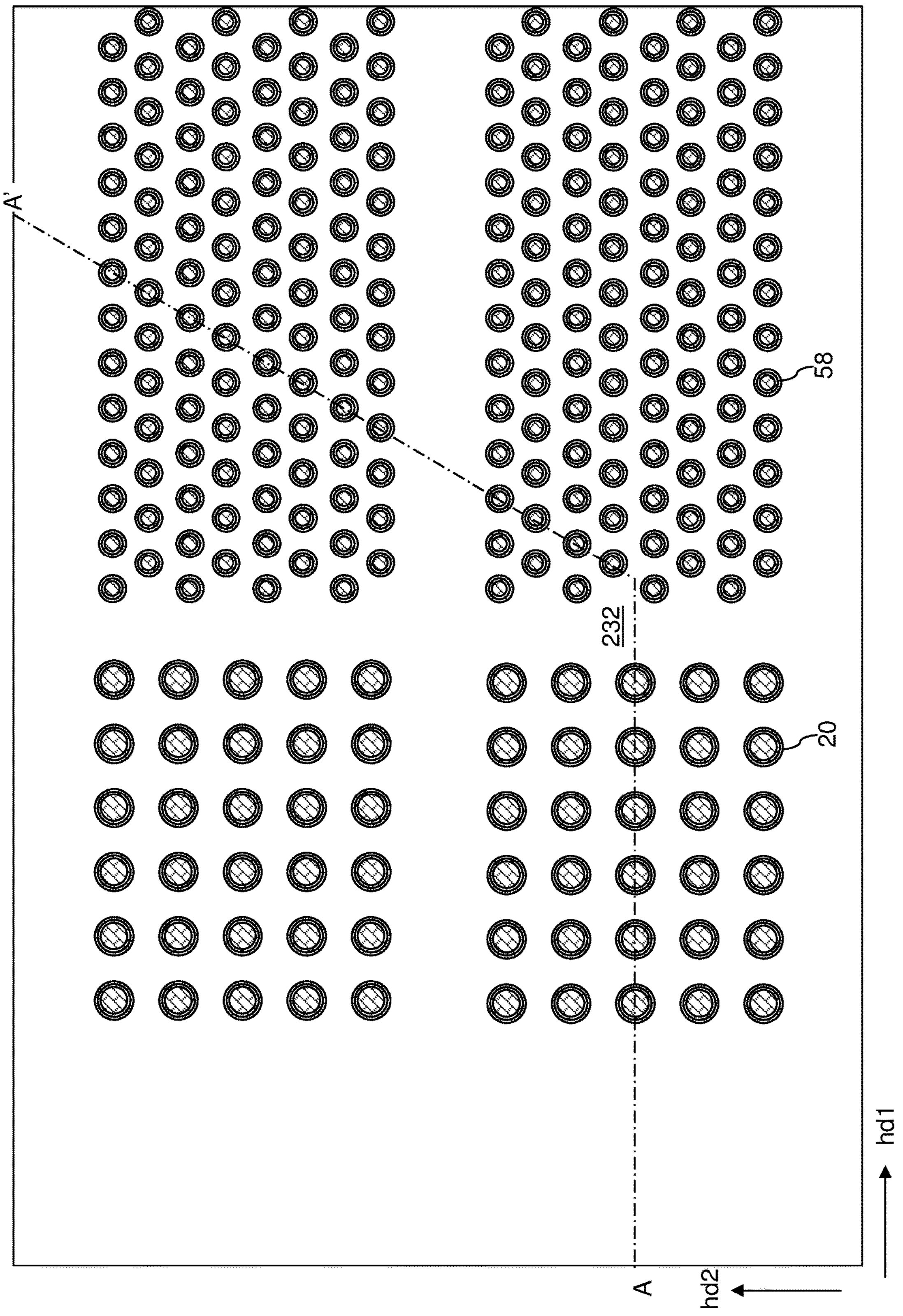
FIG. 7B is a top-down view of the first exemplary structure of FIG. 7A. The vertical plane A-A' is the cut plane of the vertical cross-sectional view of FIG. 7A.

Referring to FIGS. 7A and 7B, a memory film layer can be conformally deposited in the memory openings 49 and in the support openings 19. The memory film layer includes at least one memory material layer that can provide a vertical stack of memory elements at the levels of the sacrificial material layers. The at least one memory material layer may comprise a charge storage material, a phase change material that can provide at least two different resistive states, a ferroelectric memory material, or any other type of memory material that can store information by being programmed into one of at least two possible states. In an illustrative example, the memory film layer may comprise a layer stack including a blocking dielectric layer 52, a charge storage layer 54, and a tunneling dielectric layer 56.

An anisotropic etch process can be performed to remove horizontally-extending portions of the memory film layer. Each vertically-extending portion of the memory film layer located within a respective one of the memory openings 49 or the support openings 29 constitutes a memory film 50. In a non-limiting illustrative example, each memory film 50 may comprise a layer stack including a blocking dielectric layer 52, a charge storage layer 54, and a tunneling dielectric layer 56. A surface of the semiconductor material of the substrate 9 can be physically exposed within an opening at a bottom portion of each memory film 50.

A semiconductor channel material layer can be subsequently conformally deposited. The semiconductor channel material layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer includes amorphous silicon or polysilicon. The semiconductor channel material layer can be formed by a conformal deposition method such as low pressure chemical vapor deposition (LPCVD). The thickness of the semiconductor channel material layer can be in a range from 2 nm to 10 nm, although lesser and greater thicknesses can also be employed.

A dielectric core layer can be deposited in a remaining cavity within each of the memory openings 49 and the support openings 19. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. The horizontal portion of the dielectric core layer overlying the second-tier alternating stack (232, 242) can be removed, for example, by a recess etch. The recess etch continues until top surfaces of the remaining portions of the dielectric core layer are recessed to a height between the top surface of a topmost second insulating layer 232 and the bottom surface of the topmost second insulating layer 232. Each remaining portion of the dielectric core layer constitutes a dielectric core 62.

A doped semiconductor material can be deposited in cavities overlying the dielectric cores 62. The doped semiconductor material has a doping of the opposite conductivity type of the doping of the semiconductor channel material layer. Thus, the doped semiconductor material has a doping of the second conductivity type. Portions of the deposited doped semiconductor material and the semiconductor channel material layer that overlie the horizontal plane including the top surface of the second-tier alternating stack (232, 242) can be removed by a planarization process such as a chemical mechanical planarization (CMP) process.

Each remaining portion of the doped semiconductor material having a doping of the second conductivity type constitutes a drain region 63. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{18}/cm^3$ to $2.0\times10^{21}/cm^3$, although lesser and greater dopant concentrations can also be employed. The doped semiconductor material can be, for example, doped polysilicon.

Each remaining portion of the semiconductor channel material layer constitutes a vertical semiconductor channel 60 through which electrical current can flow when a vertical NAND device including the vertical semiconductor channel 60 is turned on. Each combination of a memory film 50 and a vertical semiconductor channel 60 within a memory opening 49 constitutes a memory stack structure. The memory stack structure is a combination of a vertical semiconductor channel 60 and a memory film 50. Each combination of a memory stack structure, a dielectric core 62, and a drain region 63 within a memory opening 49 constitutes a memory opening fill structure 58.

Figure 8A:
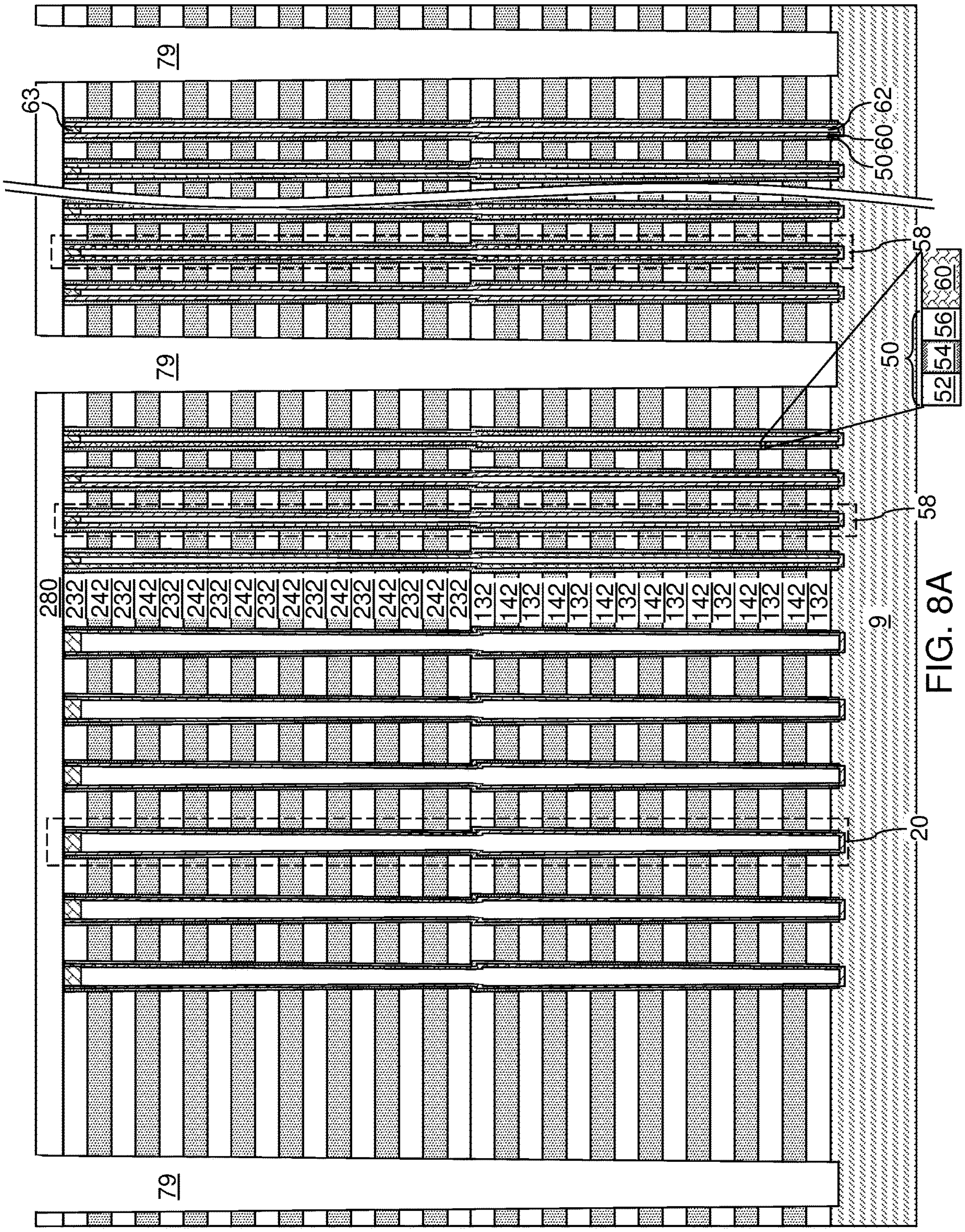
FIG. 8A is a vertical cross-sectional view of the first exemplary structure after formation of a contact-level dielectric layer and backside trench according to the first embodiment of the present disclosure.
Figure 8B:
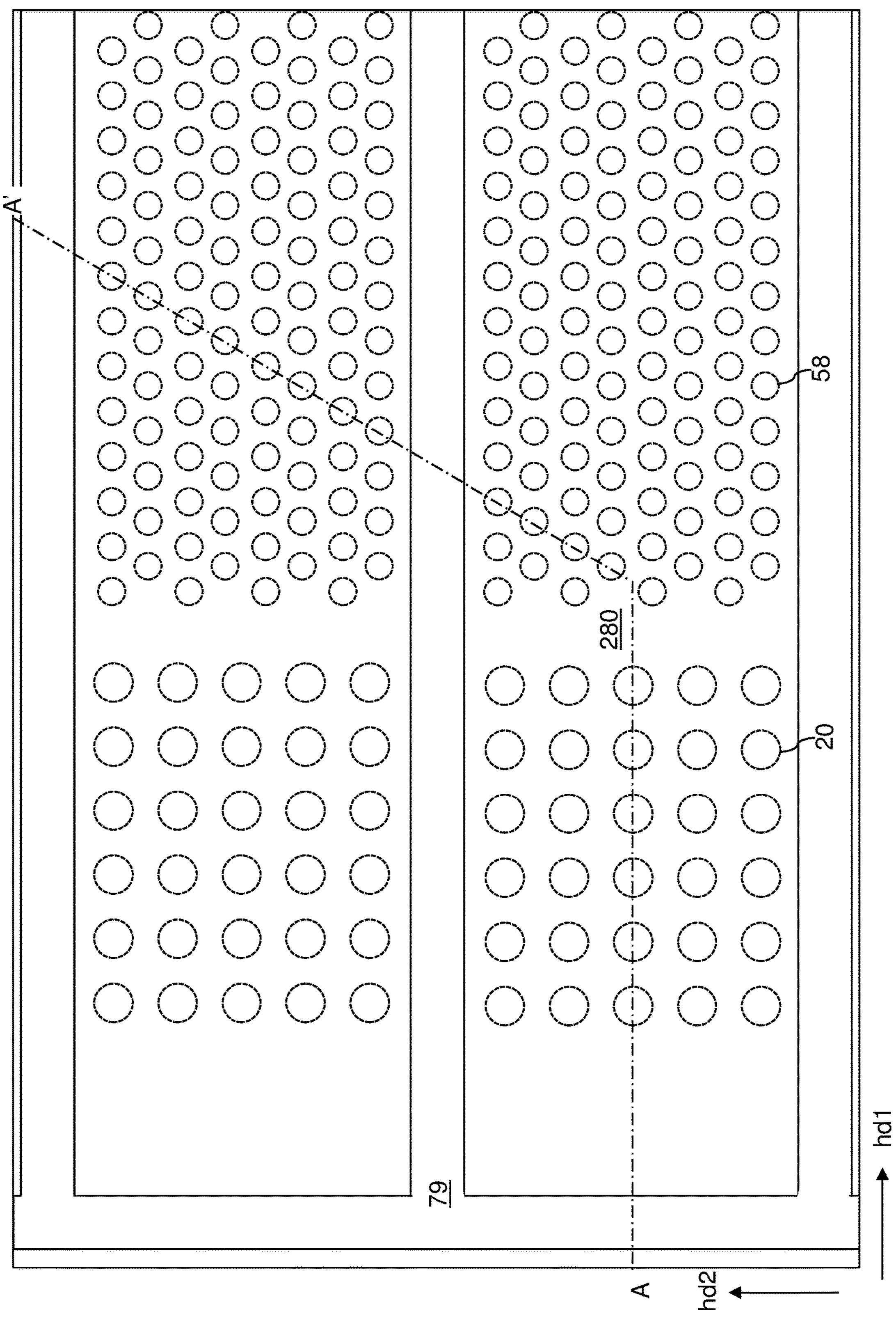
FIG. 8B is a top-down view of the first exemplary structure of FIG. 8A. The vertical plane A-A' is the cut plane of the vertical cross-sectional view of FIG. 8A.

Referring to FIGS. 8A and 8B, a contact-level dielectric layer 280 can be formed over the second-tier alternating stack (232, 242). The contact-level dielectric layer 280 includes a dielectric material such as silicon oxide, and can be formed by a conformal or non-conformal deposition process. For example, the contact-level dielectric layer 280 can include undoped silicate glass and can have a thickness in a range from 100 nm to 600 nm, although lesser and greater thicknesses can also be employed.

A photoresist layer (not shown) can be applied over the contact-level dielectric layer 280 and can be lithographically patterned to form a continuous opening including a set of interconnected opening segments. The openings in the photoresist layer can laterally extend along the first horizontal direction hd1 between each neighboring cluster of memory opening fill structures 58. A backside trench 79 can be formed by performing an anisotropic etch process that transfers the pattern in the photoresist layer through the contact-level dielectric layer 280, the second alternating stack (232, 242), and the first alternating stack (132, 142), and optionally into an upper portion of the substrate 9. Portions of the contact-level dielectric layer 280, the second alternating stack (232, 242), and the first alternating stack (132, 142) that underlie the openings in the photoresist layer can be removed to form a backside trench 79.

Generally, at least one vertically alternating sequence of continuous insulating layers (132, 232) and continuous spacer material layers (such as the continuous sacrificial material layers (142, 242)) can be divided into alternating stacks {(132, 142), (232, 242)} of insulating layers (132, 232) and spacer material layers (such as sacrificial material layers (142, 242)) by forming a backside trench 79. In other words, at least one alternating stack {(132, 142), (232, 242)} of continuous insulating layers (132, 232) and continuous sacrificial material layers (142, 242) can be divided into multiple alternating stacks {(132, 142), (232, 242)} that are laterally spaced from each other by the backside trench 79. The contact-level dielectric layer 280 is divided into a plurality of contact-level dielectric layers 280 by the backside trench 280. A subset of the contact-level dielectric layers 280 overlies a respective alternating stack of insulating layers (132, 232) and spacer material layers (such as sacrificial material layers (142, 242), and overlies a respective array of memory opening fill structures 58.

In one embodiment, the backside trench 79 may comprise at least two first elongated portions that laterally extend along a first horizontal direction hd1, and at least one second elongated portion that laterally extends along a second horizontal direction hd2 that is different from the first horizontal direction hd1 and connecting a respective neighboring pair of first elongated portions of the backside trench 79. In one embodiment, each of the at least two first elongated portions of the backside trench 79 may laterally extend along the first horizontal direction hd1 with a respective uniform width along the second horizontal direction hd2. In one embodiment, the at least two first elongated portions of the backside trench 79 may comprise three or more first elongated portions that are repeated with a periodicity along the second horizontal direction hd2. In one embodiment, lengthwise sidewalls of each of the insulating layers (132, 232) and each of the sacrificial material layers (142, 242) can be exposed to the at least two first elongated portions of the backside trench 79 upon formation of the backside trench 79. In one embodiment, the backside trench 79 may be formed as a single continuous volume in which the at least two first elongated portions and the at least one second elongated portion are interconnected among one another. In one embodiment, the first elongated portions of the backside trench 79 can be formed between clusters of memory opening fill structures 58. The clusters of the memory opening fill structures 58 can be laterally spaced apart along the second horizontal direction hd2 by the first elongated portions of the backside trench 79.

Figure 9:
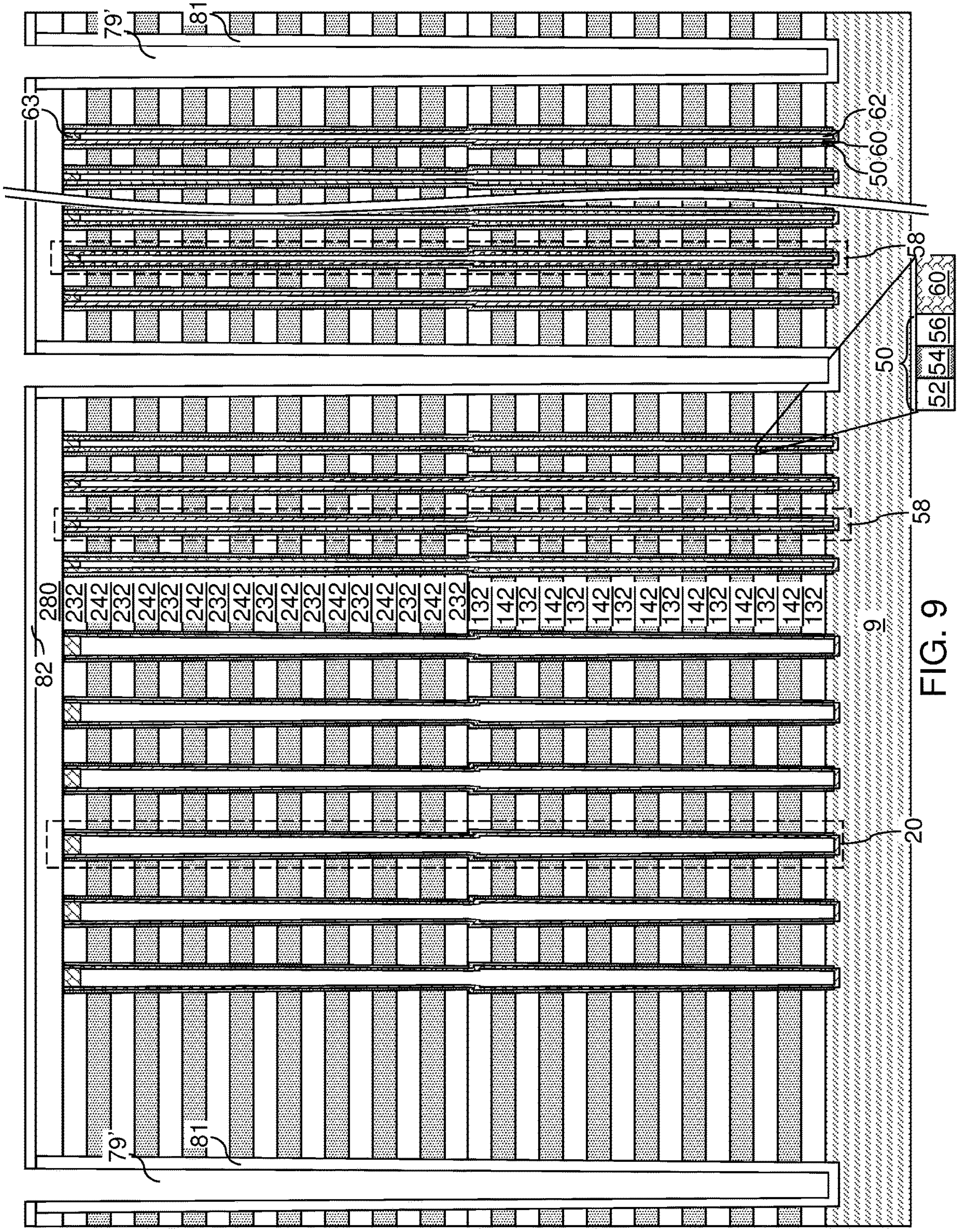
FIG. 9 is a vertical cross-sectional view of the first exemplary structure after formation of a continuous dielectric liner layer according to the first embodiment of the present disclosure.

Referring to FIG. 9, a continuous dielectric liner layer (81, 82) can be formed by a conformal deposition process in the backside trench 79 and over the contact-level dielectric layer 280. The continuous dielectric liner layer (81, 82) comprises a backside trench dielectric liner 81 that is formed on sidewalls and a bottom surface of the backside trench 79 and a planar dielectric liner 82 that is formed over the contact-level dielectric layer 280. A backside cavity 79' can be present in a volume of the backside trench 79 that is not filled with the continuous dielectric liner layer (81, 82). The continuous dielectric liner layer (81, 82) comprises a dielectric material such as silicon oxide. The thickness of the continuous dielectric liner layer (81, 82) may be in a range from 3 nm to 60 nm, such as from 60 nm to 30 nm, although lesser and greater thicknesses may also be employed.

Figure 10:
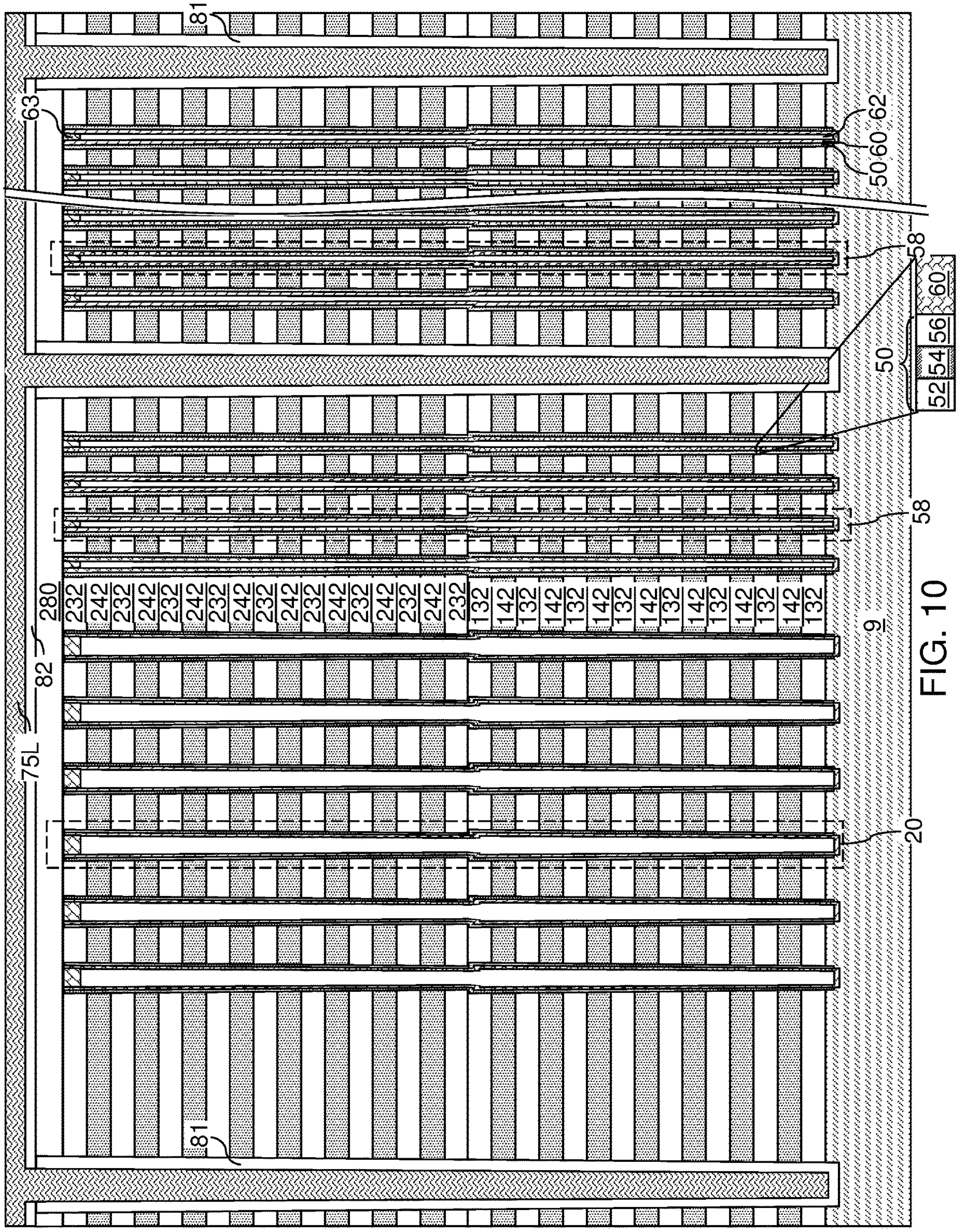
FIG. 10 is a vertical cross-sectional view of the first exemplary structure after formation of a sacrificial fill material layer according to the first embodiment of the present disclosure.

Referring to FIG. 10, a sacrificial trench fill material can be deposited in the backside cavity 79' and over the continuous dielectric liner layer (81, 82) to form a sacrificial trench fill material layer 75L. The sacrificial trench fill material layer 75L fills the volume of the backside cavity 79'. The sacrificial trench fill material layer 75L comprises a sacrificial trench fill material such as a semiconductor material. For example, the sacrificial trench fill material layer 75L may comprise amorphous silicon, polysilicon, and/or a silicon-germanium alloy. Alternative sacrificial trench fill materials such as organosilicate glass, a carbon-based fill material, or a polymer material may also be employed.

Figure 11A:
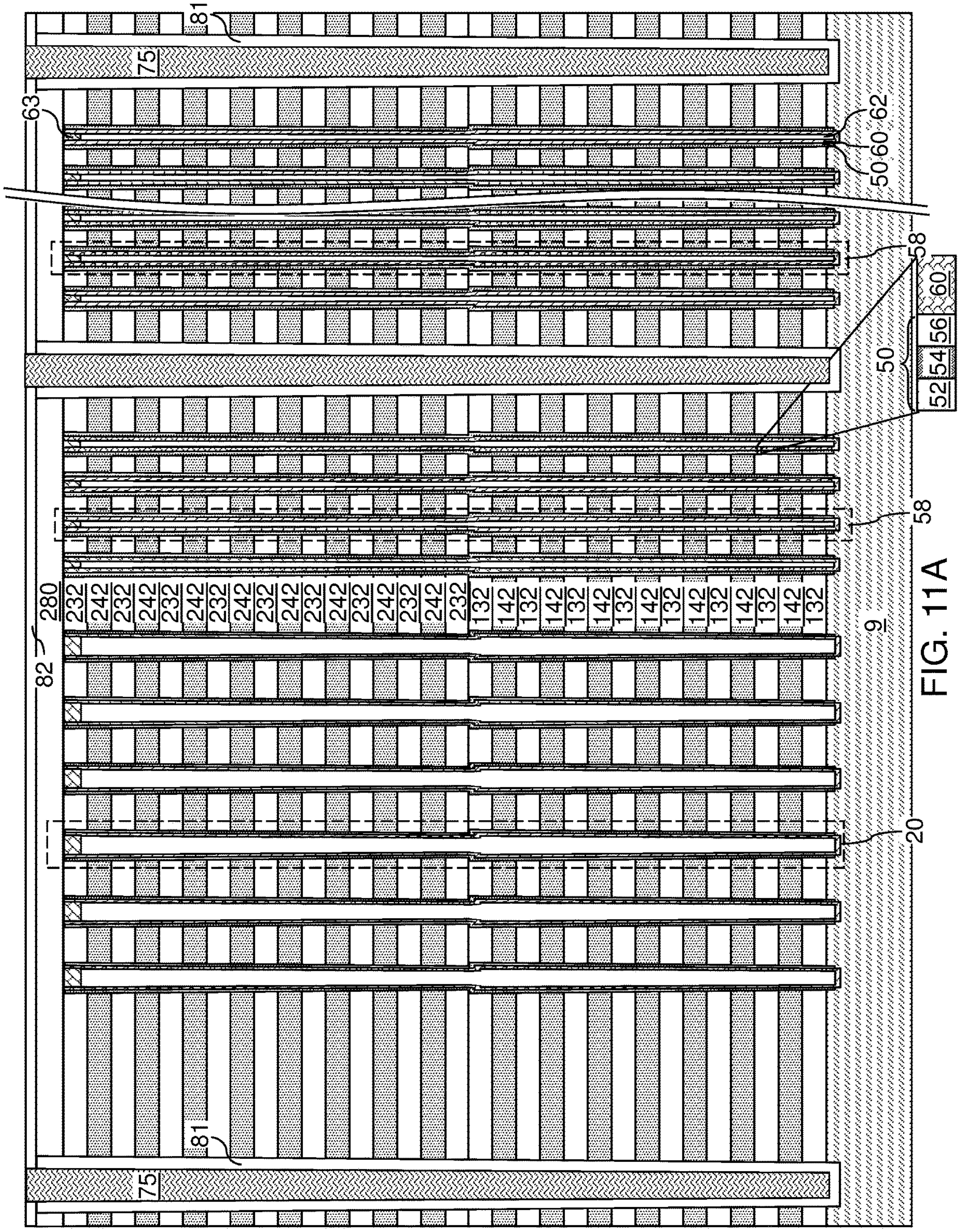
FIG. 11A is a vertical cross-sectional view of the first exemplary structure after formation of a sacrificial backside trench fill structure according to the first embodiment of the present disclosure.
Figure 11B:
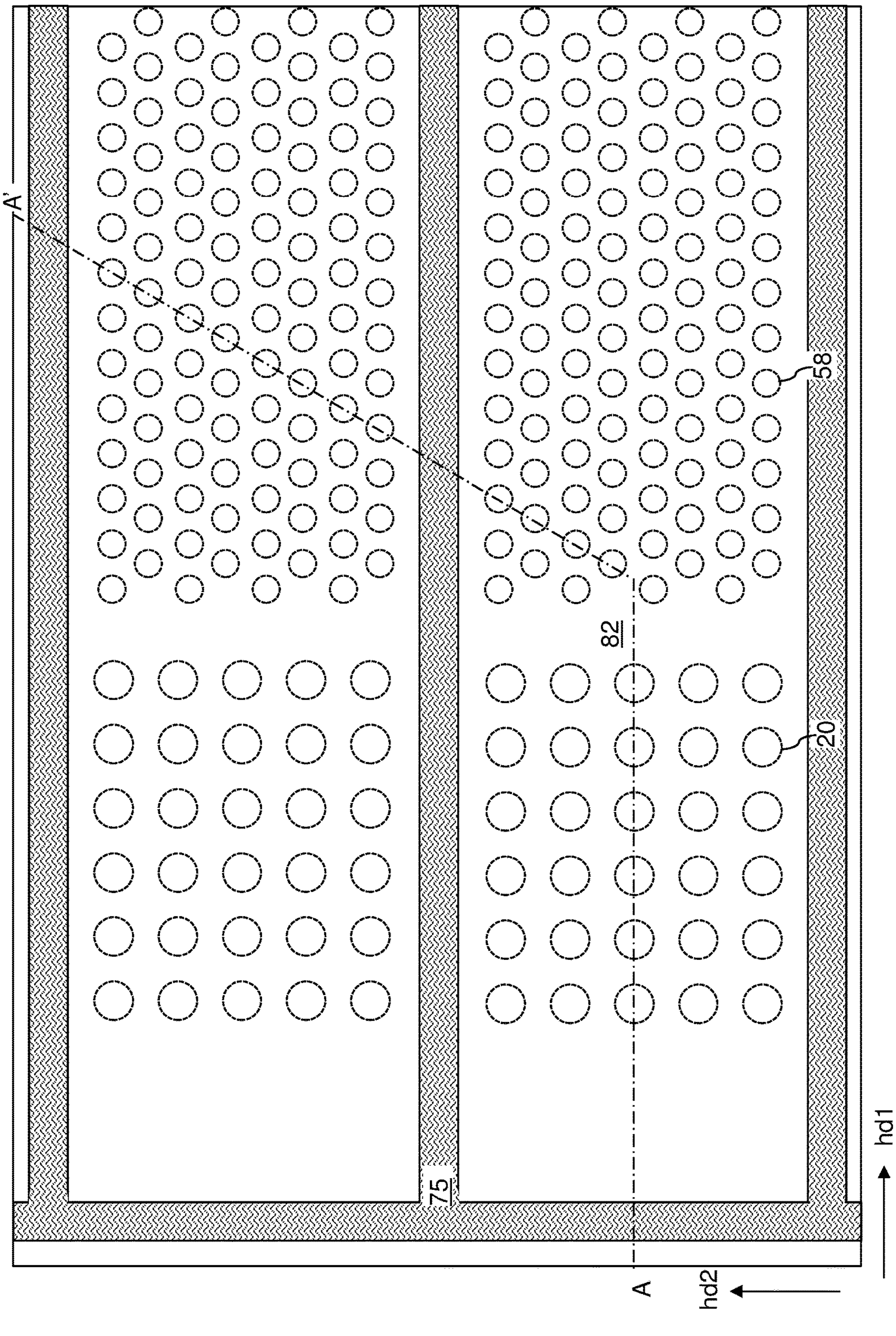
FIG. 11B is a top-down view of the first exemplary structure of FIG. 11A. The vertical plane A-A' is the cut plane of the vertical cross-sectional view of FIG. 11A.

Referring to FIGS. 11A and 11B, a planarization process, such as a recess etch process or a chemical mechanical polishing process, may be performed to remove horizontally-extending portions of the sacrificial trench fill material layer 75L from above the horizontal plane including the planar dielectric liner 82. The remaining portion of the sacrificial trench fill material layer 75L constitutes a sacrificial backside trench fill structure 75, which may have at least two first elongated portions that laterally extend along the first horizontal direction hd1 and at least one second elongated portion that laterally extends along the second horizontal direction hd2.

Figure 12:
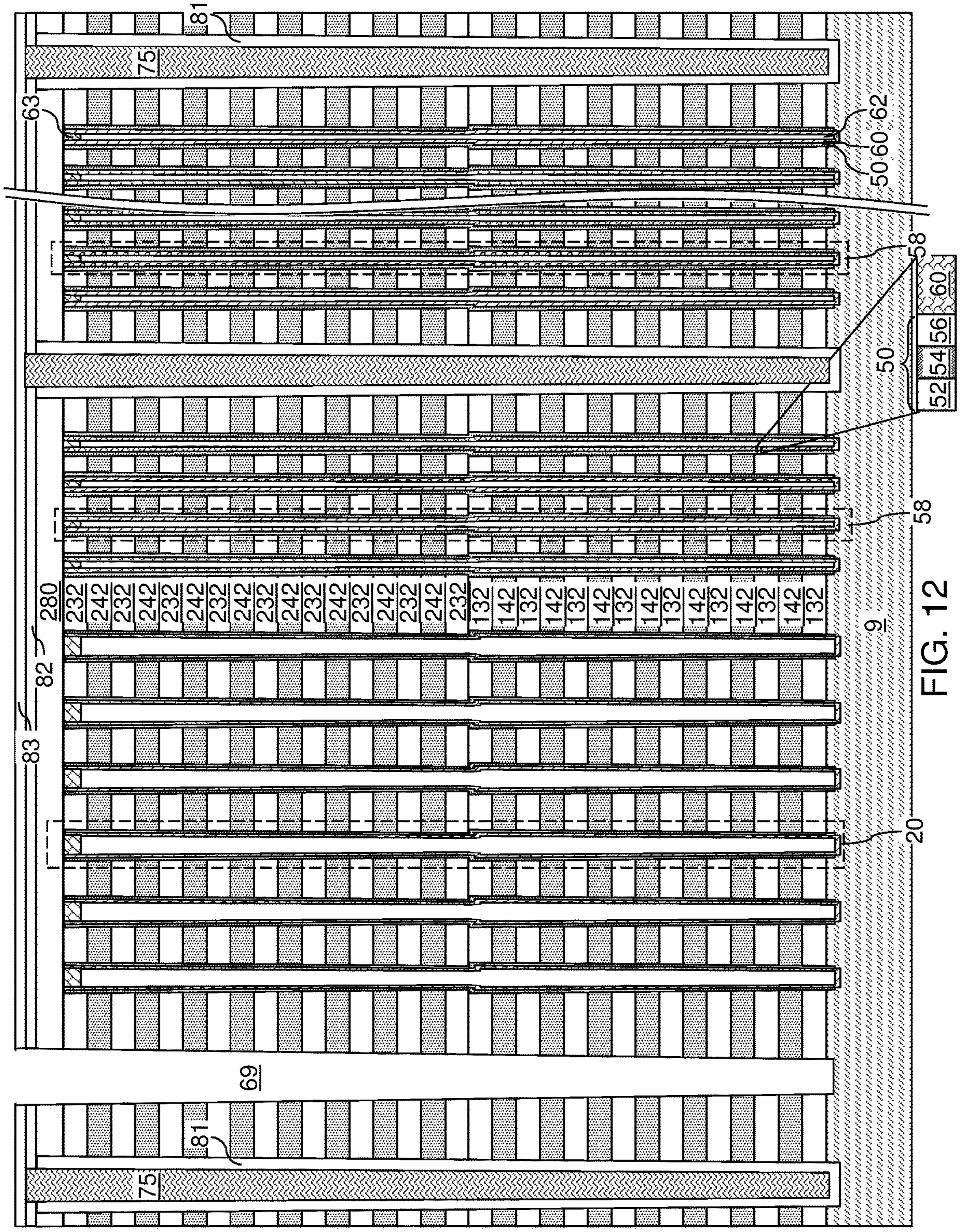
FIG. 12 is a vertical cross-sectional view of the first exemplary structure after formation of a sacrificial capping layer and access trenches according to the first embodiment of the present disclosure.

Referring to FIG. 12, a sacrificial capping material layer 83 can be formed above the planar dielectric liner 82. The sacrificial capping material layer 83 may comprise a dielectric material such as silicon oxide. The thickness of the sacrificial capping material layer 83 may be in a range from 5 nm to 100 nm, such as from 10 nm to 50 nm, although lesser and greater thicknesses may also be employed. A photoresist layer (not shown) can be applied over the sacrificial capping material layer 83, and can be lithographically patterned to form discrete openings over each of the alternating stacks {(132, 142), (232, 242)}. In one embodiment, the openings in the photoresist layer may be formed in areas that are proximal to, and laterally spaced from, the at least one second elongated portion of the backside trench 79.

An anisotropic etch process can be performed to etch through unmasked portions of the alternating stacks {(132, 142), (232, 242)}. Access trenches 69 are formed underneath the openings in the photoresist layer. The access trenches 69 can vertically extend through each layer within a respective alternating stack {(132, 142), (232, 242)}, and a surface segment of the substrate 9 can be physically exposed underneath each access trench 69. In one embodiment, all sidewalls of each access trench 69 may be laterally spaced from the backside trench 79 by a respective portion of the alternating stack {(132, 142), (232, 242)}. In one embodiment, the access trenches 69 may be laterally elongated along the second horizontal direction hd2 with a respective uniform width along the first horizontal direction hd1. Each access trench 69 may be formed within a respective area that is free of any memory opening fill structures 58 and is free of any support pillar structures 20. In one embodiment, one, a plurality or each of the access trenches 69 may have a respective rectangular horizontal cross-sectional area. The photoresist layer can be subsequently removed, for example, by ashing.

Figure 13A:
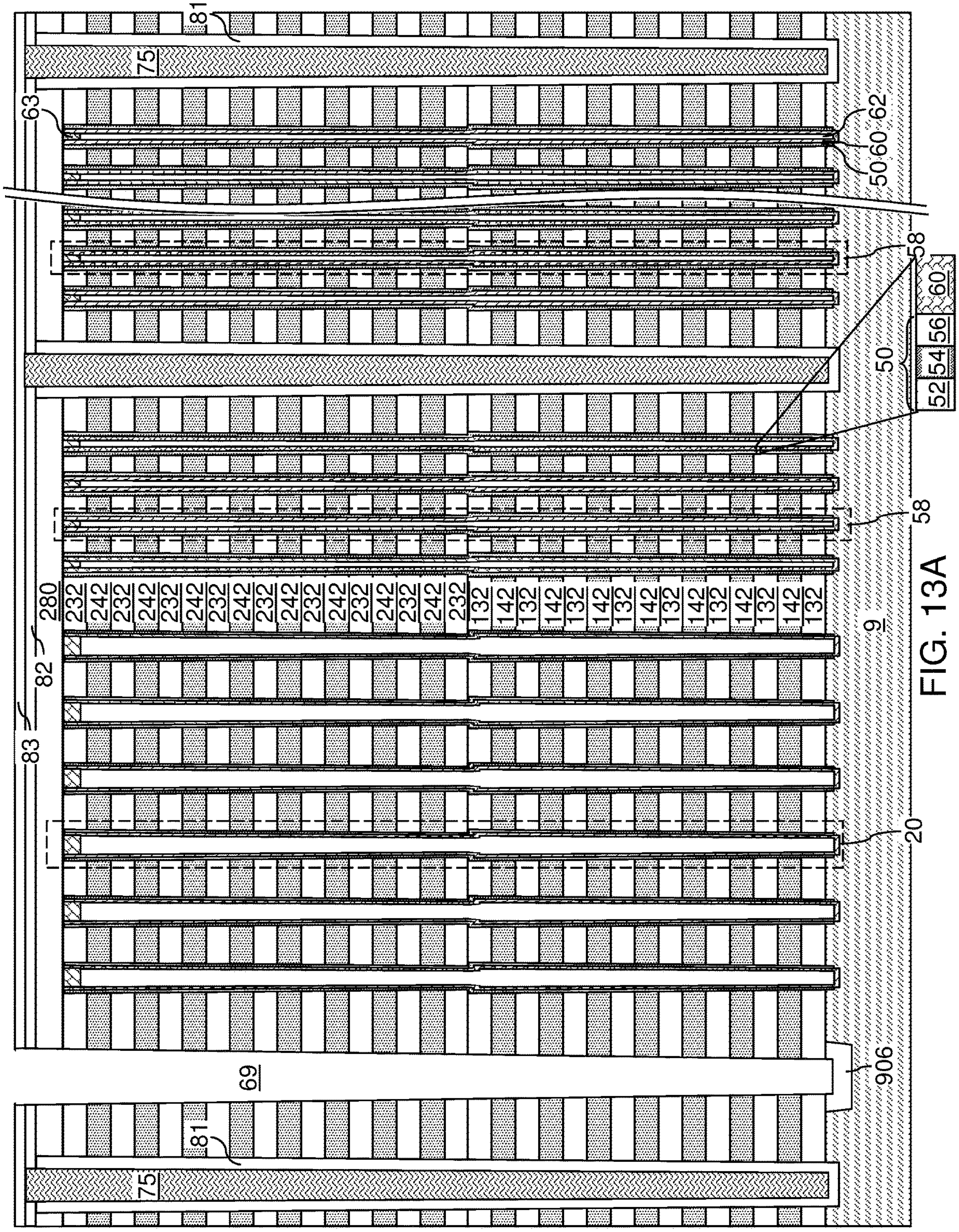
FIG. 13A is a vertical cross-sectional view of the first exemplary structure after formation of silicon oxide plates according to the first embodiment of the present disclosure.
Figure 13B:
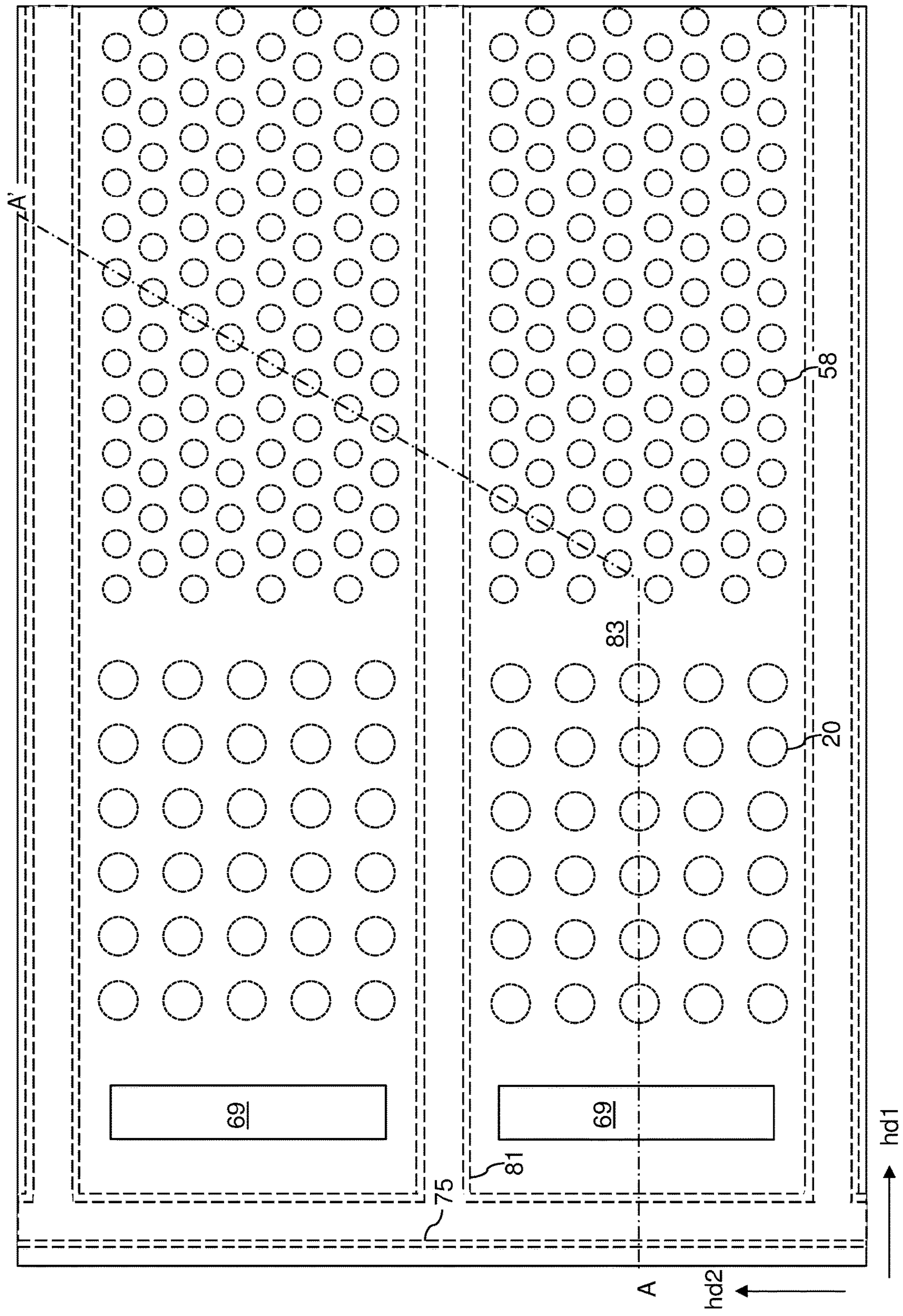
FIG. 13B is a top-down view of the first exemplary structure of FIG. 13A. The vertical plane A-A' is the cut plane of the vertical cross-sectional view of FIG. 13A.

Referring to FIGS. 13A and 13B, an oxidation process can be performed to convert surface portions of the substrate 9 underlying the access trenches 69 into semiconductor oxide plates 906, such as silicon oxide plates. A thermal oxidation process or a plasma oxidation process may be employed.

Figure 14:
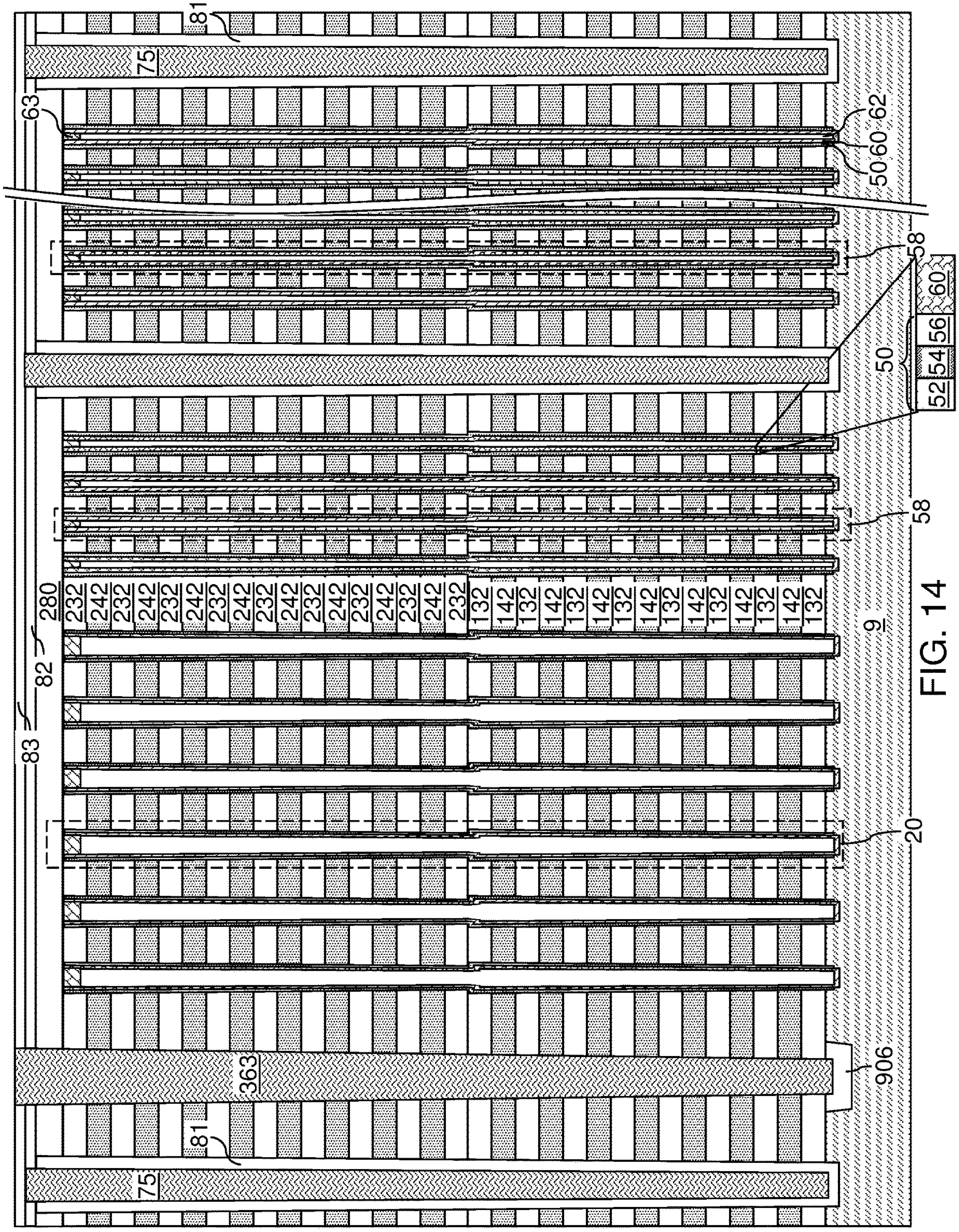
FIG. 14 is a vertical cross-sectional view of the first exemplary structure after formation of access trench fill structures according to the first embodiment of the present disclosure.

Referring to FIG. 14, an access trench fill material can be deposited in the access trenches 69 and over the sacrificial capping material layer 83. The access trench fill material is a sacrificial fill material. Portions of the access trench fill material that overlie the horizontal plane including the top surface of the sacrificial capping material layer 83 can be removed by performing a planarization process such as a recess etch process and/or a chemical mechanical polishing process. Each remaining portion of the access trench fill material that fills a respective access trench 69 constitutes an access trench fill structure 363. In one embodiment, the access trench fill structure 363 comprises a semiconductor material, such as amorphous silicon or polysilicon.

Figure 15:
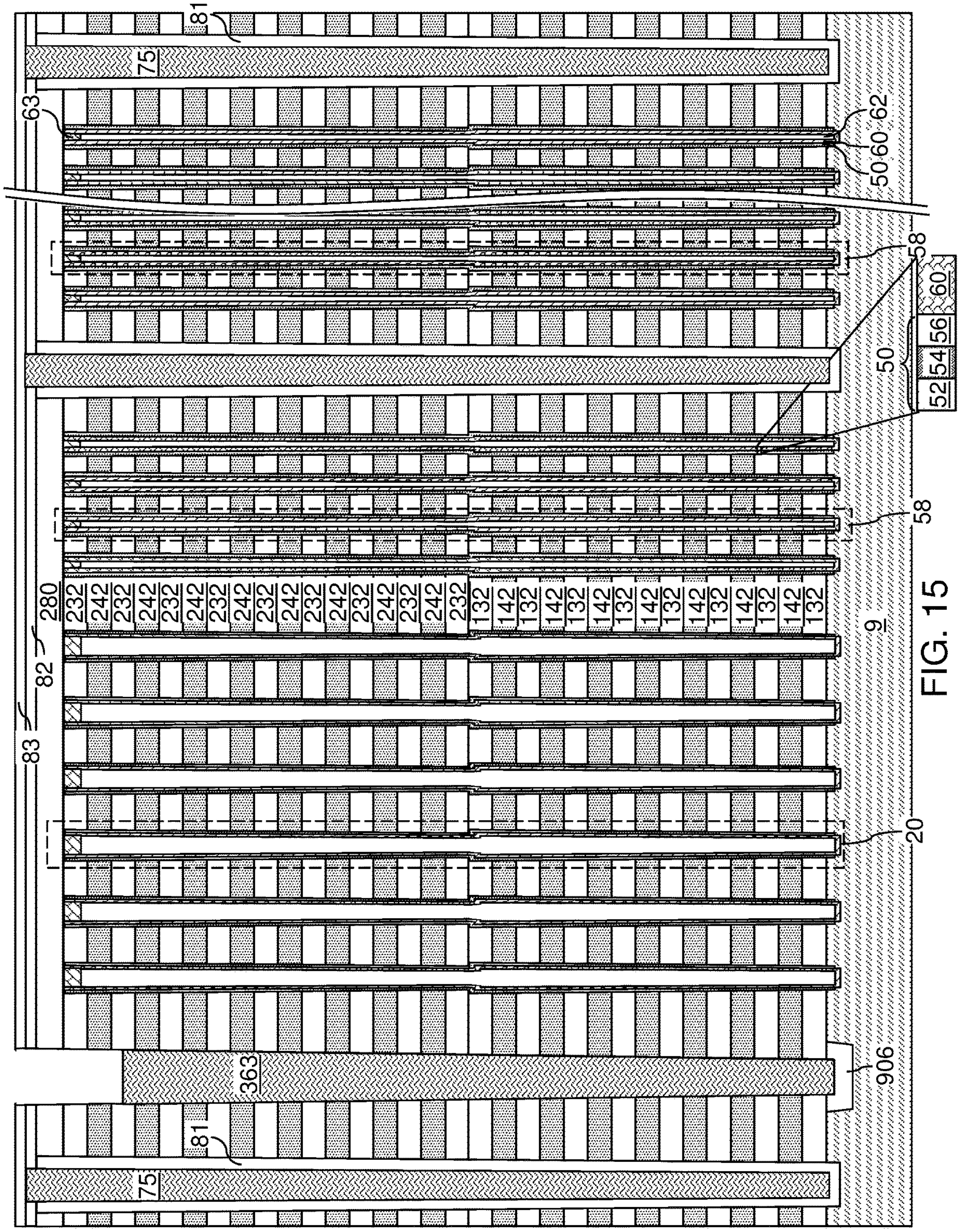
FIG. 15 is a vertical cross-sectional view of the first exemplary structure after performing a first vertical recess etch step according to the first embodiment of the present disclosure.

Referring to FIG. 15, a first vertical recess etch step may be performed to vertically recess the top surfaces of the access trench fill structures 363 to a height below the horizontal plane including the bottom surfaces of the topmost second sacrificial material layers 242 and above the horizontal plane including the top surfaces of the second-from-the-top second sacrificial material layers 242. As used herein, a "second-from-the-top" element refers to an element that underlies a topmost element without any intervening element between the topmost element and the second-from-the-top element. The first vertical recess etch step may comprise a dry etch step or a wet etch step that etches the material of the access trench fill structures 363 selective to the materials of the insulating layers (132, 232) and the sacrificial material layers (142, 242). For example, if the access trench fill structures 363 comprise amorphous silicon, then the first vertical recess etch step may comprise a wet etch process employing hot trimethyl-2 hydroxyethyl ammonium hydroxide ("hot TMY") or tetramethyl ammonium hydroxide (TMAH).

Figure 16:
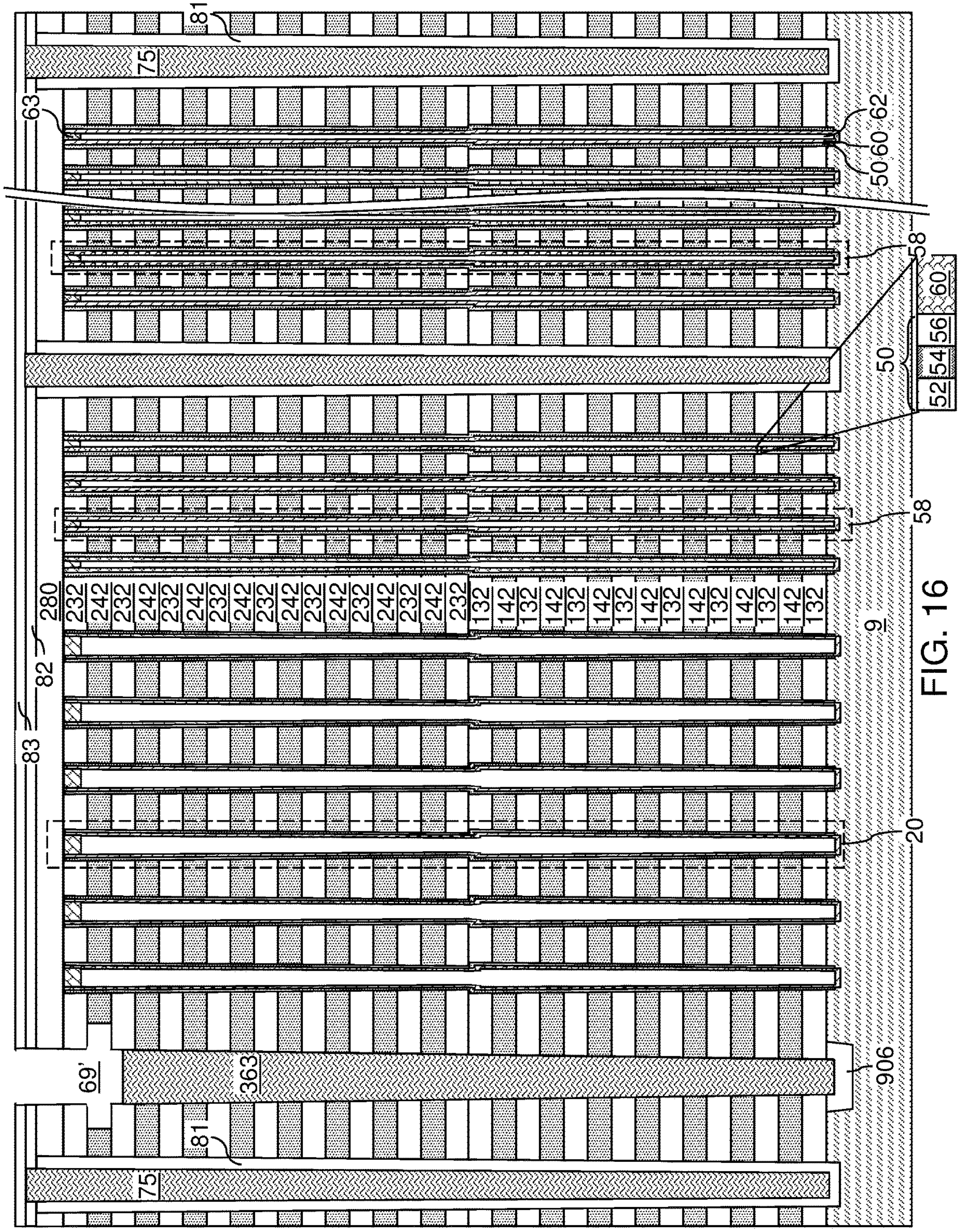
FIG. 16 is a vertical cross-sectional view of the first exemplary structure after performing a first isotropic etch step according to the first embodiment of the present disclosure.

Referring to FIG. 16, a first isotropic etch step can be performed to isotropically etch the material of the sacrificial material layers (142, 242) selective to the materials of the insulating layers (132, 232) and the access trench fill structures 363. The topmost second sacrificial material layers 242 may be laterally recessed by the second isotropic etch step. For example, the sacrificial material layers (142, 242) may comprise silicon nitride, and the first isotropic etch step may comprise a wet etch process employing hot phosphoric acid or a mixture of dilute hydrofluoric acid and ethylene glycol. The lateral recess distance of the first isotropic etch step may be in a range from 50 nm to 500 nm, such as from 100 nm to 300 nm, although lesser and greater lateral recess distances may also be employed. A finned access cavity 69' can be formed in each volume overlying a top surface of an access trench fill structures 363. Each finned access cavity 69' comprises a vertically-extending cavity portion that includes a volume formed by removal of an access trench fill structure 363, and a fin cavity portion formed by removal of a portion of a topmost second sacrificial material layer 242.

Figure 17:
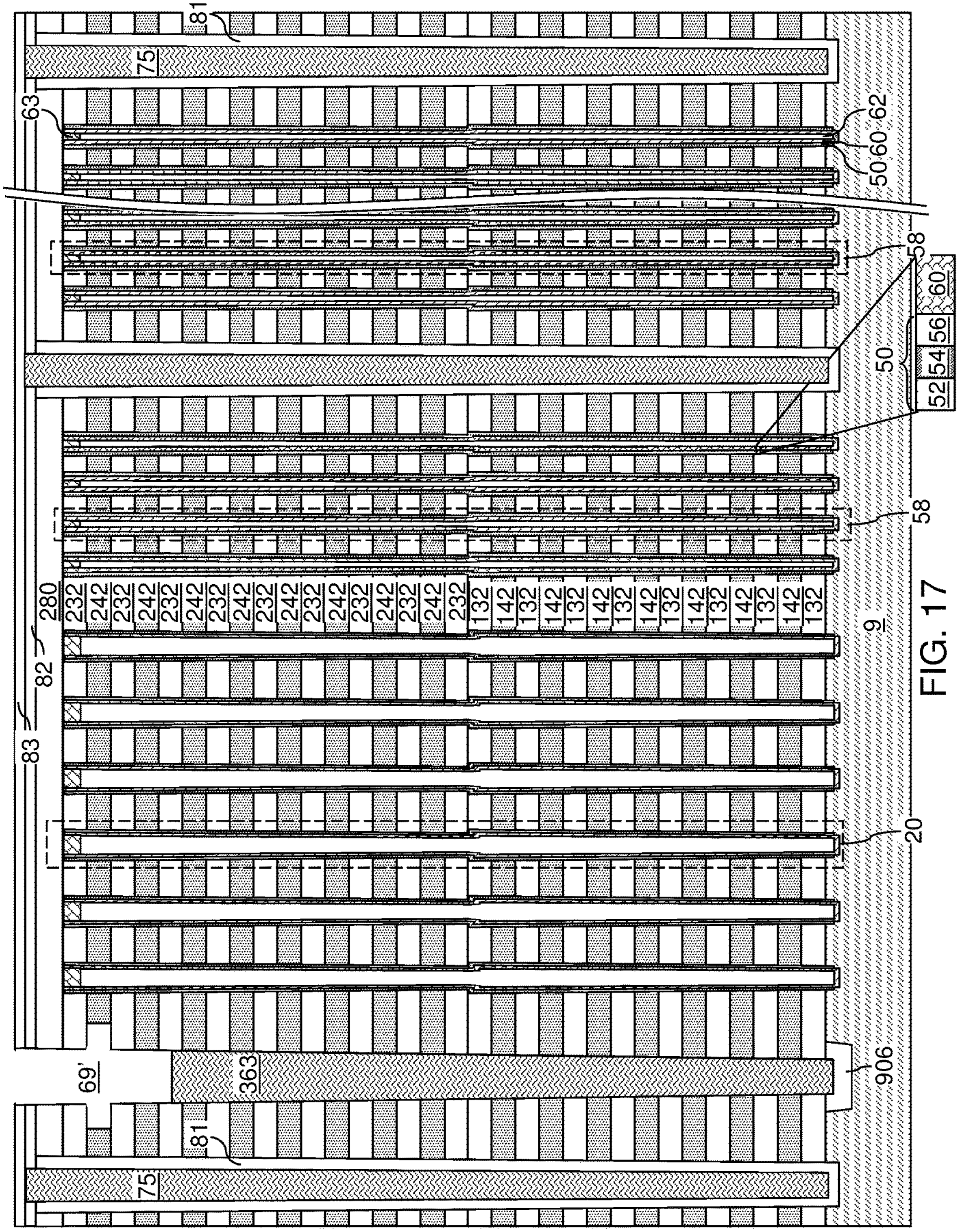
FIG. 17 is a vertical cross-sectional view of the first exemplary structure after performing a second vertical recess etch step according to the first embodiment of the present disclosure.

Referring to FIG. 17, a second vertical recess etch step may be performed to vertically recess the top surfaces of the access trench fill structures 363 to a height below the horizontal plane including the bottom surfaces of the second-from-the-top second sacrificial material layers 242 and above the horizontal plane including the top surfaces of the third-from-the-top second sacrificial material layers 242. As used herein, a "third-from-the-top" element refers to an element that underlies a second-from-the-top element without any intervening element between the second-from-the-top element and the third-from-the-top element. The second vertical recess etch step may comprises a dry etch step or a wet etch step that etches the material of the access trench fill structures 363 selective to the materials of the insulating layers (132, 232) and the sacrificial material layers (142, 242). For example, if the access trench fill structures 363 comprise amorphous silicon, then the second vertical recess etch step may comprise a wet etch process employing hot trimethyl-2 hydroxyethyl ammonium hydroxide ("hot TMY") or tetramethyl ammonium hydroxide (TMAH).

Figure 18:
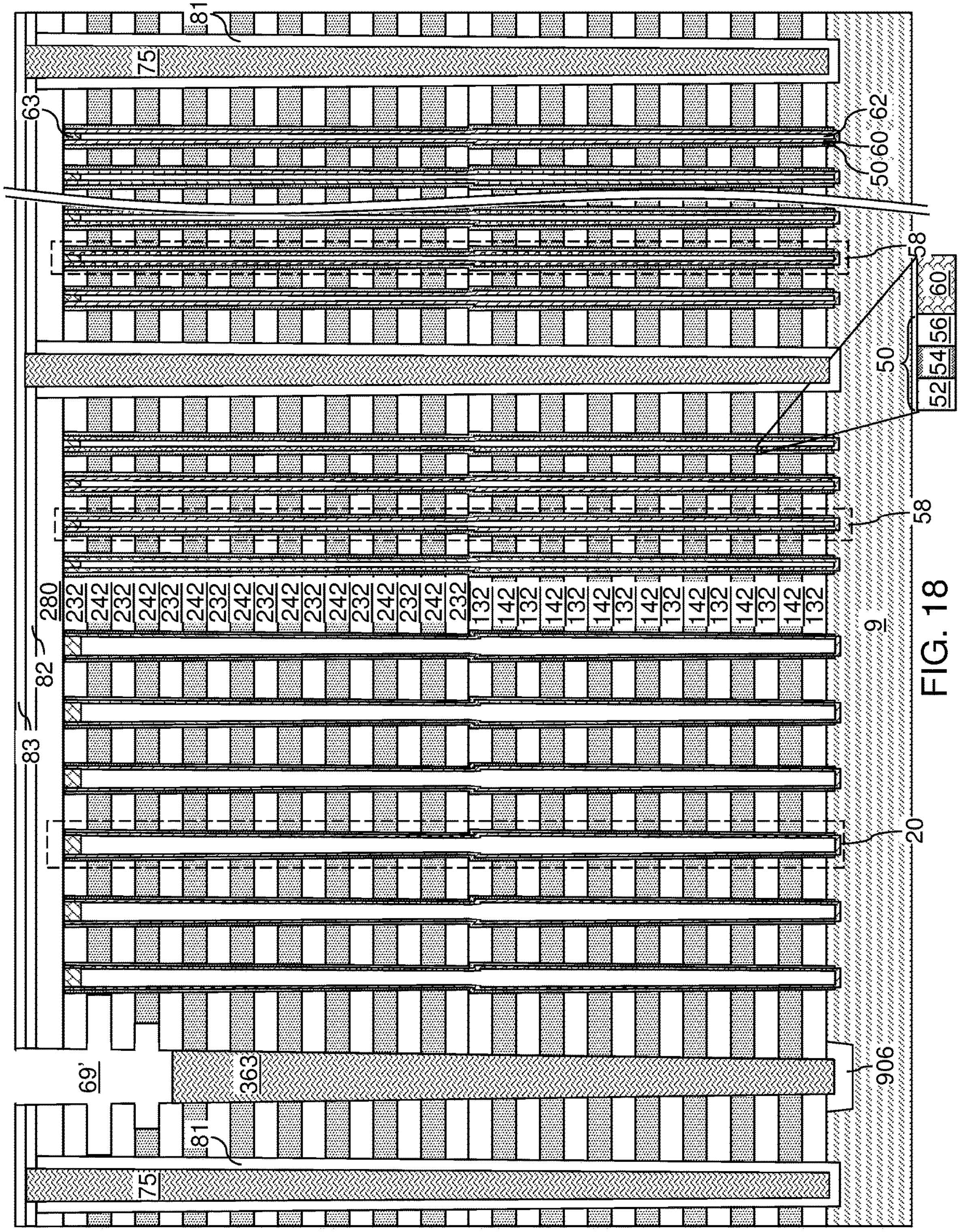
FIG. 18 is a vertical cross-sectional view of the first exemplary structure after performing a second isotropic etch step according to the first embodiment of the present disclosure.

Referring to FIG. 18, a second isotropic etch step can be performed to isotropically etch the material of the sacrificial material layers (142, 242) selective to the materials of the insulating layers (132, 232) and the access trench fill structures 363. For example, the sacrificial material layers (142, 242) may comprise silicon nitride, and the second isotropic etch step may comprise a wet etch process employing hot phosphoric acid or a mixture of dilute hydrofluoric acid and ethylene glycol. The topmost second sacrificial material layers 242 and the second-from-the-top second sacrificial material layers 242 may be laterally recessed by the second isotropic etch step. The lateral recess distance of the second isotropic etch step may be in a range from 50 nm to 500 nm, such as from 100 nm to 300 nm, although lesser and greater lateral recess distances may also be employed. Each finned access cavity 69' can be laterally expanded. Each finned access cavity 69' comprises a vertically-extending cavity portion that includes a volume formed by removal of an access trench fill structure 363, and two fin cavity portion formed by removal of a portion of a topmost second sacrificial material layer 242. The fin cavity portion at the level of the topmost second sacrificial material layers 242 is wider than at the level of the second-from-the-top second sacrificial material layers 242.

Figure 19:
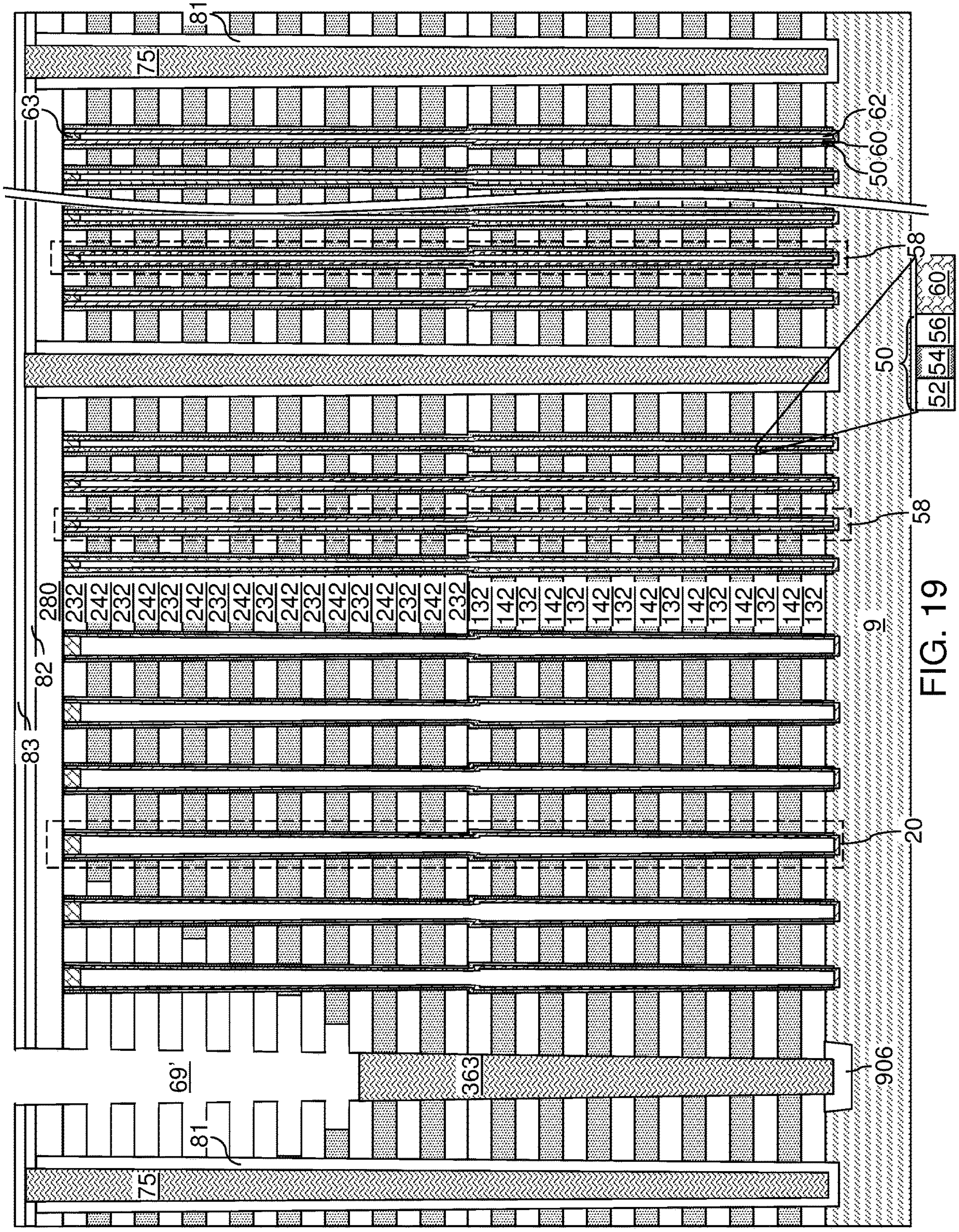
FIG. 19 is a vertical cross-sectional view of the first exemplary structure after performing an i-th isotropic etch step according to the first embodiment of the present disclosure.

Referring to FIG. 19, the set of processing steps described with reference to FIGS. 17 and 18 can be repeated multiple times iteratively to vertically recess top surfaces of the access trench fill structures 363 and to laterally recess physically exposed sidewalls of the sacrificial material layers (142, 242). Generally, multiple instances of a unit processing sequence can be iteratively performed. Each instance of the unit processing sequence comprises a vertical recess etch step (such as the second vertical recess etch step) that vertically recesses the access trench fill structures 363 and an isotropic etch step (such as the second isotropic etch process) that isotropically recesses physically exposed portions of the sacrificial material layers (142, 242) around each finned access cavity 69' that overlies an access trench fill structure 363. The finned access cavities 69' are expanded vertically and laterally by performing multiple instances of the unit processing sequence. In one embodiment, surface segments of sidewalls of the continuous dielectric liner layer (81, 82) are physically exposed to one, a plurality, or each of the finned access cavities 69'.

Figure 20:
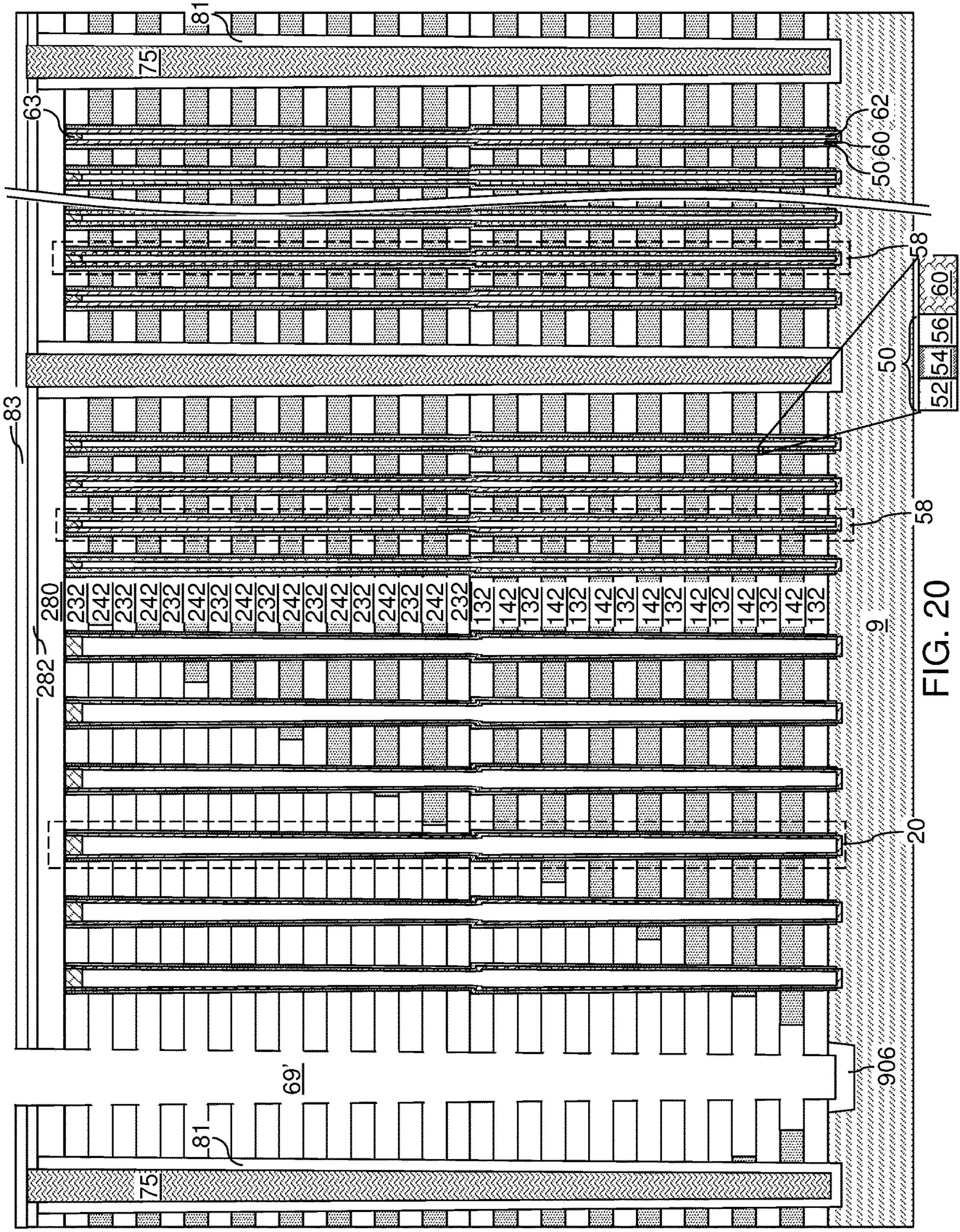
FIG. 20 is a vertical cross-sectional view of the first exemplary structure after performing a last isotropic etch step according to the first embodiment of the present disclosure.

Referring to FIG. 20, the unit processing sequence can be repeated until the access trench fill structures 363 are vertically recessed below the bottommost first sacrificial material layers 142 and the bottommost first sacrificial material layers 142 are laterally recessed. The entirety of the access trench fill structures 363 can be removed after the last vertical recessing of the access trench fill structures 363. In one embodiment, the total number of repetitions of the unit processing sequence may be the same as the total number of the sacrificial material layers (142, 242). The duration of each vertical recess etch step may be individually selected so that one more sacrificial material layer (142, 242) is physically exposed after each vertical recess etch step.

Figure 21A:
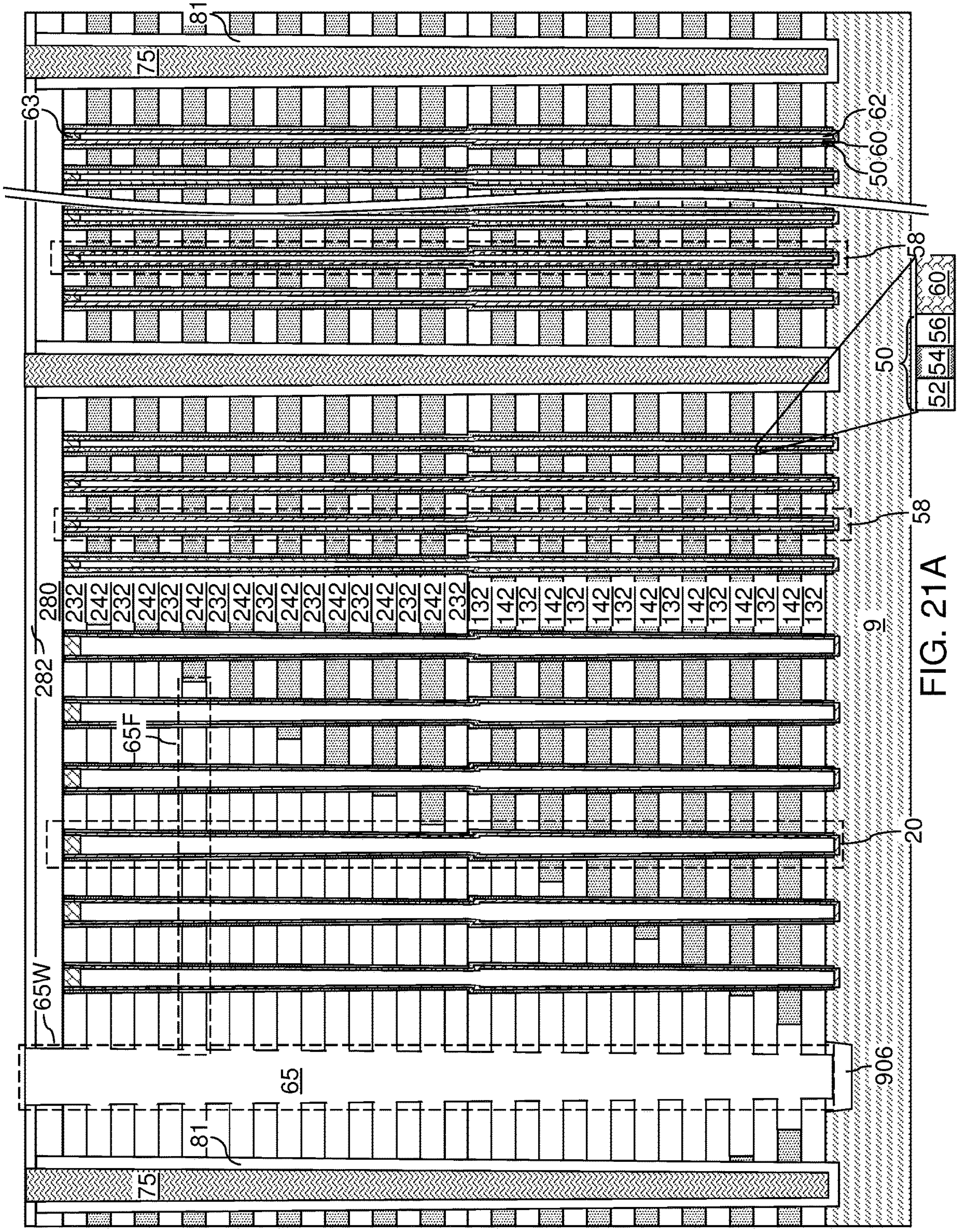
FIG. 21A is a vertical cross-sectional view of the first exemplary structure after formation of finned dielectric support structures in finned access cavities according to the first embodiment of the present disclosure.
Figure 21B:
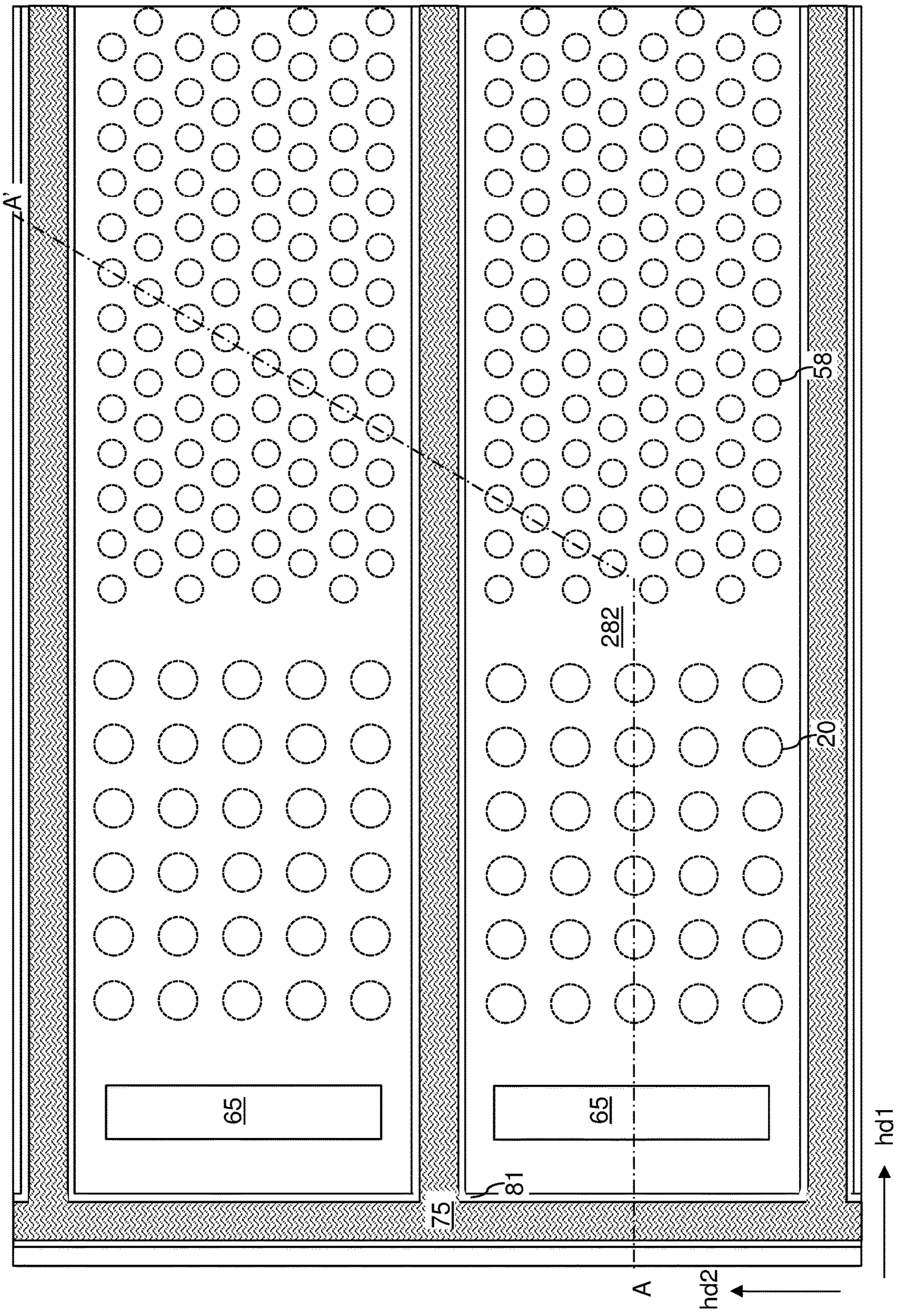
FIG. 21B is a top-down view of the first exemplary structure of FIG. 21A. The vertical plane A-A' is the cut plane of the vertical cross-sectional view of FIG. 21A.

Referring to FIGS. 21A and 21B, a dielectric fill material, such as silicon oxide, can be formed in the finned access cavities 69' and over the sacrificial capping material layer 83 by a conformal deposition process, such as a low pressure chemical vapor deposition process. A horizontally-extending portion of the dielectric fill material and the sacrificial capping material layer 83 can be removed from above the horizontal plane including the top surface of the planar dielectric liner 82 by a recess etch process. Each remaining portion of the dielectric fill material that fills a respective finned access cavity 69' constitutes a finned dielectric support structure 65. Top surfaces of the sacrificial backside trench fill structures 75 are physically exposed after removal of the sacrificial capping material layer 83.

In one embodiment, each finned dielectric support structure 65 comprises a dielectric wall portion 65W that continuously vertically extends from the substrate 9 at least to a horizontal plane including top surfaces of the memory opening fill structures 58, and dielectric fin structures 65F that are located at levels of the sacrificial material layers (142, 242) and laterally protrude outward from the dielectric wall portion 65W. In one embodiment, a plurality of the dielectric fin structures 65F within each finned dielectric support structure 65 comprises a respective first sidewall that is formed directly on a sidewall of a respective one of the sacrificial material layers (142, 242), and a respective second sidewall that is formed on a surface segment of the backside trench dielectric liner 81.

In one embodiment, the dielectric fin structures 65F have different lateral extents along a first horizontal direction hd1 that increase with a vertical distance from a top surface of the substrate 9. Each of the dielectric fin structures 65F comprises a respective horizontal top surface that contacts a horizontal bottom surface of a respective overlying insulating layer (132, 232) and a respective additional horizontal top surface that contacts a horizontal top surface of the respective underlying insulating layer (132, 232). In one embodiment, contact areas between each contacting pair of a respective dielectric fin structure 65F and a respective overlying insulating layer (132, 232) increase with a vertical distance from a top surface of the substrate 9.

One and/or a plurality of the dielectric fin structures 65F may contact and/or may laterally surround a respective subset of the support pillar structures 20. In one embodiment, a subset of the dielectric fin structures 65F including a topmost dielectric fin structure 65F comprises a respective set of at least one opening therethrough. Each opening in a dielectric fin structure 65F laterally surrounds a respective support pillar structure 20. In one embodiment, a total number of openings within each of the dielectric fin structures 65F increases with a vertical distance from a top surface of the substrate 9. In one embodiment, support pillar structures 20 vertically extend through a subset of the openings through the dielectric fin structures 65F.

In one embodiment, one, a plurality and/or each of the finned dielectric support structures 65 contacts lengthwise sidewalls of a pair of first elongated portions of the backside trench 79, and contact a widthwise sidewall of a second elongated portion of the backside trench 79. In one embodiment, the dielectric wall portion 65W comprises a pair of lengthwise sidewall segments that laterally extend along the second horizontal direction hd2 at each level of the insulating layers (132, 232) and contact a sidewall of a respective one of the insulating layers (132, 232).

Figure 22:
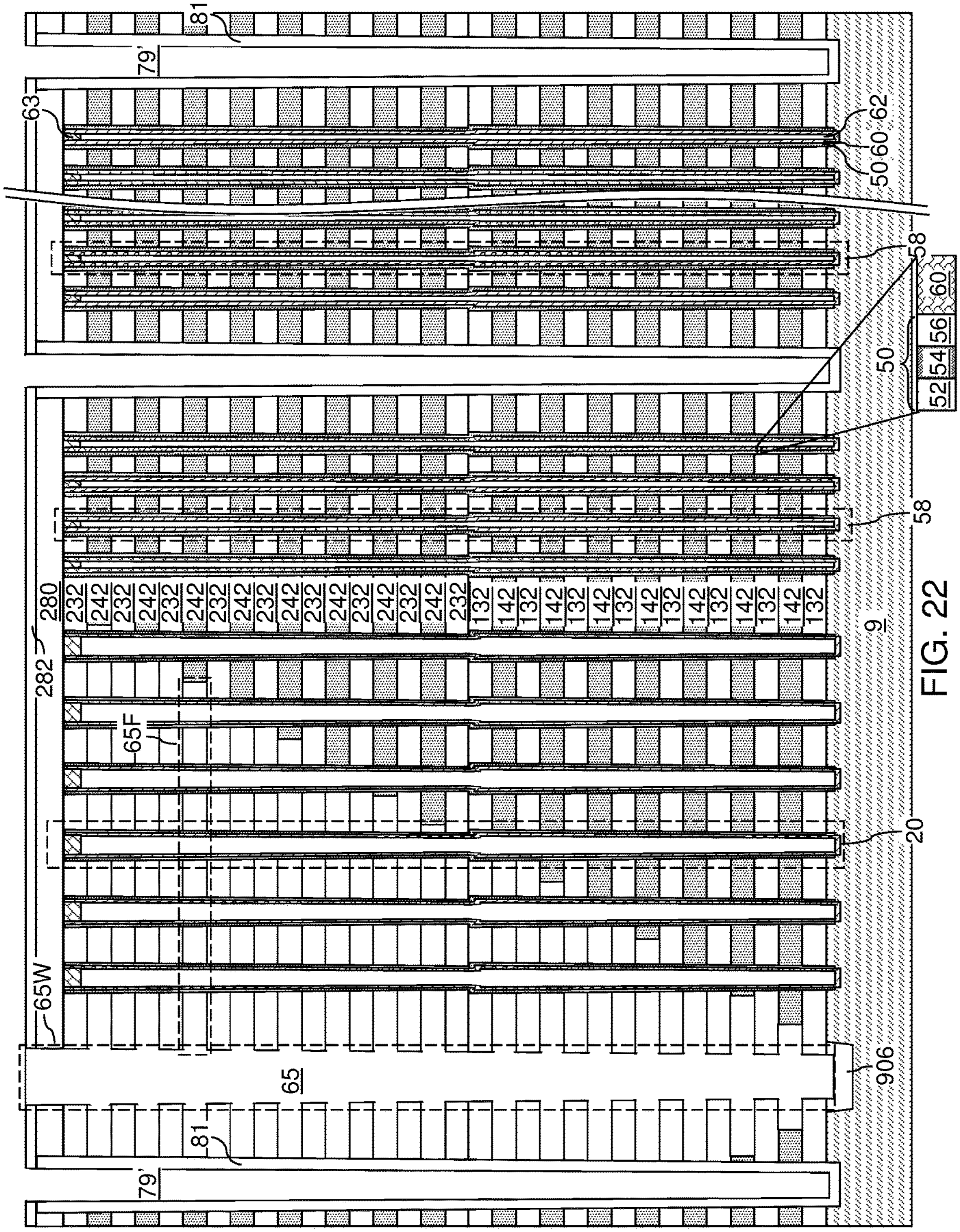
FIG. 22 is a vertical cross-sectional view of the first exemplary structure after removal of the sacrificial backside trench fill structure according to the first embodiment of the present disclosure.

Referring to FIG. 22, the sacrificial backside trench fill structure 75 can be removed selective to the continuous dielectric liner layer (81, 82) by performing a selective etch process. A backside cavity 79' can be formed in the volume from which the sacrificial backside trench fill structure 75 is removed.

Figure 23:
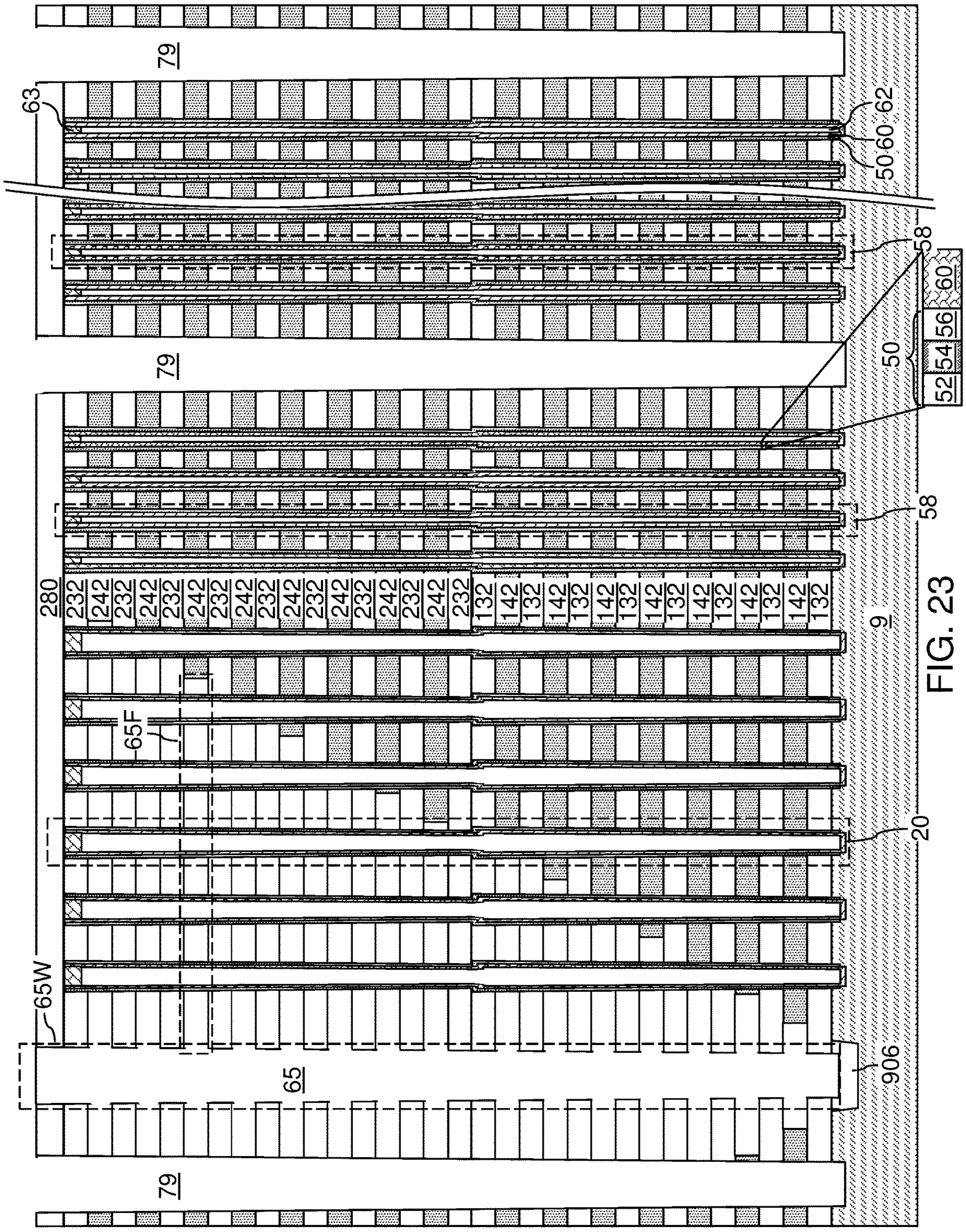
FIG. 23 is a vertical cross-sectional view of the first exemplary structure after removal of the continuous dielectric liner layer according to the first embodiment of the present disclosure.

Referring to FIG. 23, an isotropic etch process, such as a wet etch process employing dilute hydrofluoric acid, may be performed to remove the continuous dielectric liner layer (81, 82). The entire volume of the backside trench 79 may contain a continuously-extending void after removal of the continuous dielectric liner layer (81, 82).

Figure 24:
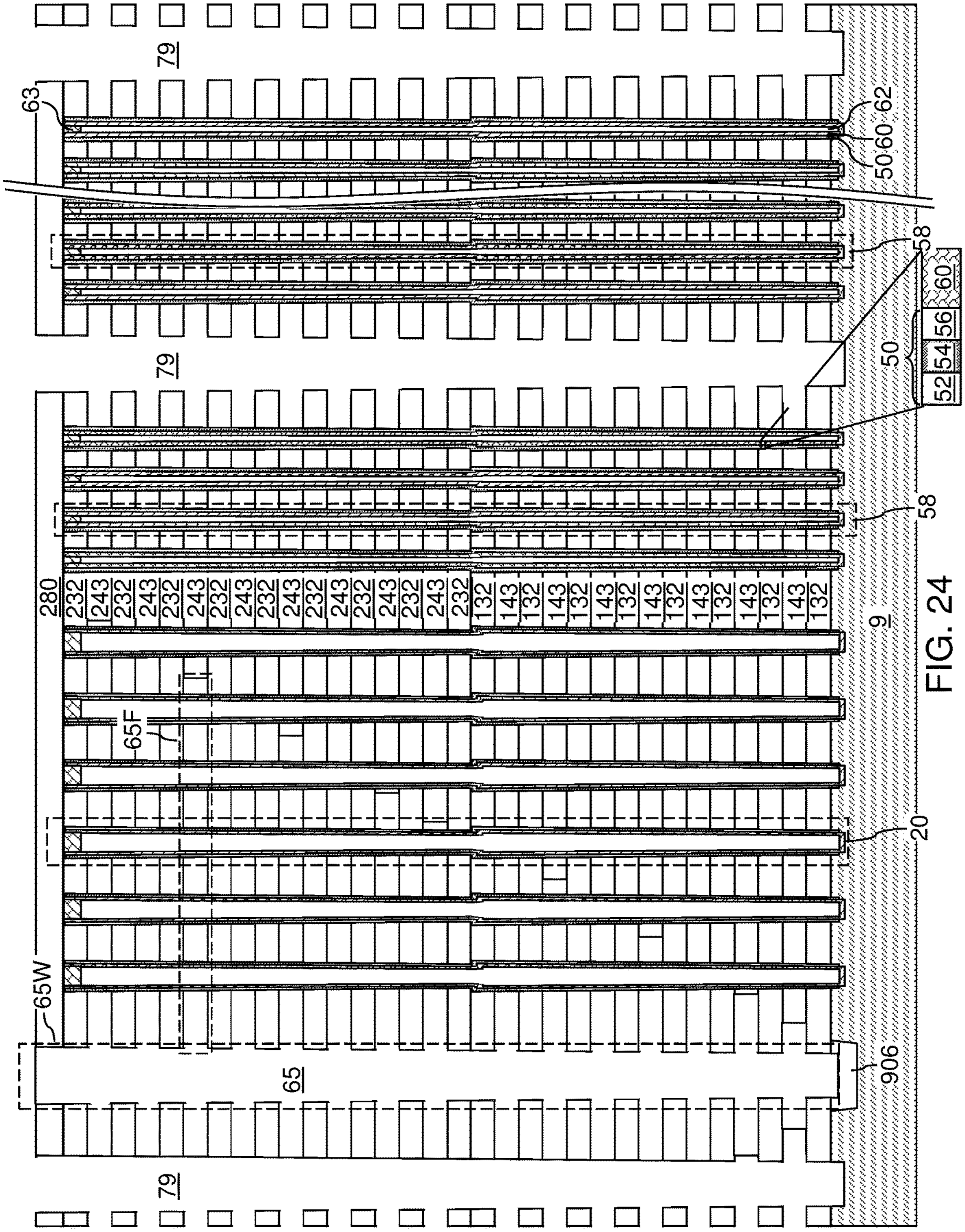
FIG. 24 is a vertical cross-sectional view of the first exemplary structure after formation of backside recesses according to the first embodiment of the present disclosure.

Referring to FIG. 24, an etchant that selectively etches the materials of the first and second sacrificial material layers (142, 242) with respect to the materials of the first and second insulating layers (132, 232), the finned dielectric support structures 65, and the material of the outermost layer of the memory films 50 can be introduced into the backside trench 79, for example, employing an isotropic etch process. First backside recesses 143 are formed in volumes from which the first sacrificial material layers 142 are removed. Second backside recesses 243 are formed in volumes from which the second sacrificial material layers 242 are removed.

The isotropic etch process can be a wet etch process employing a wet etch solution, or can be a gas phase (dry) etch process in which the etchant is introduced in a vapor phase into the backside trench 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the substrate 9. A backside recess (143, 243) can be vertically bounded by a top surface of an underlying insulating layer (132 or 232) and a bottom surface of an overlying insulating layer (132 or 232). In one embodiment, each of the first and second backside recesses (143, 243) can have a uniform height throughout.

Figure 25:
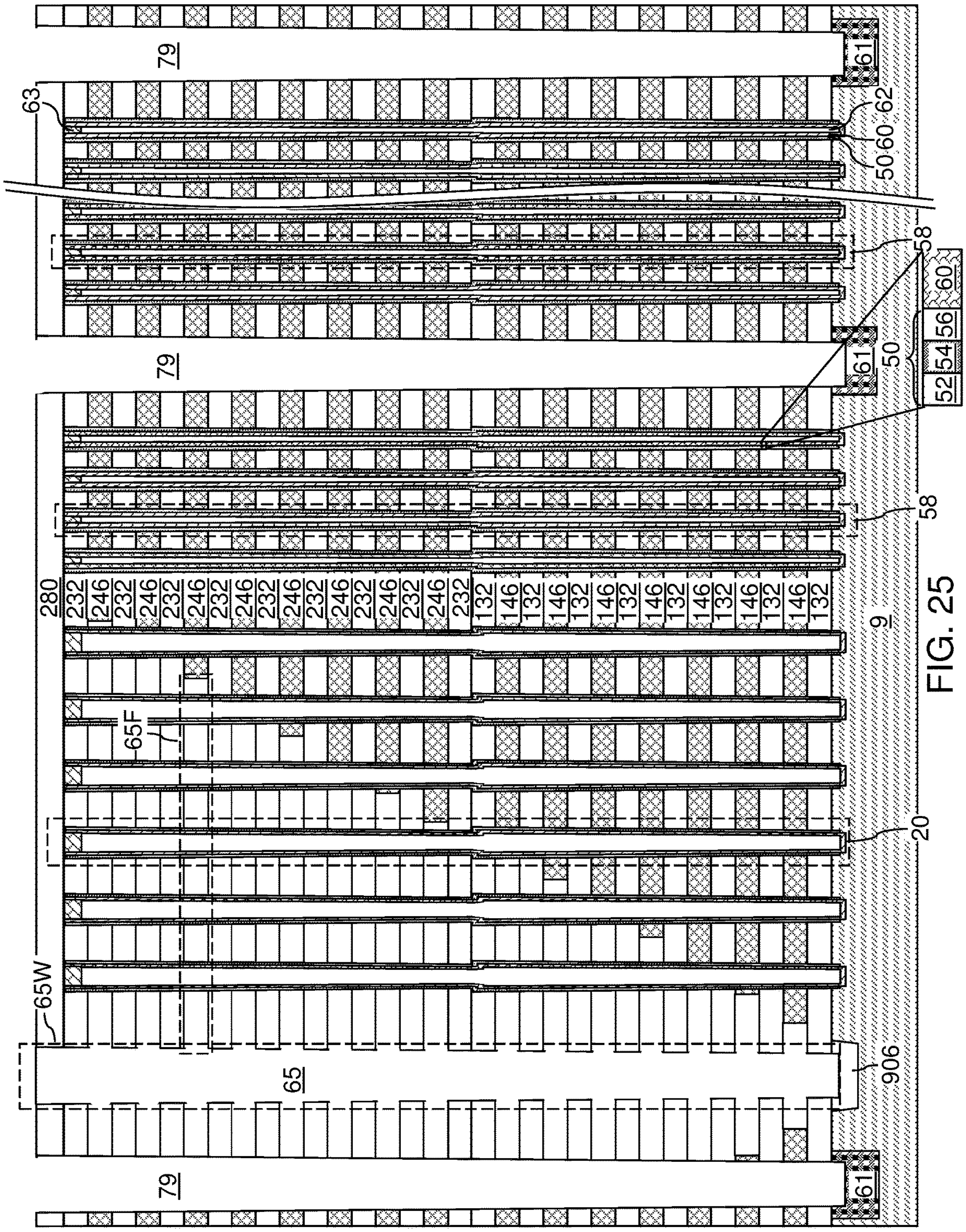
FIG. 25 is a vertical cross-sectional view of the first exemplary structure after formation of electrically conductive layers and a source region according to the first embodiment of the present disclosure.

Referring to FIG. 25, a backside blocking dielectric layer (not shown) can be optionally deposited in the backside recesses and the backside trench 79 and over the contact-level dielectric layer 280. At least one conductive material can be deposited in the plurality of backside recesses (143, 243), on the sidewalls of the backside trench 79, and over the contact-level dielectric layer 280. The at least one conductive material can include at least one metallic material, i.e., an electrically conductive material that includes at least one metallic element. Excess portions of the at least one conductive material can be removed from inside the backside trench 79 and from above the contact-level dielectric layer 280 by performing an etch back process, which may comprise an anisotropic etch process or an isotropic etch process.

A plurality of first electrically conductive layers 146 can be formed in the plurality of first backside recesses 143, a plurality of second electrically conductive layers 246 can be formed in the plurality of second backside recesses 243, and a continuous metallic material layer (not shown) can be formed on the sidewalls of each backside trench 79 and over the contact-level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

The deposited metallic material of the continuous metallic material layer can be etched back from the sidewalls of each backside trench 79 and from above the contact-level dielectric layers 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure. Each of the memory opening fill structures 58 comprises a vertical stack of memory elements (comprising portions of a respective memory film 50, such as portions of a charge storage layer 54) located at each level of the electrically conductive layers (146, 246). A subset of the electrically conductive layers (146, 246) can comprise word lines for the memory elements. At least one topmost electrically conductive layer 246 may comprise a drain side select gate electrode. At least one bottommost electrically conductive layer 146 may comprise a source side select gate electrode.

Dopants of the second conductivity type may be implanted into surface portions of the semiconductor material layer in the substrate 9 underneath the backside trench 79 to form a source region 61.

Figure 26A:
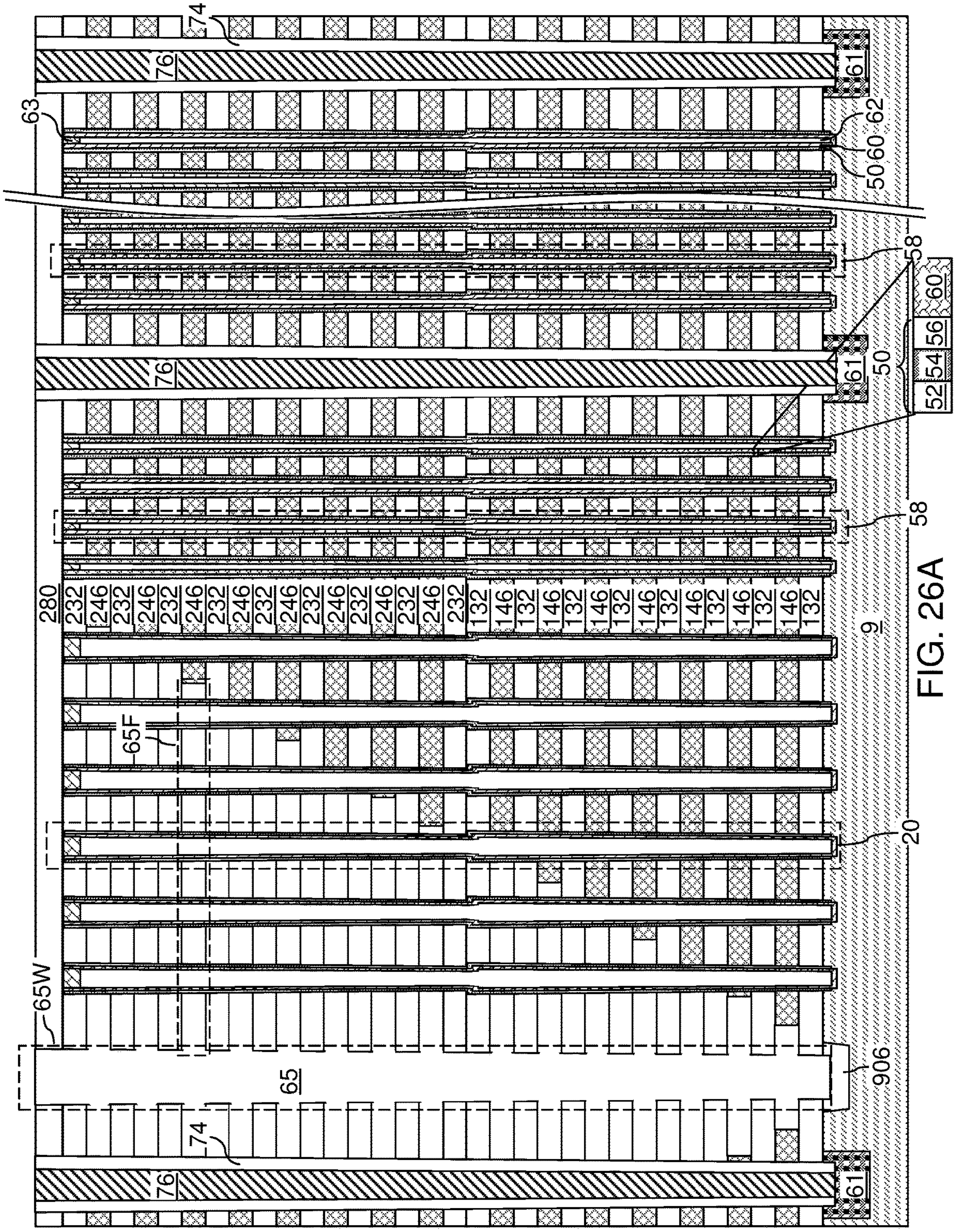
FIG. 26A is a vertical cross-sectional view of the first exemplary structure after formation of a backside trench fill structure according to the first embodiment of the present disclosure.
Figure 26B:
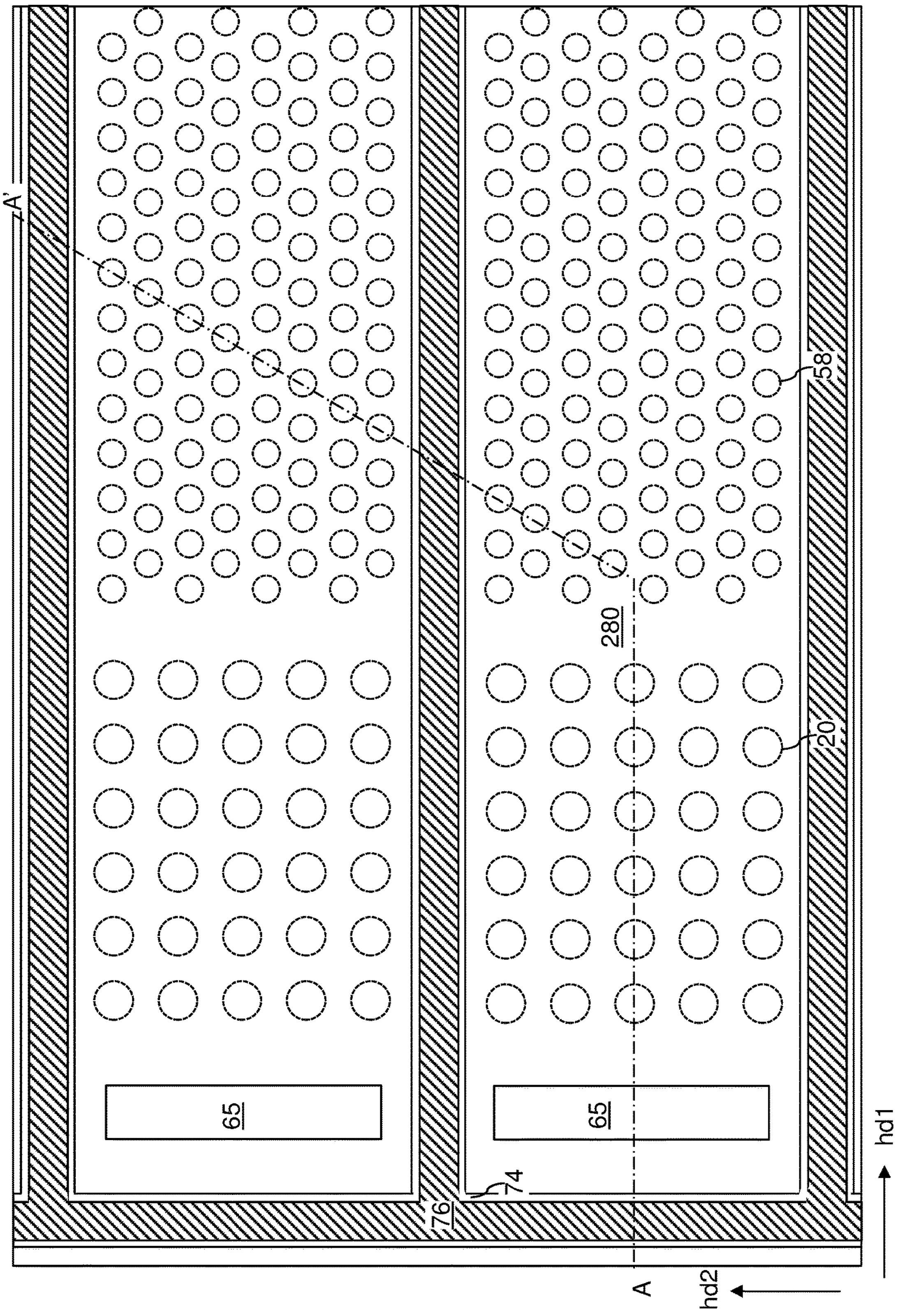
FIG. 26B is a top-down view of the first exemplary structure of FIG. 26A. The vertical plane A-A' is the cut plane of the vertical cross-sectional view of FIG. 26A.

Referring to FIGS. 26A and 26B, an insulating spacer material layer such as a silicon oxide layer can be formally deposited in the backside trench 79 and over the contact-level dielectric layers 280. An anisotropic etch process can be performed to remove horizontally-extending portions of the insulating spacer material layer from above the contact-level dielectric layers 280 and at the bottom of the backside trench 79. Each remaining vertically-extending tubular portion of the insulating spacer material layer constitutes a backside insulating spacer 74.

At least one conductive material, such as at least metallic material, can be subsequently deposited in the cavities in the backside trench 79. The at least one conductive material may comprise at least one metallic barrier material (e.g., a metallic nitride material such as TiN, TaN, and/or WN) and at least one metallic fill material (e.g., W, Cu, Co, Ru, Mo, etc.). Excess portions of the at least one metallic material can be removed from above the horizontal plane including the top surfaces of the contact-level dielectric layer 280 by a planarization process, which may employ a recess etch process and/or a chemical mechanical polishing process. The portion of the at least one metallic material constitutes a backside contact via structure 76. The combination of the backside insulating spacer 74 and the backside contact via structure 76 constitutes a backside trench fill structure (74, 76).

In one embodiment, the backside trench fill structure (74, 76) contacts sidewalls of each alternating stack {(132, 142), (232, 242)} and vertically extends through each layer within each alternating stack {(132, 142), (232, 242)}. In one embodiment, the backside trench fill structure (74, 76) comprises: at least two first elongated portions that laterally extend along a first horizontal direction hd1 and contacting lengthwise sidewalls of each of the insulating layers (132, 232) and each of the electrically conductive layers (146, 246); and at least one second elongated portion that laterally extends along a second horizontal direction hd2 that is different from the first horizontal direction hd1 and connecting a respective neighboring pair of first elongated portions of the backside trench fill structure (74, 76).

Figure 27A:
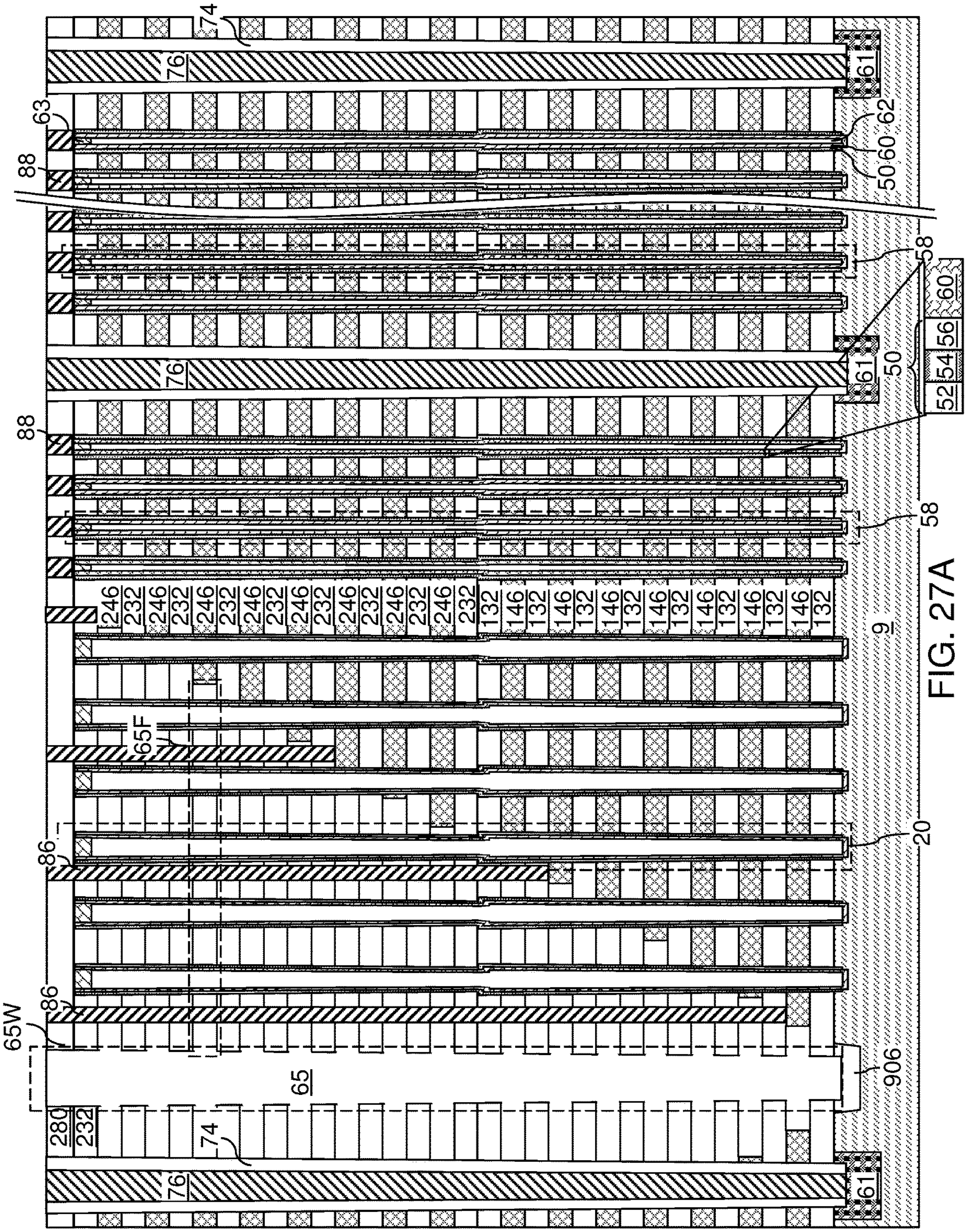
FIG. 27A is a vertical cross-sectional view of the first exemplary structure after formation of a various contact via structures according to the first embodiment of the present disclosure.
Figure 27B:
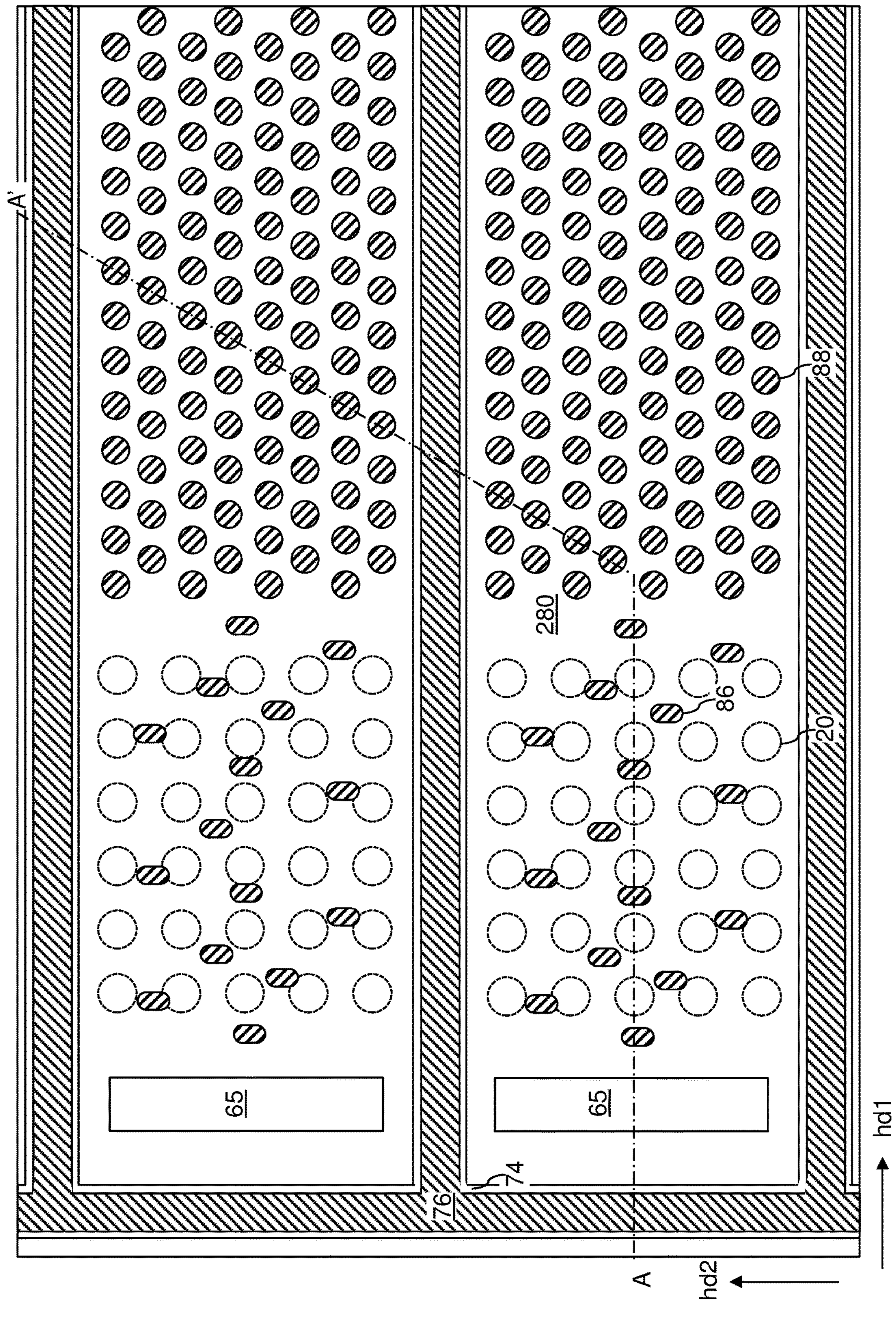
FIG. 27B is a top-down view of the first exemplary structure of FIG. 27A. The vertical plane A-A' is the cut plane of the vertical cross-sectional view of FIG. 27A.

Referring to FIGS. 27A and 27B, contact via structures (88, 86) can be formed through the contact-level dielectric layer 280 and through the finned dielectric support structures 65. Specifically, drain contact via structures 88 can be formed directly on a respective one of the drain regions 63. Layer contact via structures 86 can be formed on a top surface of a respective one of the electrically conductive layers (146, 246). A subset of the layer contact via structures 86 can vertically extend through a respective subset of the dielectric fin structures 65F. In one embodiment, layer contact via structures 86 can vertically extend through a first subset of the openings through a subset of the dielectric fin structures 65F; and each of the layer contact via structures 86 contacts a top surface of a respective one of the electrically conductive layers (146, 246).

Figure 28A:
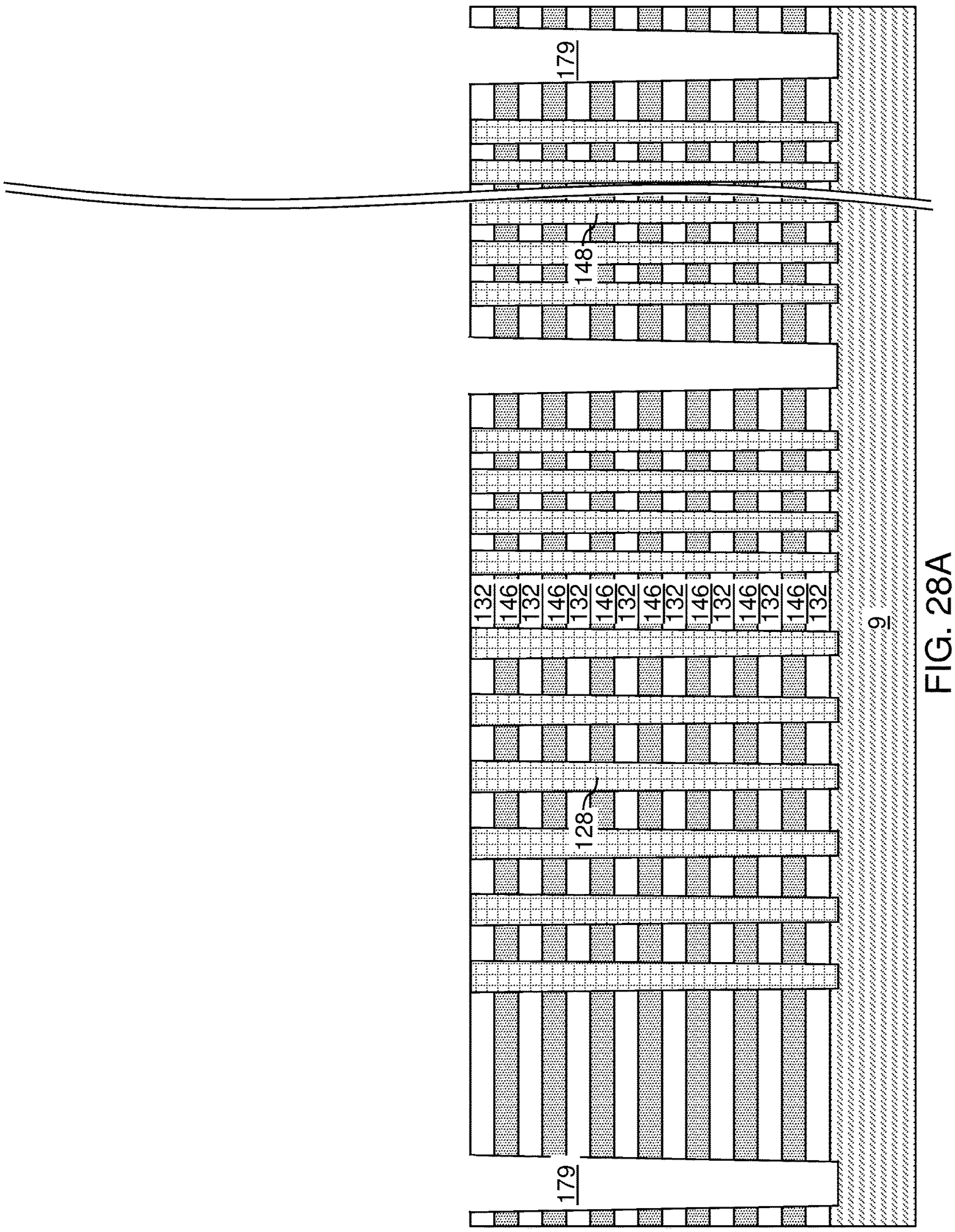
FIG. 28A is a vertical cross-sectional view of the second exemplary structure after formation of a first-tier backside trench according to the second embodiment of the present disclosure.
Figure 28B:
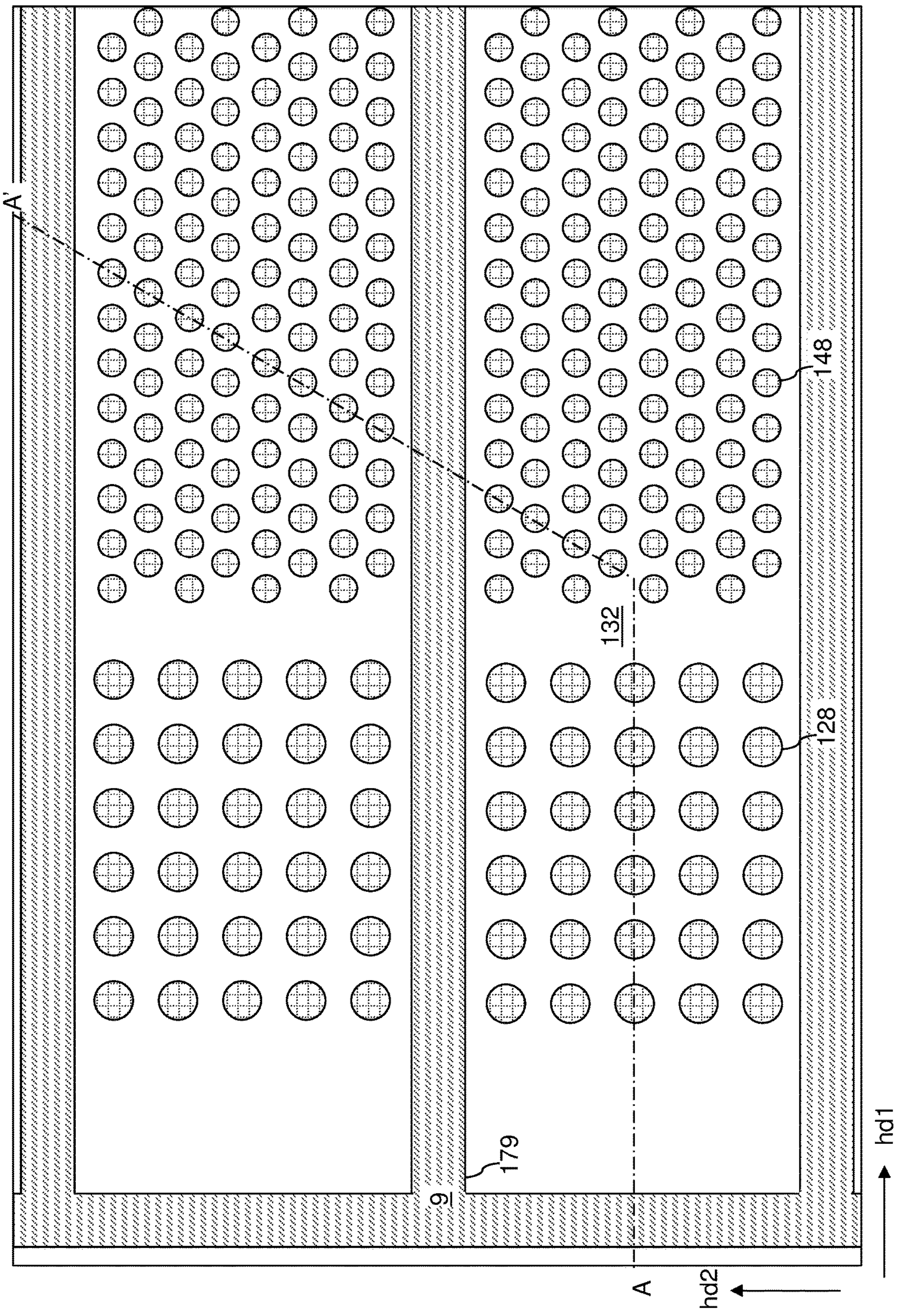
FIG. 28B is a top-down view of the second exemplary structure of FIG. 28A. The vertical plane A-A' is the cut plane of the vertical cross-sectional view of FIG. 28A.

Referring to FIGS. 28A and 28B, a second exemplary structure according to the second embodiment of the present disclosure can be derived from first exemplary structure illustrated in FIGS. 3A and 3B by forming a first-tier backside trench 179.

A photoresist layer (not shown) can be applied over the first alternating stack (132, 142) and can be lithographically patterned to form a continuous opening including a set of interconnected opening segments. The openings in the photoresist layer can laterally extend along the first horizontal direction hd1 between each neighboring cluster of memory opening fill structures 58. A first-tier backside trench 179 can be formed by performing an anisotropic etch process that transfers the pattern in the photoresist layer through the first alternating stack (132, 142), and optionally into an upper portion of the substrate 9. Portions of the first alternating stack (132, 142) that underlie the openings in the photoresist layer can be removed to form a first-tier backside trench 179. A vertically alternating sequence of first continuous insulating layers 132 and first continuous spacer material layers (such as the first sacrificial material layers 142) can be divided into first-tier alternating stacks (132, 142) of first insulating layers 132 and first spacer material layers (such as first sacrificial material layers 142) by forming a first-tier backside trench 179.

In one embodiment, the first-tier backside trench 179 may comprise at least two first elongated portions that laterally extend along a first horizontal direction hd1, and at least one second elongated portion that laterally extends along a second horizontal direction hd2 that is different from the first horizontal direction hd1 and connecting a respective neighboring pair of first elongated portions of the first-tier backside trench 179. In one embodiment, each of the at least two first elongated portions of the first-tier backside trench 179 may laterally extend along the first horizontal direction hd1 with a respective uniform width along the second horizontal direction hd2. In one embodiment, the at least two first elongated portions of the first-tier backside trench 179 may comprise three or more first elongated portions that are repeated with a periodicity along the second horizontal direction hd2. In one embodiment, lengthwise sidewalls of each of the first insulating layers 132 and each of the first sacrificial material layers 142 can be exposed to the at least two first elongated portions of the first-tier backside trench 179 upon formation of the first-tier backside trench 179. In one embodiment, the first-tier backside trench 179 may be formed as a single continuous volume in which the at least two first elongated portions and the at least one second elongated portion are interconnected among one another. In one embodiment, the first elongated portions of the first-tier backside trench 179 can be formed between clusters of first-tier sacrificial memory opening fill portions 148. The clusters of the first-tier sacrificial memory opening fill portions 148 can be laterally spaced apart along the second horizontal direction hd2 by the first elongated portions of the first-tier backside trench 179.

Figure 29:
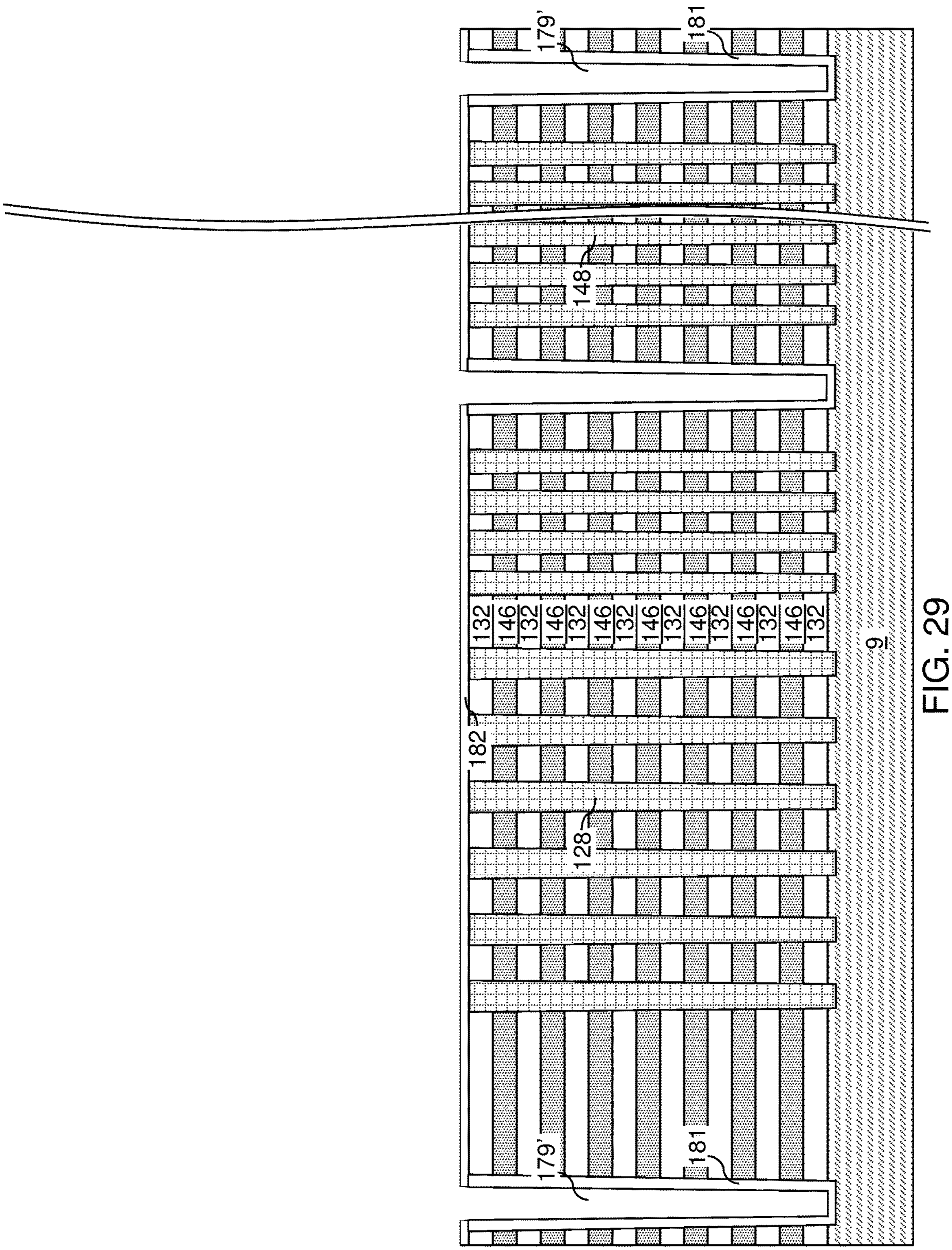
FIG. 29 is a vertical cross-sectional view of the second exemplary structure after formation of a first continuous dielectric liner layer according to the second embodiment of the present disclosure.

Referring to FIG. 29, a first continuous dielectric liner layer (181, 182) can be formed by a conformal deposition process in the first-tier backside trench 179 and over the first-tier alternating stack (132, 142). The first continuous dielectric liner layer (181, 82) comprises a first backside trench dielectric liner 181 that is formed on sidewalls and a bottom surface of the first-tier backside trench 179 and a first planar dielectric liner 182 that is formed over the first-tier alternating stack (132, 142). A backside cavity 179' can be present in a volume of the first-tier backside trench 179 that is not filled with the first continuous dielectric liner layer (181, 182). The first continuous dielectric liner layer (181, 182) comprises a dielectric material such as silicon oxide. The thickness of the first continuous dielectric liner layer (181, 182) may be in a range from 3 nm to 60 nm, such as from 60 nm to 30 nm, although lesser and greater thicknesses may also be employed.

Figure 30A:
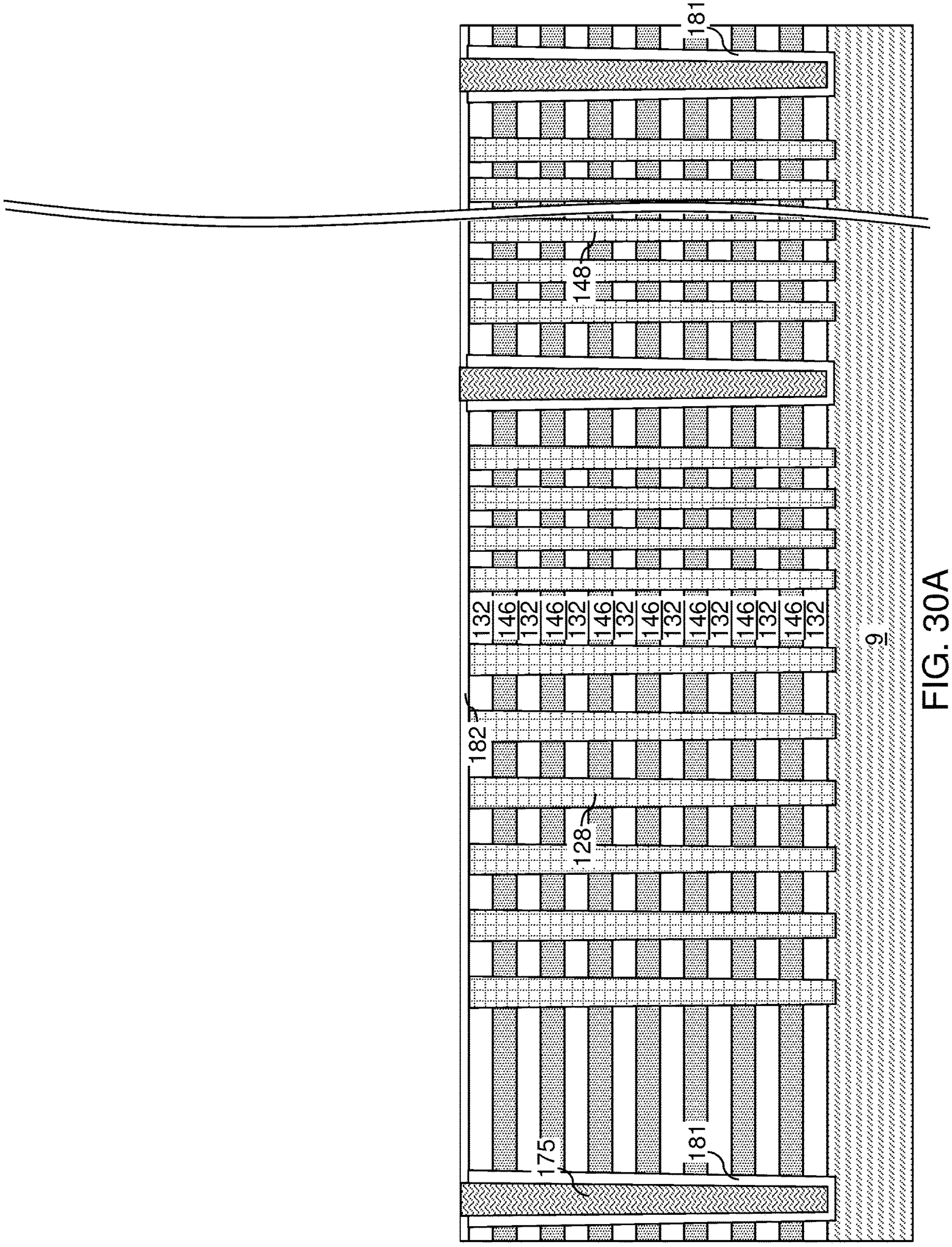
FIG. 30A is a vertical cross-sectional view of the second exemplary structure after formation of a first sacrificial backside trench fill structure according to the second embodiment of the present disclosure.
Figure 30B:
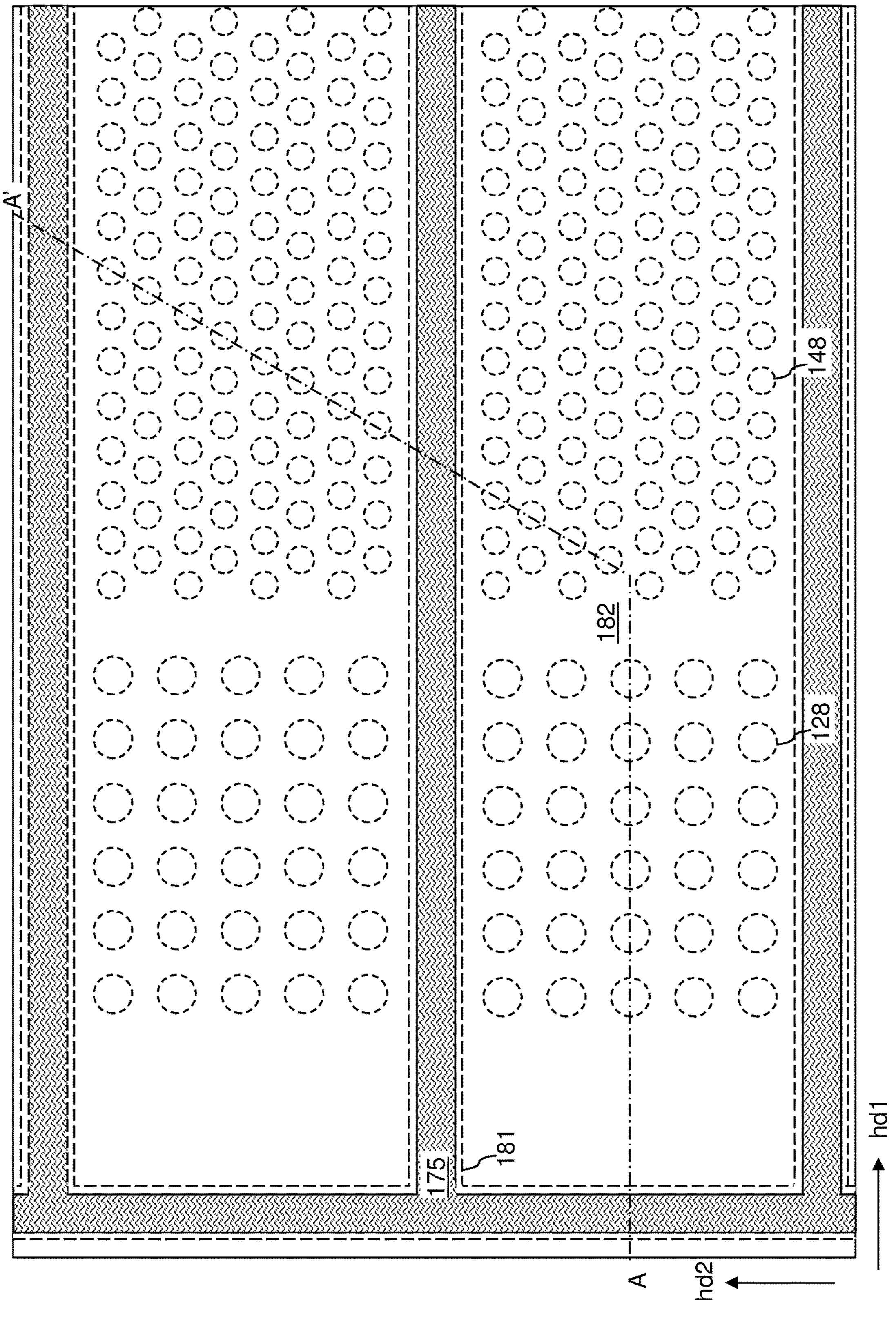
FIG. 30B is a top-down view of the second exemplary structure of FIG. 30A. The vertical plane A-A' is the cut plane of the vertical cross-sectional view of FIG. 30A.

Referring to FIGS. 30A and 30B, a first sacrificial trench fill material can be deposited in the backside cavity 179' and over the continuous dielectric liner layer (181, 182) to form a first sacrificial trench fill material layer. The first sacrificial trench fill material layer fills the volume of the backside cavity 179'. The first sacrificial trench fill material layer comprises a first sacrificial trench fill material such as a semiconductor material. For example, the first sacrificial trench fill material layer may comprise amorphous silicon, polysilicon, and/or a silicon-germanium alloy. Alternative sacrificial trench fill materials such as organosilicate glass, a carbon-based fill material, or a polymer material may also be employed.

A planarization process, such as a recess etch process or a chemical mechanical polishing process, may be performed to remove horizontally-extending portions of the first sacrificial trench fill material layer from above the horizontal plane including the first planar dielectric liner 182. The remaining portion of the first sacrificial trench fill material layer constitutes a first-tier sacrificial backside trench fill structure 175, which may have at least two first elongated portions that laterally extend along the first horizontal direction hd1 and at least one second elongated portion that laterally extends along the second horizontal direction hd2.

Figure 31A:
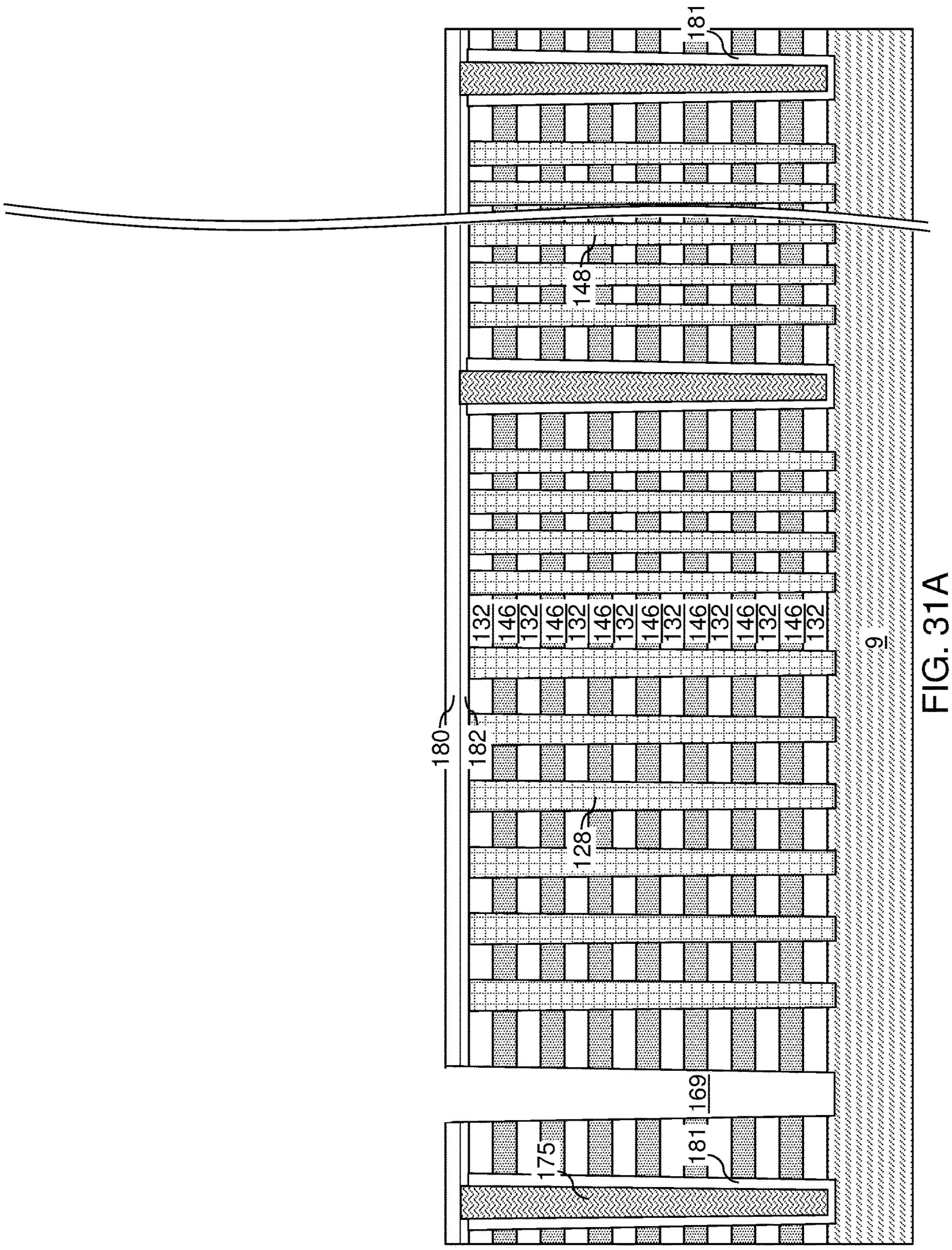
FIG. 31A is a vertical cross-sectional view of the second exemplary structure after formation of an inter-tier dielectric layer and first-tier access trenches according to the second embodiment of the present disclosure.
Figure 31B:
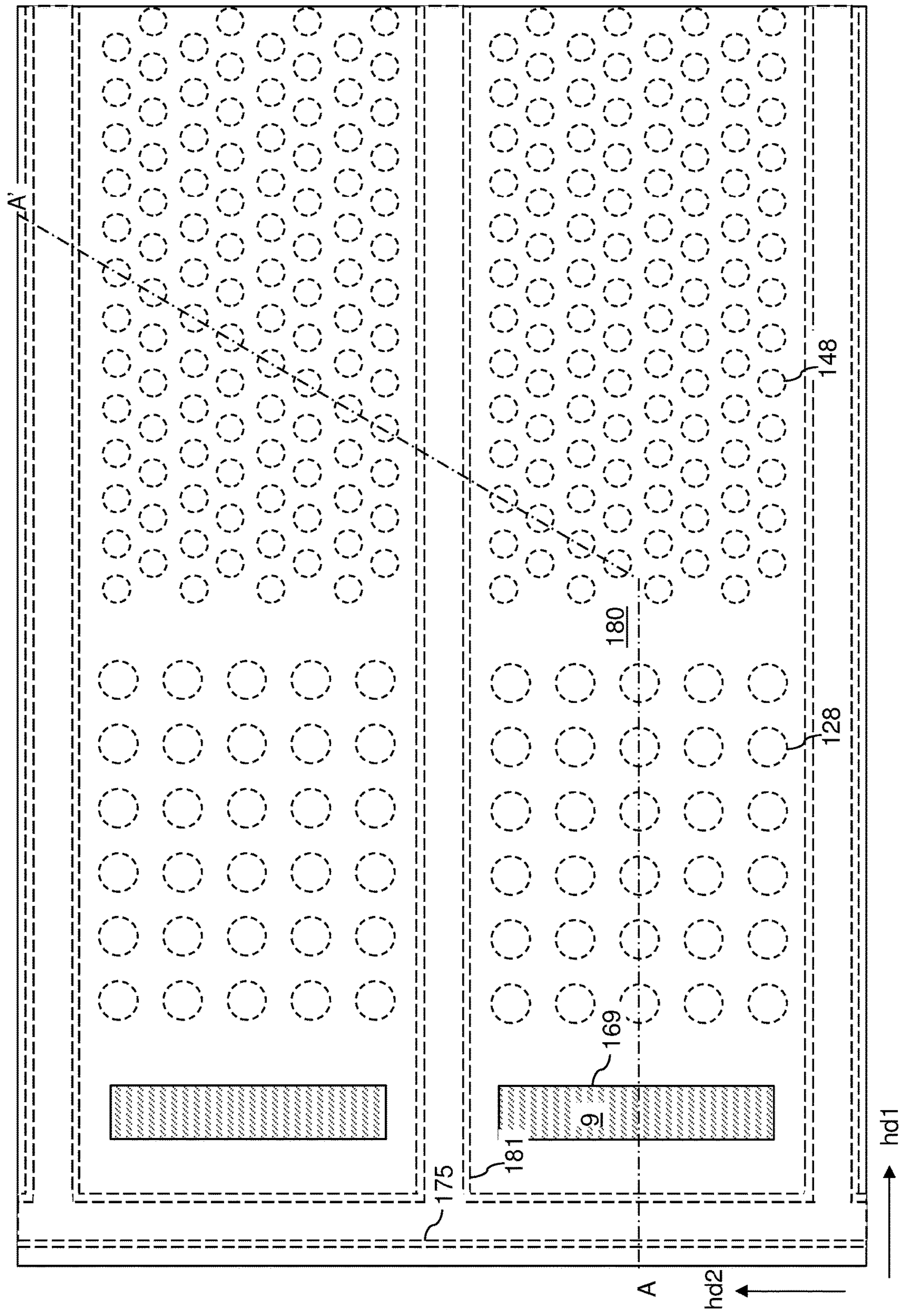
FIG. 31B is a top-down view of the second exemplary structure of FIG. 31A. The vertical plane A-A' is the cut plane of the vertical cross-sectional view of FIG. 31A.

Referring to FIGS. 31A and 31B, an inter-tier dielectric layer 180 can be formed above the first planar dielectric liner 182. The inter-tier dielectric layer 180 may comprise a dielectric material, such as silicon oxide. The thickness of the inter-tier dielectric layer 180 may be in a range from 5 nm to 100 nm, such as from 10 nm to 50 nm, although lesser and greater thicknesses may also be employed. A photoresist layer (not shown) can be applied over the inter-tier dielectric layer 180, and can be lithographically patterned to form discrete openings over each of the first-tier alternating stacks (132, 142). In one embodiment, the openings in the photoresist layer may be formed in areas that are proximal to, and laterally spaced from, the at least one second elongated portion of the first-tier backside trench 179.

An anisotropic etch process can be performed to etch through unmasked portions of the first-tier alternating stacks (132, 142). First access trenches 169 are formed underneath the openings in the photoresist layer. The first access trenches 169 can vertically extend through each layer within a respective first-tier alternating stack (132, 142), and a surface segment of the substrate 9 can be physically exposed underneath each first access trench 169. In one embodiment, all sidewalls of each first access trench 169 may be laterally spaced from the first-tier backside trench 179 by a respective portion of the alternating stack (132, 142). In one embodiment, the first access trenches 169 may be laterally elongated along the second horizontal direction hd2 with a respective uniform width along the first horizontal direction hd1. Each first access trench 169 may be formed within a respective area that is free of any first-tier sacrificial opening fill portions (148, 128). In one embodiment, one, a plurality, or each, of the first access trenches 169 may have a respective rectangular horizontal cross-sectional area. The photoresist layer can be subsequently removed, for example, by ashing.

Figure 32:
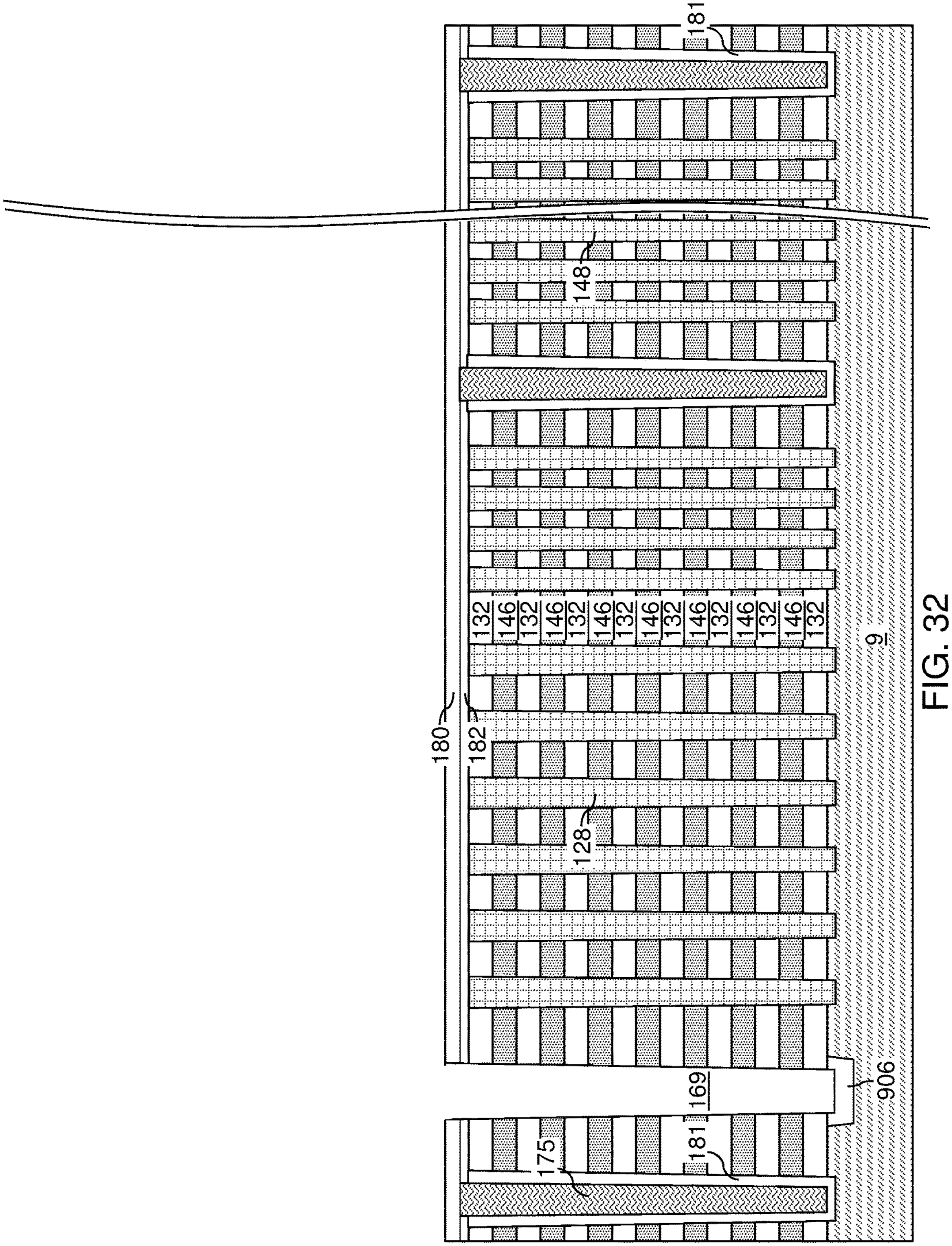
FIG. 32 is a vertical cross-sectional view of the second exemplary structure after formation of semiconductor oxide plates according to the second embodiment of the present disclosure.

Referring to FIG. 32, an oxidation process can be performed to convert surface portions of the substrate 9 underlying the first access trenches 169 into semiconductor oxide plates 906. A thermal oxidation process or a plasma oxidation process may be employed.

Figure 33A:
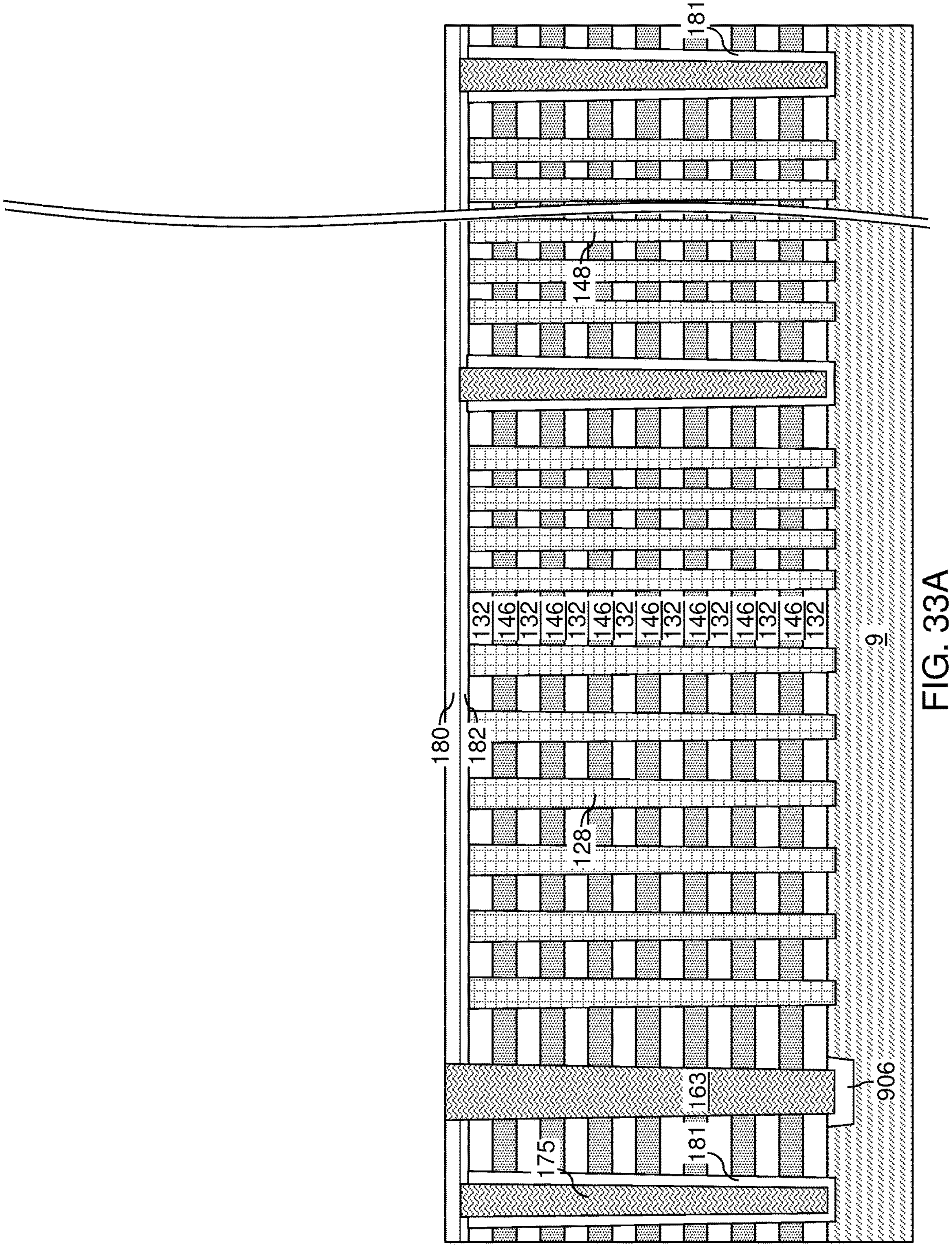
FIG. 33A is a vertical cross-sectional view of the second exemplary structure after formation of first access trench fill structures according to the second embodiment of the present disclosure.
Figure 33B:
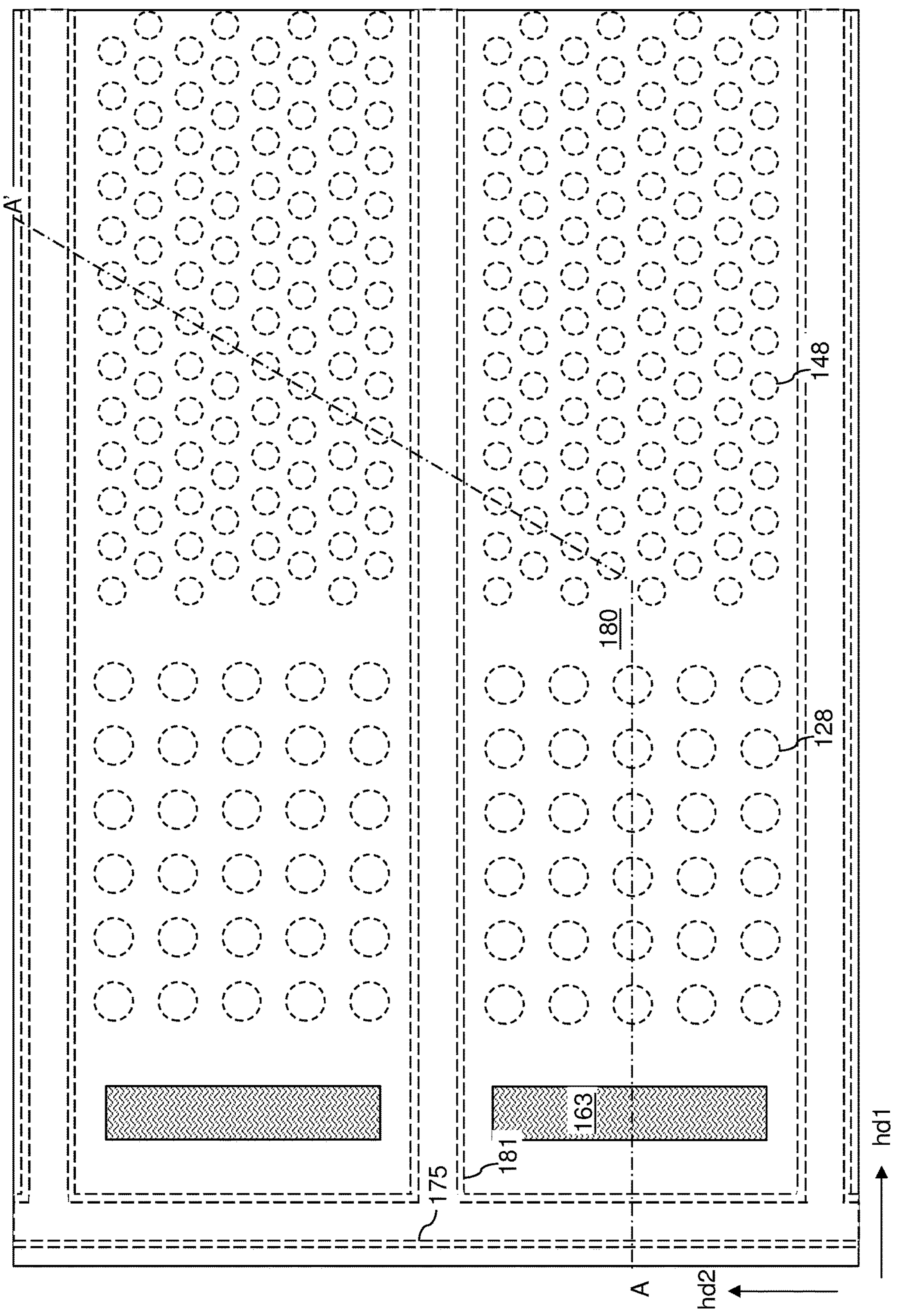
FIG. 33B is a top-down view of the second exemplary structure of FIG. 33A. The vertical plane A-A' is the cut plane of the vertical cross-sectional view of FIG. 33A.

Referring to FIGS. 33A and 33B, a first access trench fill material can be deposited in the first access trenches 69 and over the inter-tier dielectric layer 180. The access trench fill material is a sacrificial fill material. Portions of the access trench fill material that overlie the horizontal plane including the top surface of the inter-tier dielectric layer 180 can be removed by performing a planarization process such as a recess etch process and/or a chemical mechanical polishing process. Each remaining portion of the first access trench fill material that fills a respective first access trench 169 constitutes a first access trench fill structure 163. The first access trench fill structure 163 may comprise a semiconductor material, such as amorphous silicon.

Figure 34:
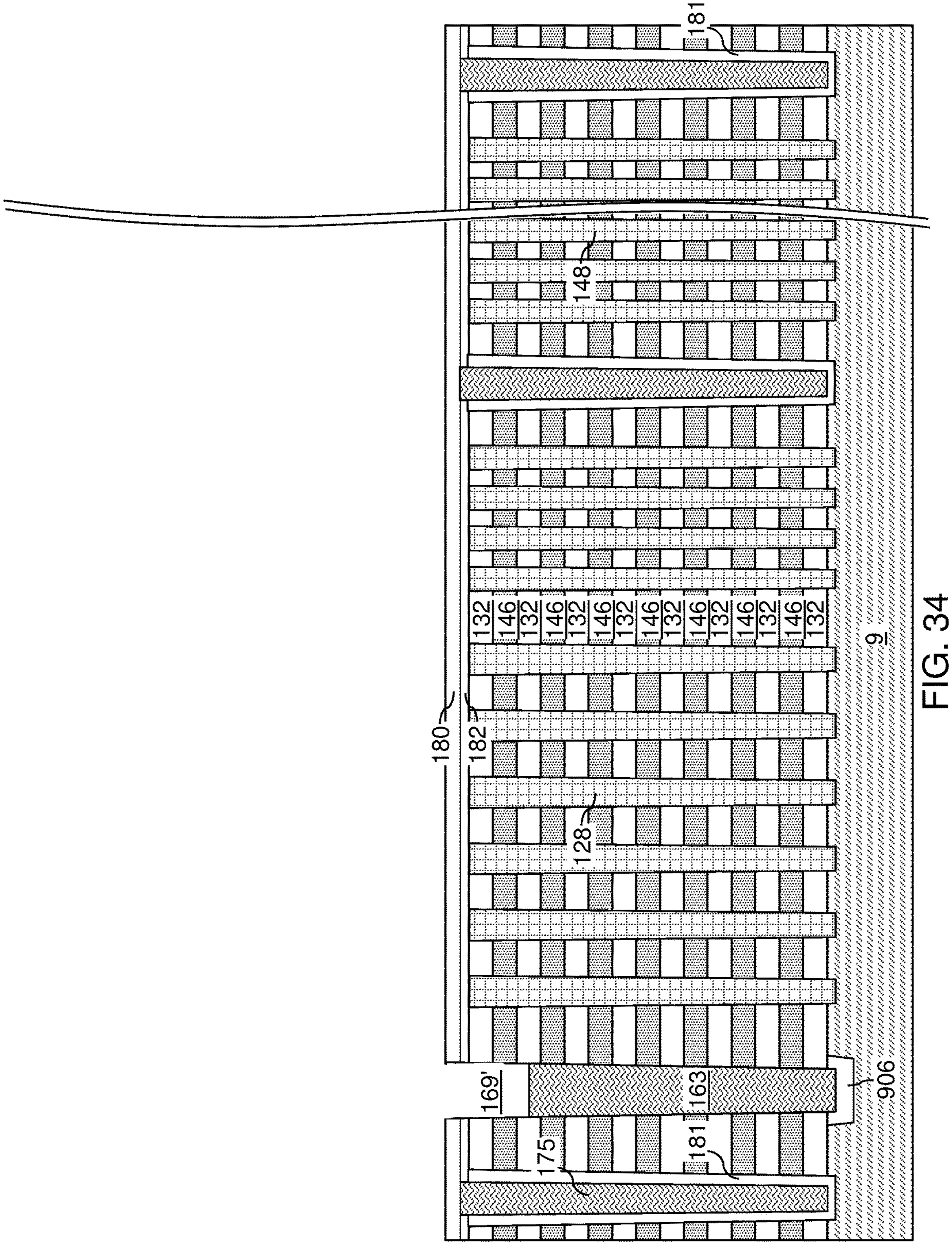
FIG. 34 is a vertical cross-sectional view of the second exemplary structure after performing a first vertical recess etch step according to the second embodiment of the present disclosure.

Referring to FIG. 34, a first vertical recess etch step may be performed to vertically recess the top surfaces of the first access trench fill structures 163 to a height below the horizontal plane including the bottom surfaces of the topmost first sacrificial material layers 142 and above the horizontal plane including the top surfaces of the second-from-the-top first sacrificial material layers 142. The first vertical recess etch step may comprises a dry etch step or a wet etch step that etches the material of the first access trench fill structures 163 selective to the materials of the first insulating layers 132 and the first sacrificial material layers 142. For example, if the first access trench fill structures 163 comprise amorphous silicon, then the first vertical recess etch step may comprise a wet etch process employing hot trimethyl-2 hydroxyethyl ammonium hydroxide ("hot TMY") or tetramethyl ammonium hydroxide (TMAH). A cavity 169' is formed above the recessed first access trench fill structures 163.

Figure 35:
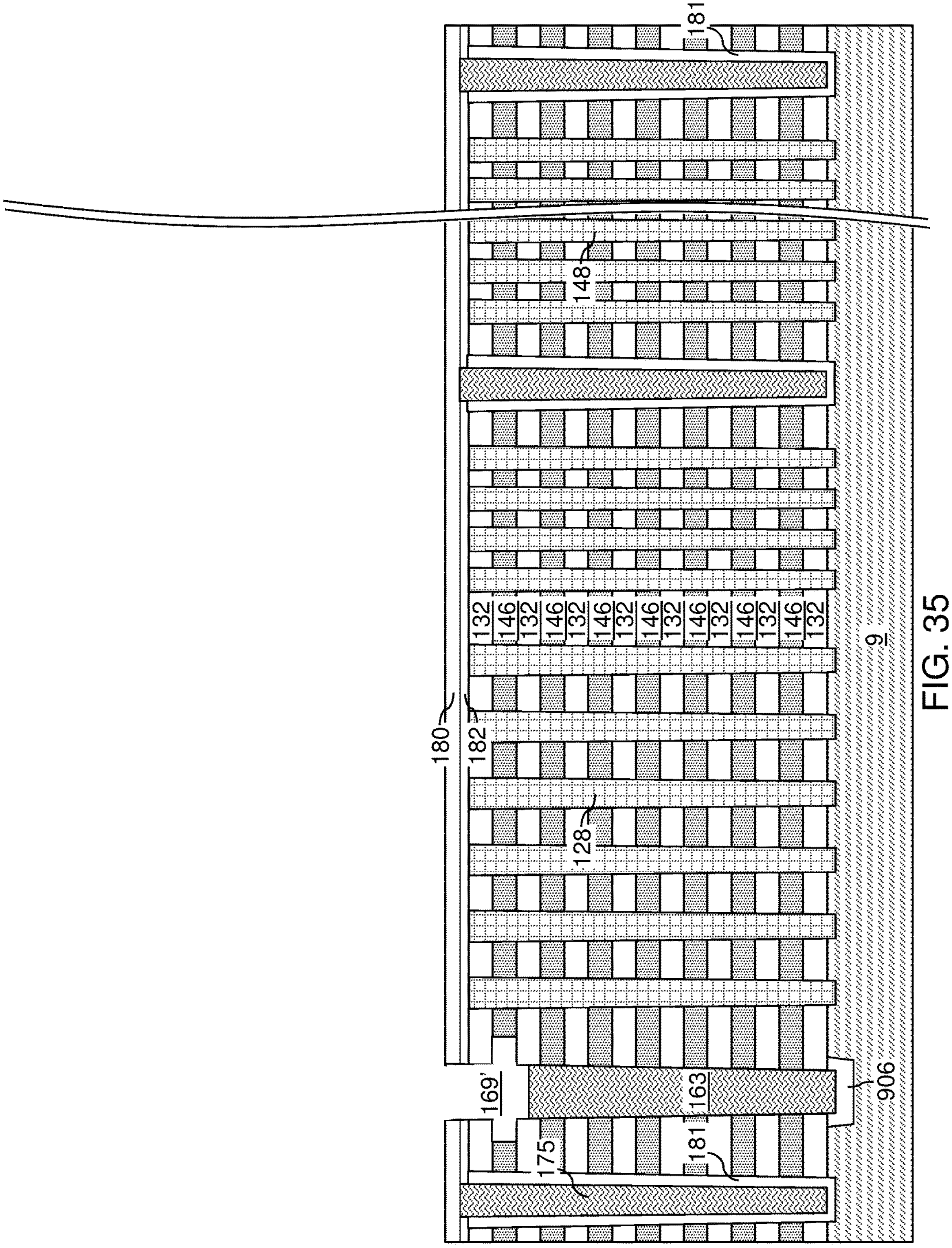
FIG. 35 is a vertical cross-sectional view of the second exemplary structure after performing a first isotropic etch step according to the second embodiment of the present disclosure.

Referring to FIG. 35, a first isotropic etch step can be performed to isotropically etch the material of the first sacrificial material layers 142 selective to the materials of the first insulating layers 132 and the first access trench fill structures 163. The topmost first sacrificial material layers 142 may be laterally recessed by the second isotropic etch step. For example, the first sacrificial material layers 142 may comprise silicon nitride, and the first isotropic etch step may comprise a wet etch process employing hot phosphoric acid or a mixture of dilute hydrofluoric acid and ethylene glycol. The lateral recess distance of the first isotropic etch step may be in a range from 50 nm to 500 nm, such as from 100 nm to 300 nm, although lesser and greater lateral recess distances may also be employed. A first finned access cavity 169' can be formed in each volume overlying a top surface of a first access trench fill structures 163. Each first finned access cavity 169' comprises a vertically-extending cavity portion that includes a volume formed by removal of a first access trench fill structure 163, and a fin cavity portion formed by removal of a portion of a topmost first sacrificial material layer 142.

Figure 36:
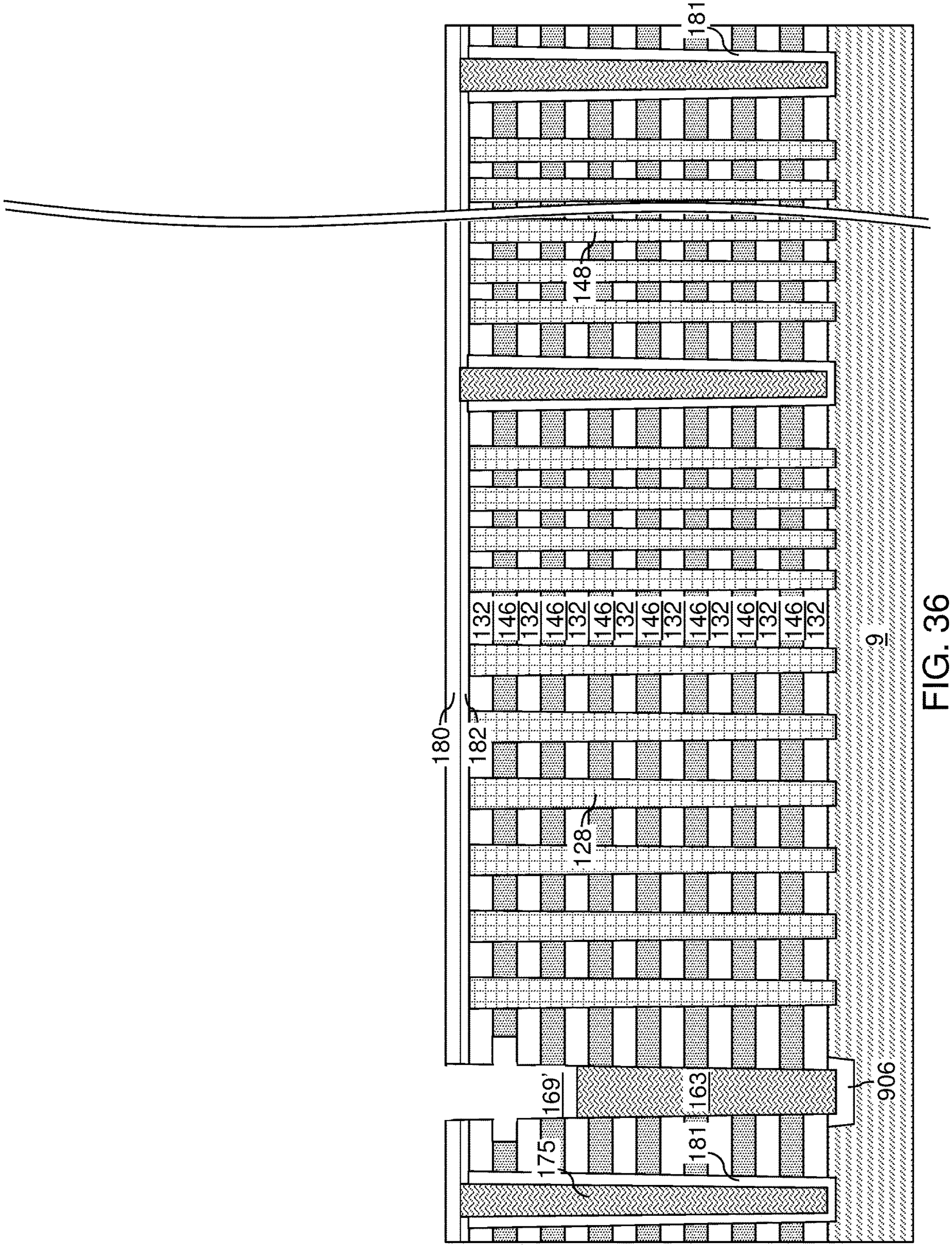
FIG. 36 is a vertical cross-sectional view of the second exemplary structure after performing a second vertical recess etch step according to the second embodiment of the present disclosure.

Referring to FIG. 36, a second vertical recess etch step may be performed to vertically recess the top surfaces of the first access trench fill structures 163 to a height below the horizontal plane including the bottom surfaces of the second-from-the-top first sacrificial material layers 142 and above the horizontal plane including the top surfaces of the third-from-the-top first sacrificial material layers 142. The second vertical recess etch step may comprises a dry etch step or a wet etch step that etches the material of the first access trench fill structures 163 selective to the materials of the first insulating layers 132 and the first sacrificial material layers 142. For example, if the first access trench fill structures 163 comprise amorphous silicon, then the second vertical recess etch step may comprise a wet etch process employing hot trimethyl-2 hydroxyethyl ammonium hydroxide ("hot TMY") or tetramethyl ammonium hydroxide (TMAH).

Figure 37:
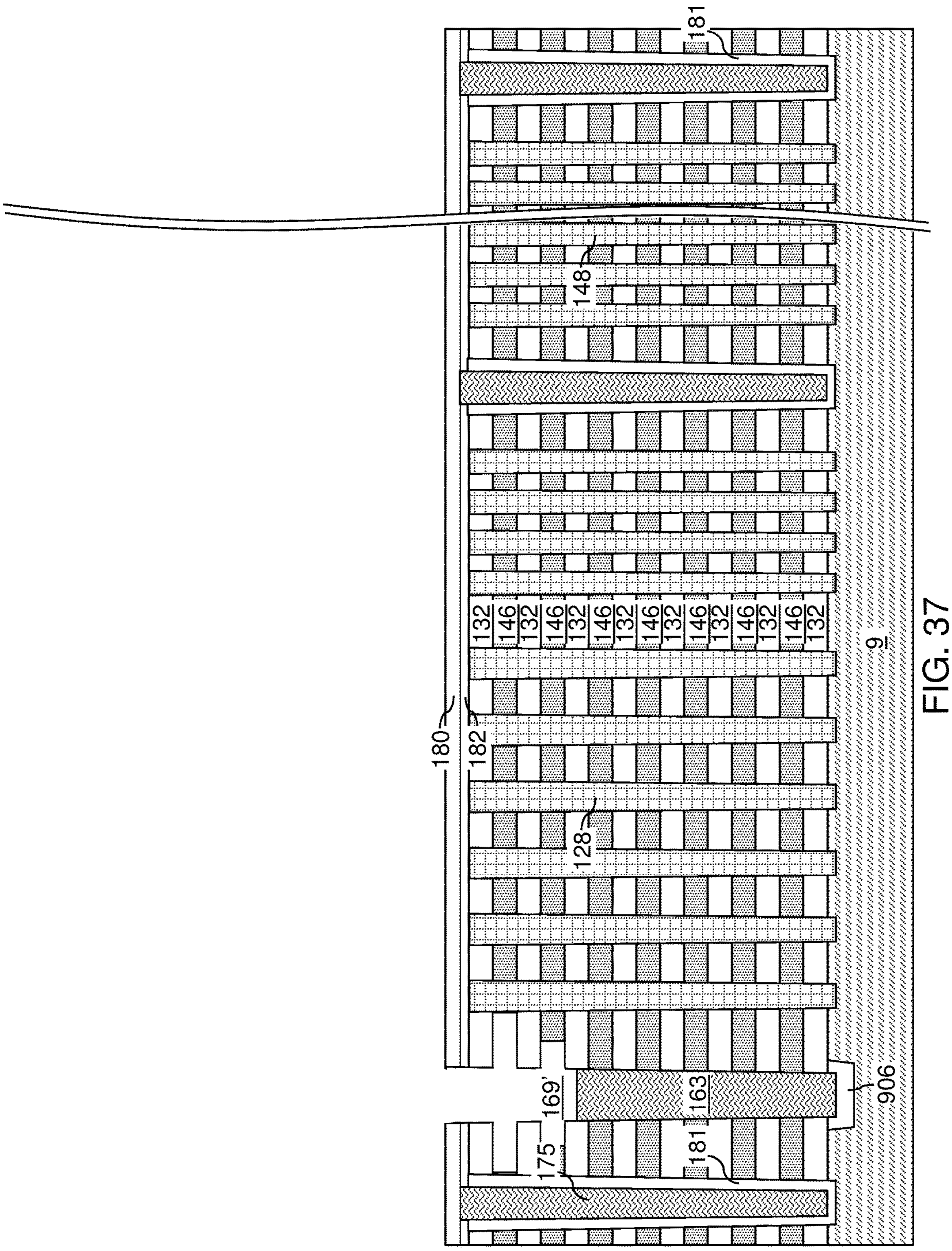
FIG. 37 is a vertical cross-sectional view of the second exemplary structure after performing a second isotropic etch step according to the second embodiment of the present disclosure.

Referring to FIG. 37, a second isotropic etch step can be performed to isotropically etch the material of the first sacrificial material layers 142 selective to the materials of the first insulating layers 132 and the first access trench fill structures 163. For example, the first sacrificial material layers 142 may comprise silicon nitride, and the second isotropic etch step may comprise a wet etch process employing hot phosphoric acid or a mixture of dilute hydrofluoric acid and ethylene glycol. The topmost first sacrificial material layers 142 and the second-from-the-top first sacrificial material layers 142 may be laterally recessed by the second isotropic etch step. The lateral recess distance of the second isotropic etch step may be in a range from 50 nm to 500 nm, such as from 100 nm to 300 nm, although lesser and greater lateral recess distances may also be employed. Each first finned access cavity 169' can be laterally expanded. Each first finned access cavity 169' comprises a vertically-extending cavity portion that includes a volume formed by removal of a first access trench fill structure 163, and two fin cavity portion formed by removal of a portion of a topmost first sacrificial material layer 142.

Figure 38:
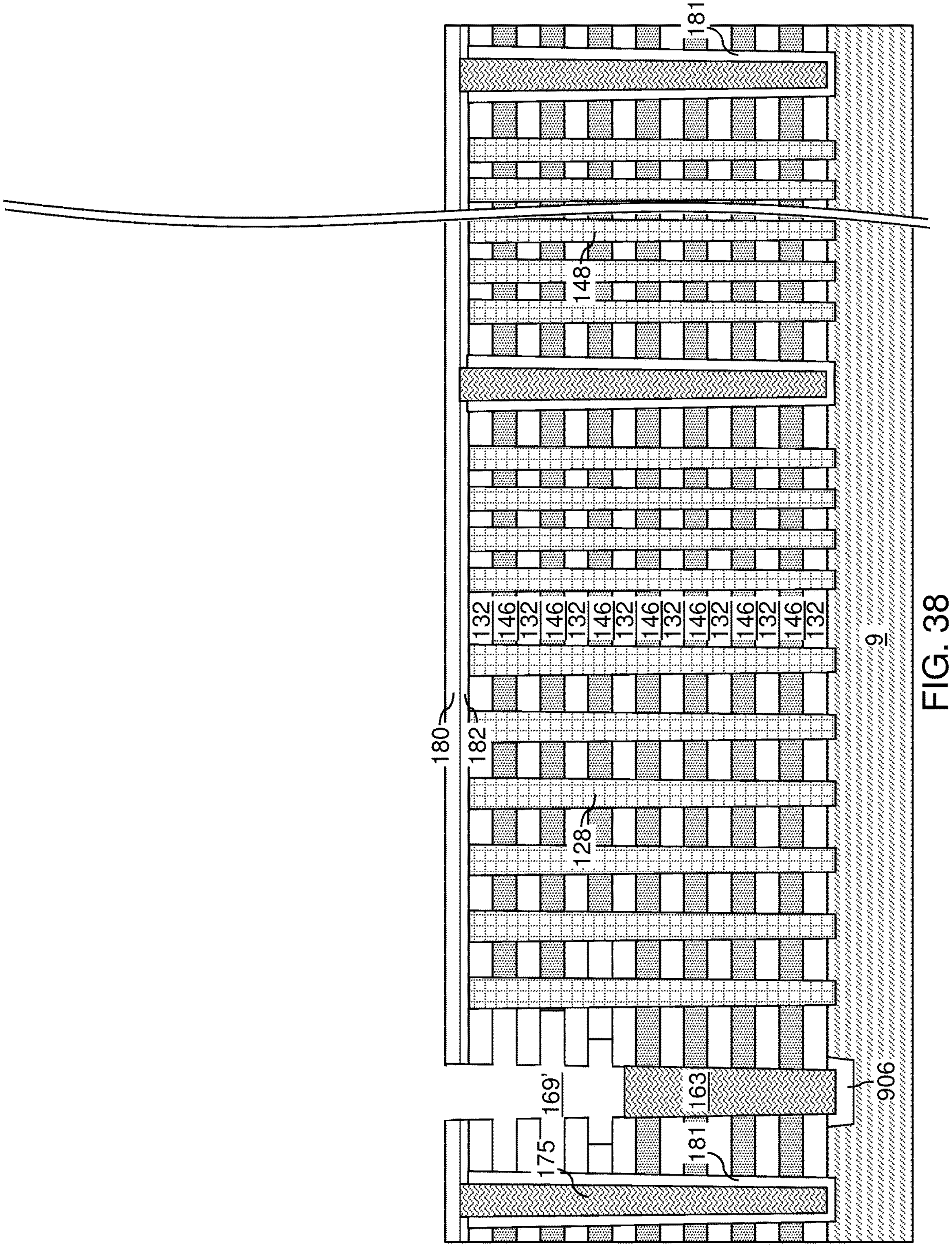
FIG. 38 is a vertical cross-sectional view of the second exemplary structure after performing a third vertical recess etch step according to the second embodiment of the present disclosure.

Referring to FIG. 38, the set of processing steps described with reference to FIGS. 36 and 37 can be repeated multiple times iteratively to vertically recess top surfaces of the first access trench fill structures 163 and to laterally recess physically exposed sidewalls of the first sacrificial material layers 142. Generally, multiple instances of a unit processing sequence can be iteratively performed. Each instance of the unit processing sequence comprises a vertical recess etch step (such as the second vertical recess etch step) that vertically recesses the first access trench fill structures 163 and an isotropic etch step (such as the second isotropic etch process) that isotropically recesses physically exposed portions of the first sacrificial material layers 142 around each first finned access cavity 169' that overlies a first access trench fill structure 163. The first finned access cavities 169' are expanded vertically and laterally by performing multiple instances of the unit processing sequence. In one embodiment, surface segments of sidewalls of the first continuous dielectric liner layer (181, 182) are physically exposed to one, a plurality, or each, of the first finned access cavities 169'.

Figure 39:
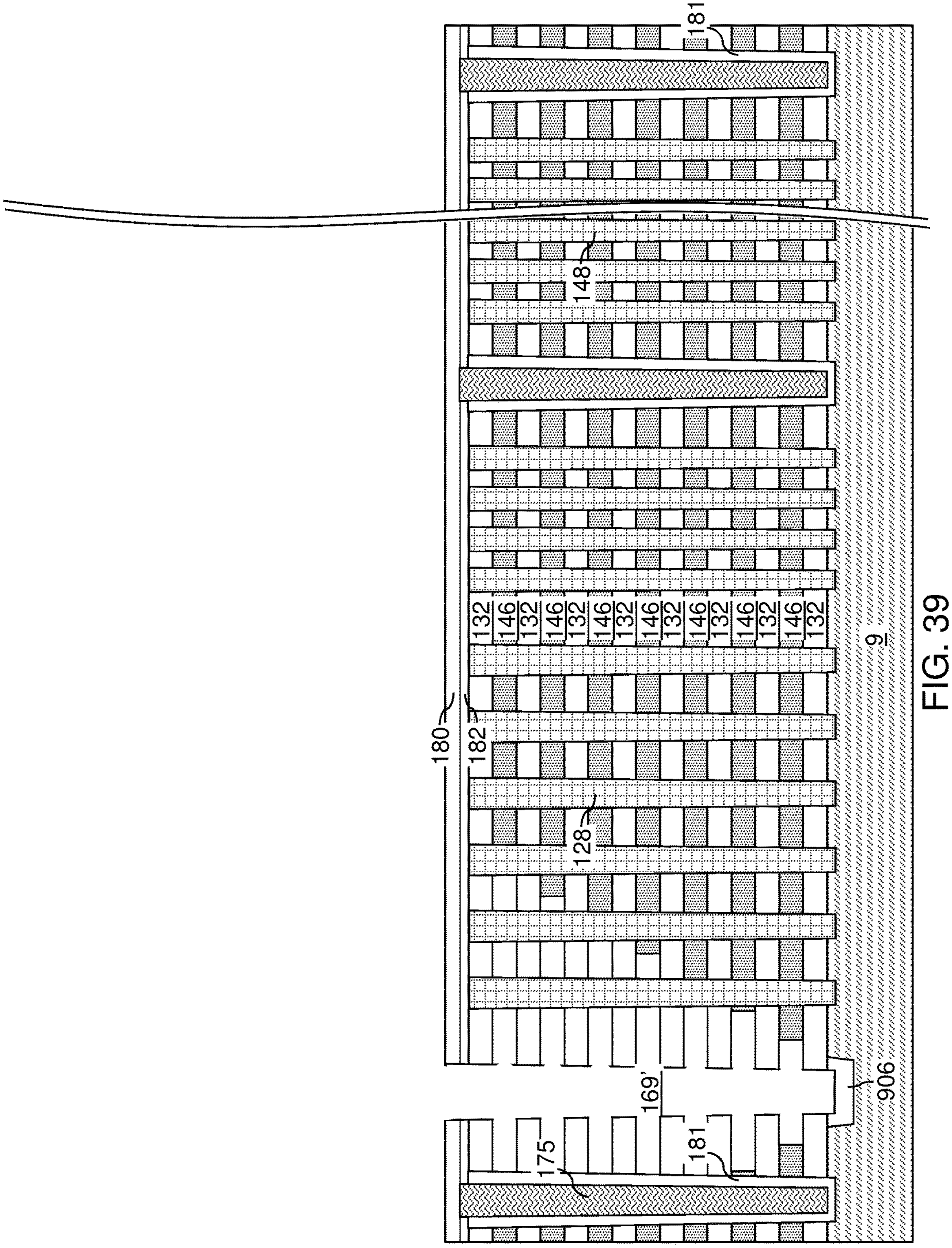
FIG. 39 is a vertical cross-sectional view of the second exemplary structure after performing a last isotropic etch step according to the second embodiment of the present disclosure.

Referring to FIG. 39, the unit processing sequence can be repeated until the first access trench fill structures 163 are vertically recessed below the bottommost first sacrificial material layers 142 and the bottommost first sacrificial material layers 142 are laterally recessed. The entirety of the first access trench fill structures 163 can be removed after the last vertical recessing of the first access trench fill structures 163. In one embodiment, the total number of repetitions of the unit processing sequence may be the same as the total number of the first sacrificial material layers 142. The duration of each vertical recess etch step may be individually selected so that one more first sacrificial material layer 142 is physically exposed after each vertical recess etch step.

Figure 40:
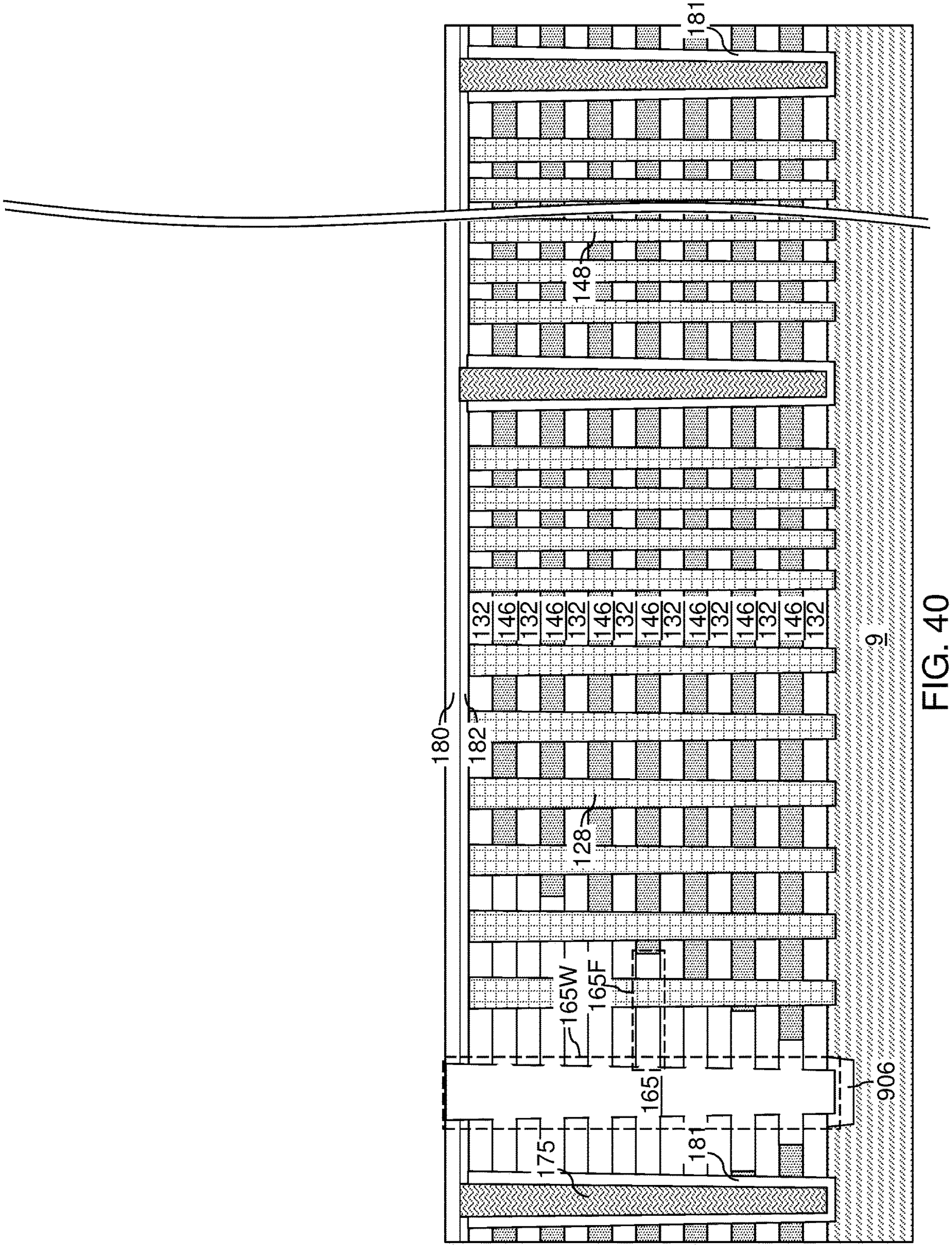
FIG. 40 is a vertical cross-sectional view of the second exemplary structure after formation of first-tier finned dielectric support structures in first-tier finned access cavities according to the second embodiment of the present disclosure.

Referring to FIG. 40, a first dielectric fill material such as silicon oxide can be formed in the first finned access cavities 169' and over the inter-tier dielectric layer 180 by a conformal deposition process such as a low pressure chemical vapor deposition process. A horizontally-extending portion of the first dielectric fill material can be removed from above the horizontal plane including the top surface of the inter-tier dielectric layer 180 by a recess etch process. Each remaining portion of the first dielectric fill material that fills a respective first finned access cavity 169' constitutes a first finned dielectric support structure 165.

In one embodiment, each first finned dielectric support structure 165 comprises a first dielectric wall portion 165W that continuous vertically extends from the substrate 9 to a horizontal plane including top surfaces of the inter-tier dielectric layer 180, and first dielectric fin structures 165F that are located at levels of the first sacrificial material layers 142 and laterally protrudes outward from the first dielectric wall portion 165W. In one embodiment, a plurality of the first dielectric fin structures 165F within each first finned dielectric support structure 165 comprises a respective first sidewall that is formed directly on a sidewall of a respective one of the first sacrificial material layers 142, and a respective second sidewall that is formed on a surface segment of the first backside trench dielectric liner 181.

In one embodiment, the first dielectric fin structures 165F have different lateral extents along a first horizontal direction hd1 that increase with a vertical distance from a top surface of the substrate 9, and each of the first dielectric fin structures 165F comprises a respective horizontal top surface that contacts a horizontal bottom surface of a respective overlying first insulating layer 132 and a respective additional horizontal top surface that contacts a horizontal top surface of the respective underlying first insulating layer 132. In one embodiment, contact areas between each contacting pair of a respective first dielectric fin structure 165F and a respective overlying first insulating layer 132 increase with a vertical distance from a top surface of the substrate 9.

One and/or a plurality of the first dielectric fin structures 165F may contact and/or may laterally surround a respective subset of the first-tier sacrificial support opening fill portions 128. In one embodiment, a subset of the first dielectric fin structures 165F including a topmost first dielectric fin structure 165F comprises a respective set of at least one opening therethrough. Each opening in a first dielectric fin structure 165F laterally surrounds a respective support pillar structure 20. In one embodiment, a total number of openings within each of the first dielectric fin structures 165F increases with a vertical distance from a top surface of the substrate 9. In one embodiment, first-tier sacrificial support opening fill portions 128 vertically extend through a subset of the openings through the first dielectric fin structures 165F.

In one embodiment, one, a plurality and/or each of the first finned dielectric support structures 165 contacts lengthwise sidewalls of a pair of first elongated portions of the first-tier backside trench 179, and contact a widthwise sidewall of a second elongated portion of the first-tier backside trench 179. In one embodiment, the first dielectric wall portion 165W comprises a pair of lengthwise sidewall segments that laterally extend along the second horizontal direction hd2 at each level of the first insulating layers 132 and contact a sidewall of a respective one of the first insulating layers 132.

Figure 41:
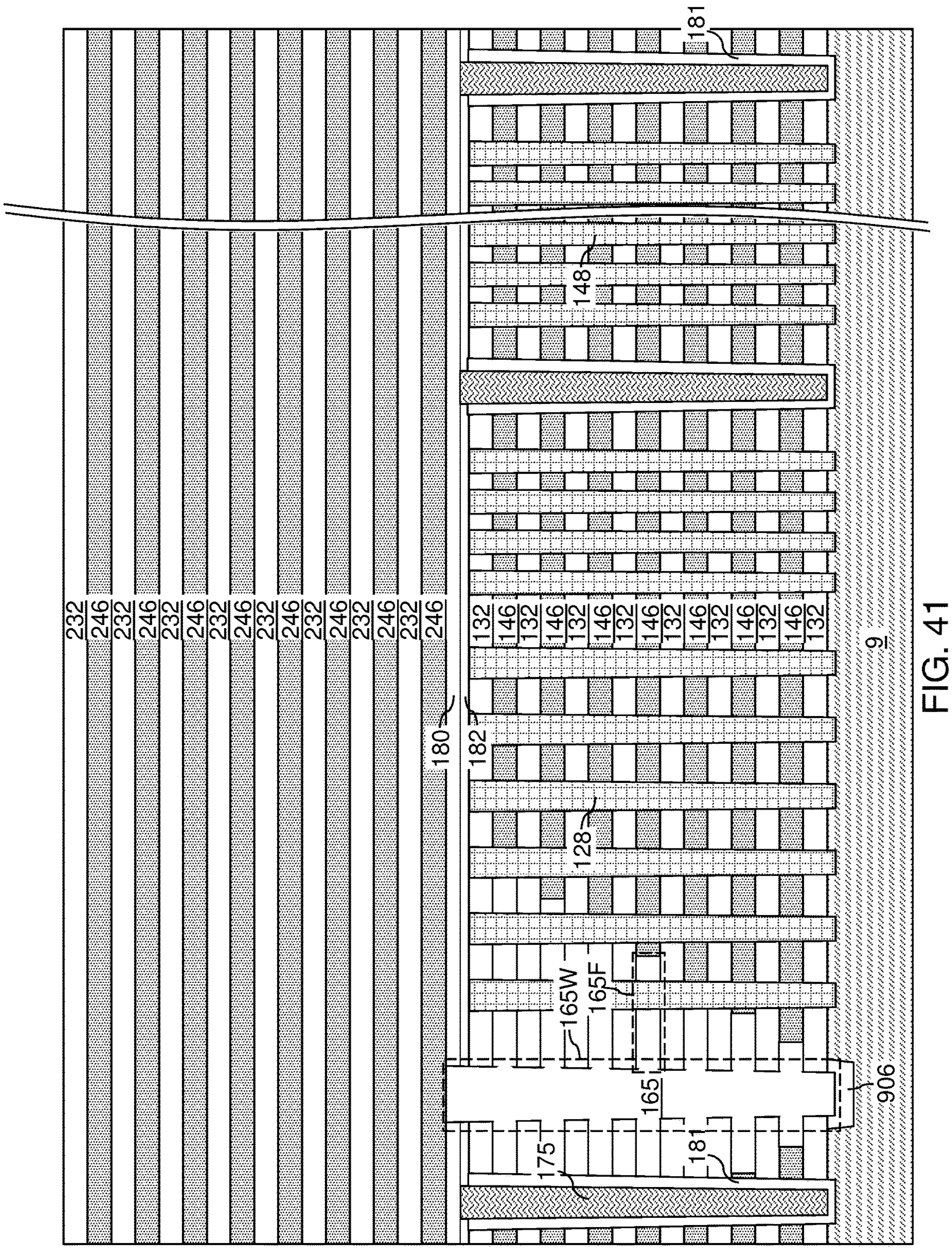
FIG. 41 is a vertical cross-sectional view of the second exemplary structure after formation of a second alternating stack of second insulating layers and second sacrificial material layers according to the second embodiment of the present disclosure.

Referring to FIG. 41, the processing steps described with reference to FIG. 4 can be performed to form a second alternating stack (232, 242) of second insulating layers 232 and second sacrificial material layers 242 over a first-tier structure.

Figure 42A:
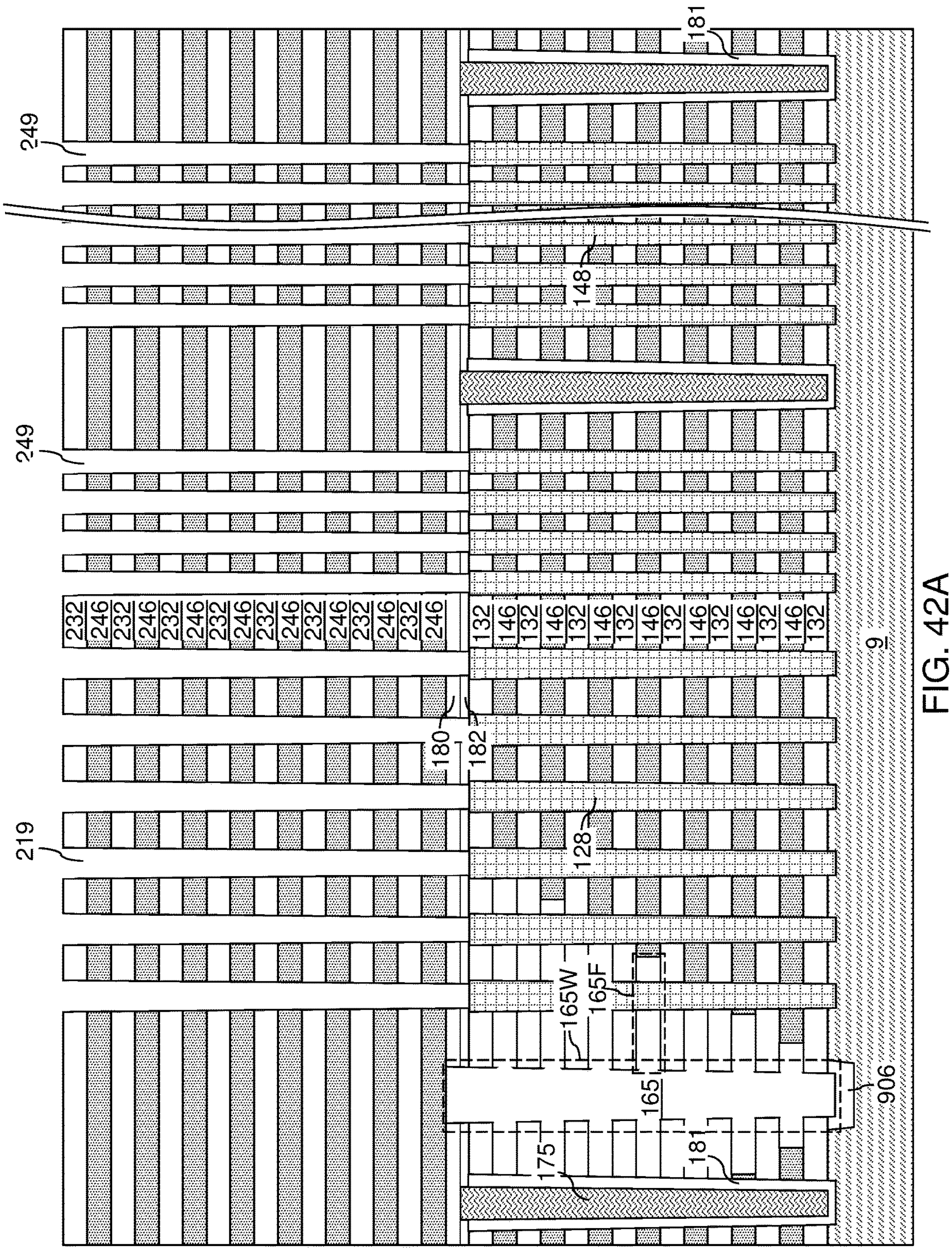
FIG. 42A is a vertical cross-sectional view of the second exemplary structure after formation of second-tier memory openings and second-tier support openings according to the second embodiment of the present disclosure.
Figure 42B:
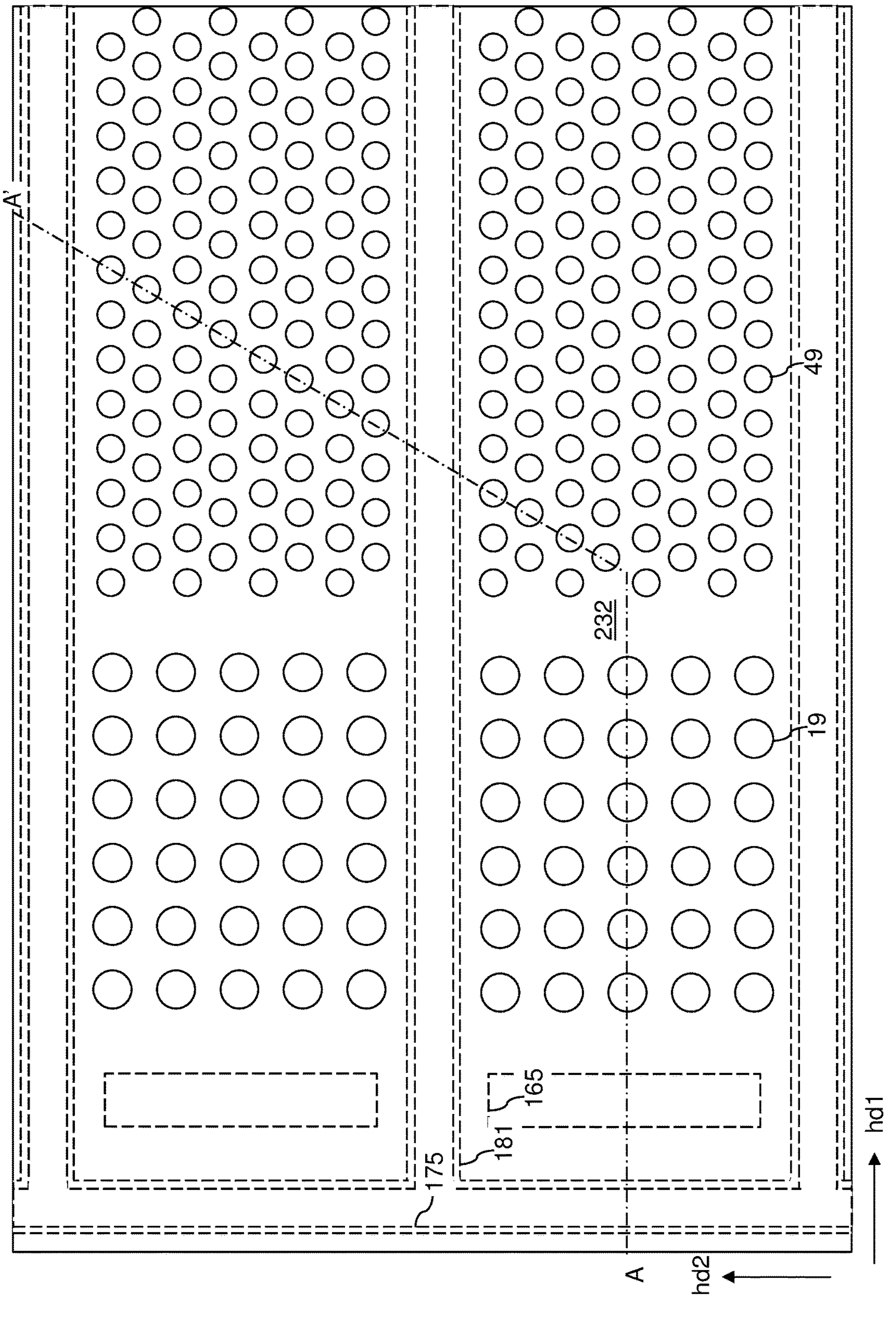
FIG. 42B is a top-down view of the second exemplary structure of FIG. 42A. The vertical plane A-A' is the cut plane of the vertical cross-sectional view of FIG. 42A.

Referring to FIGS. 42A and 42B, the processing steps described with reference to FIG. 5 can be performed to form second-tier memory openings 249 and second-tier support openings 219.

Figure 43:
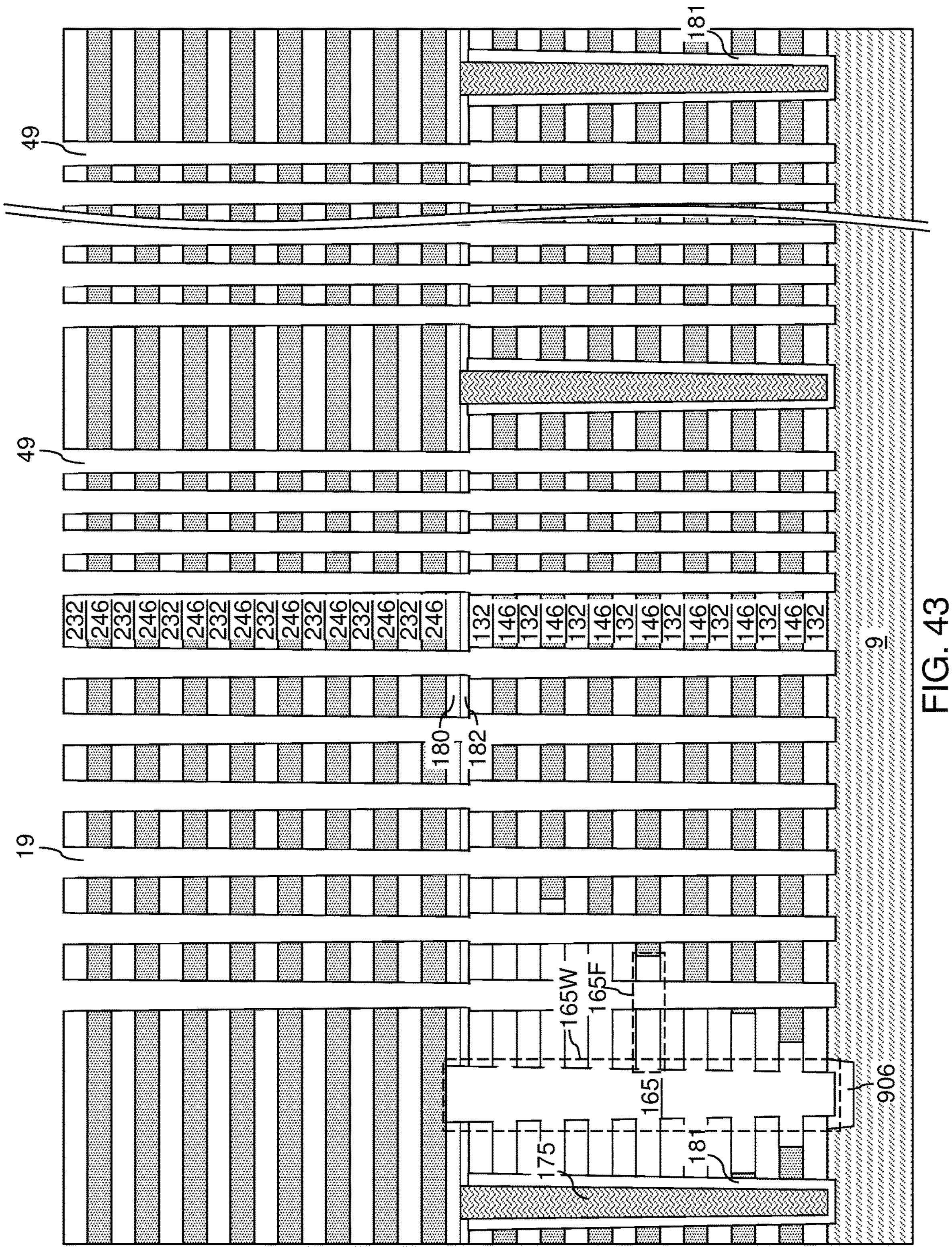
FIG. 43 is a vertical cross-sectional view of the second exemplary structure after formation of inter-tier memory openings and inter-tier support openings according to the second embodiment of the present disclosure.

Referring to FIG. 43, the processing steps described with reference to FIG. 6 can be performed to form inter-tier memory openings 49 and inter-tier support openings 19.

Figure 44A:
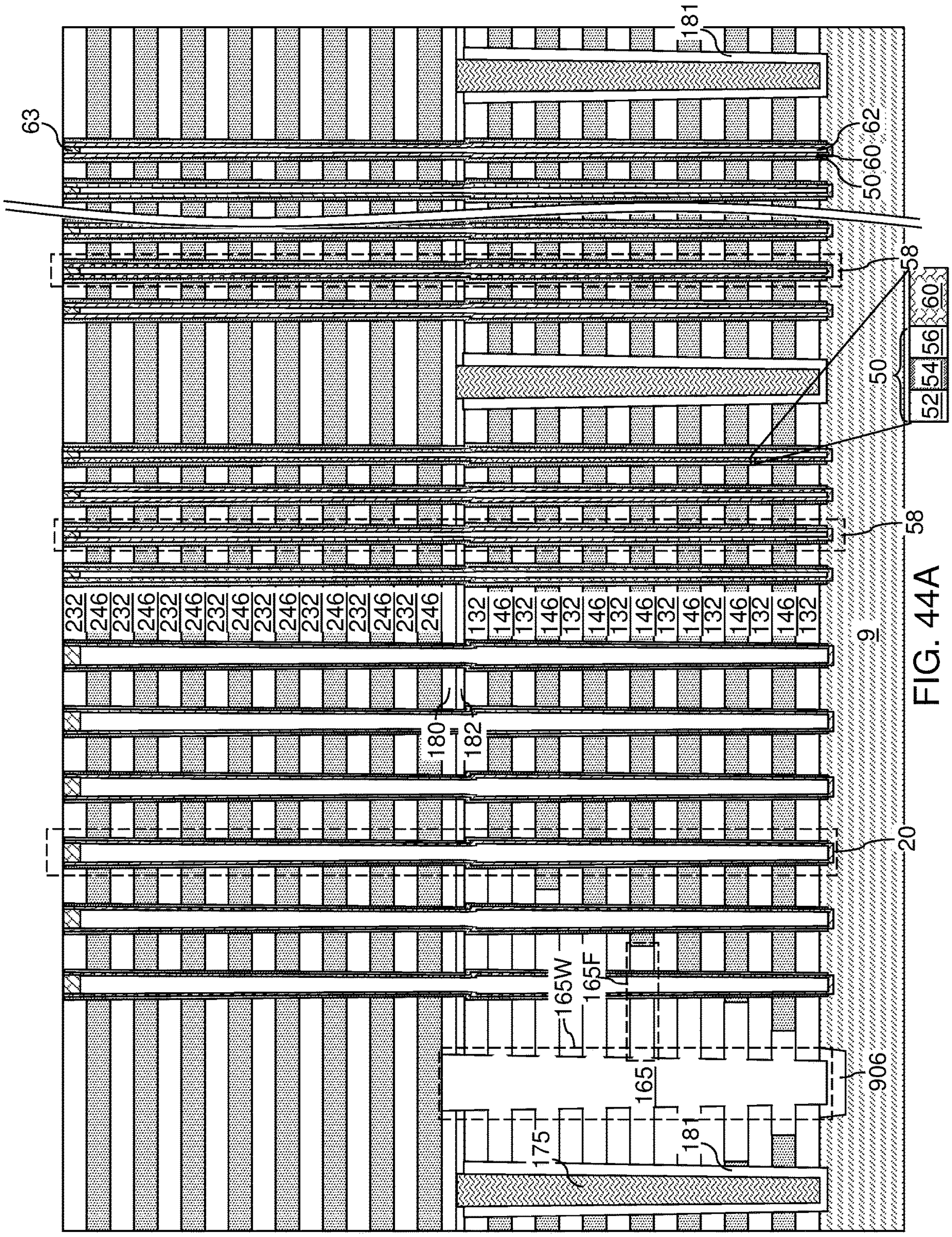
FIG. 44A is a vertical cross-sectional view of the second exemplary structure after formation of memory opening fill structures and support pillar structures according to the second embodiment of the present disclosure.
Figure 44B:
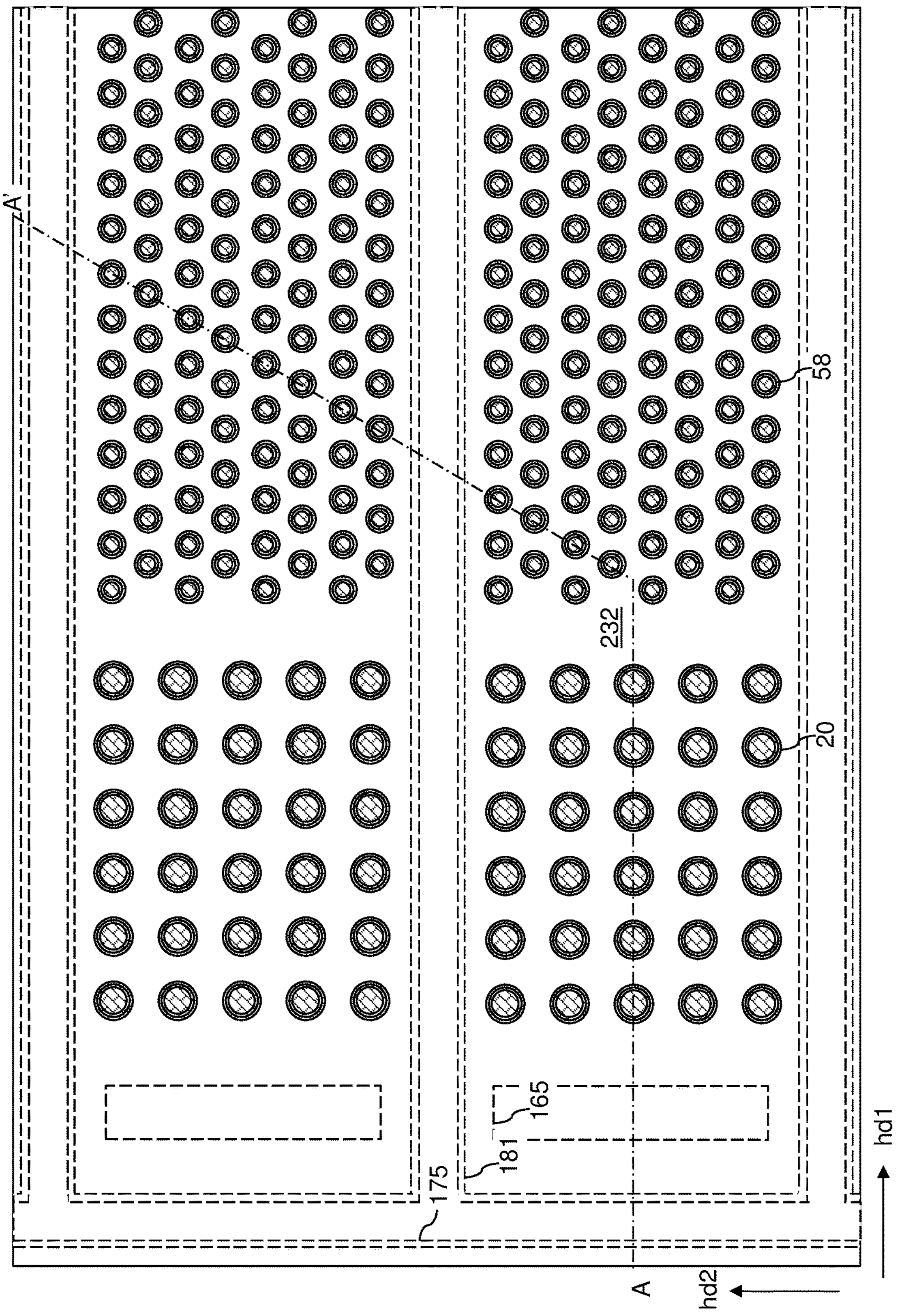
FIG. 44B is a top-down view of the second exemplary structure of FIG. 44A. The vertical plane A-A' is the cut plane of the vertical cross-sectional view of FIG. 44A.

Referring to FIGS. 44A and 44B, the processing steps described with reference to FIGS. 7A and 7B can be performed to form memory opening fill structures 58 and support pillar structures 20 in the inter-tier memory openings 49 and in the inter-tier support openings 19, respectively.

Figure 45A:
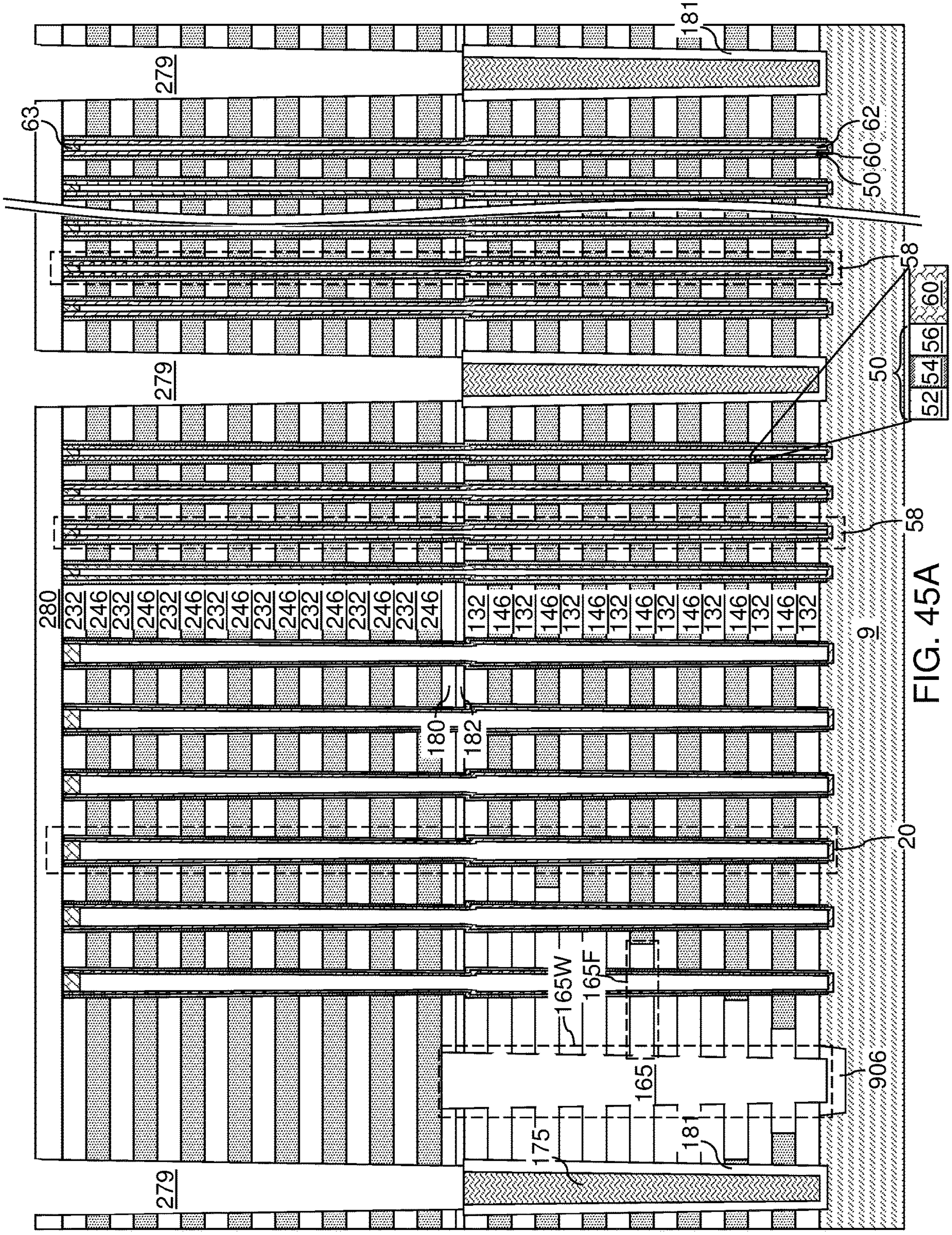
FIG. 45A is a vertical cross-sectional view of the second exemplary structure after formation of a contact-level dielectric layer and second-tier backside trench according to the second embodiment of the present disclosure.
Figure 45B:
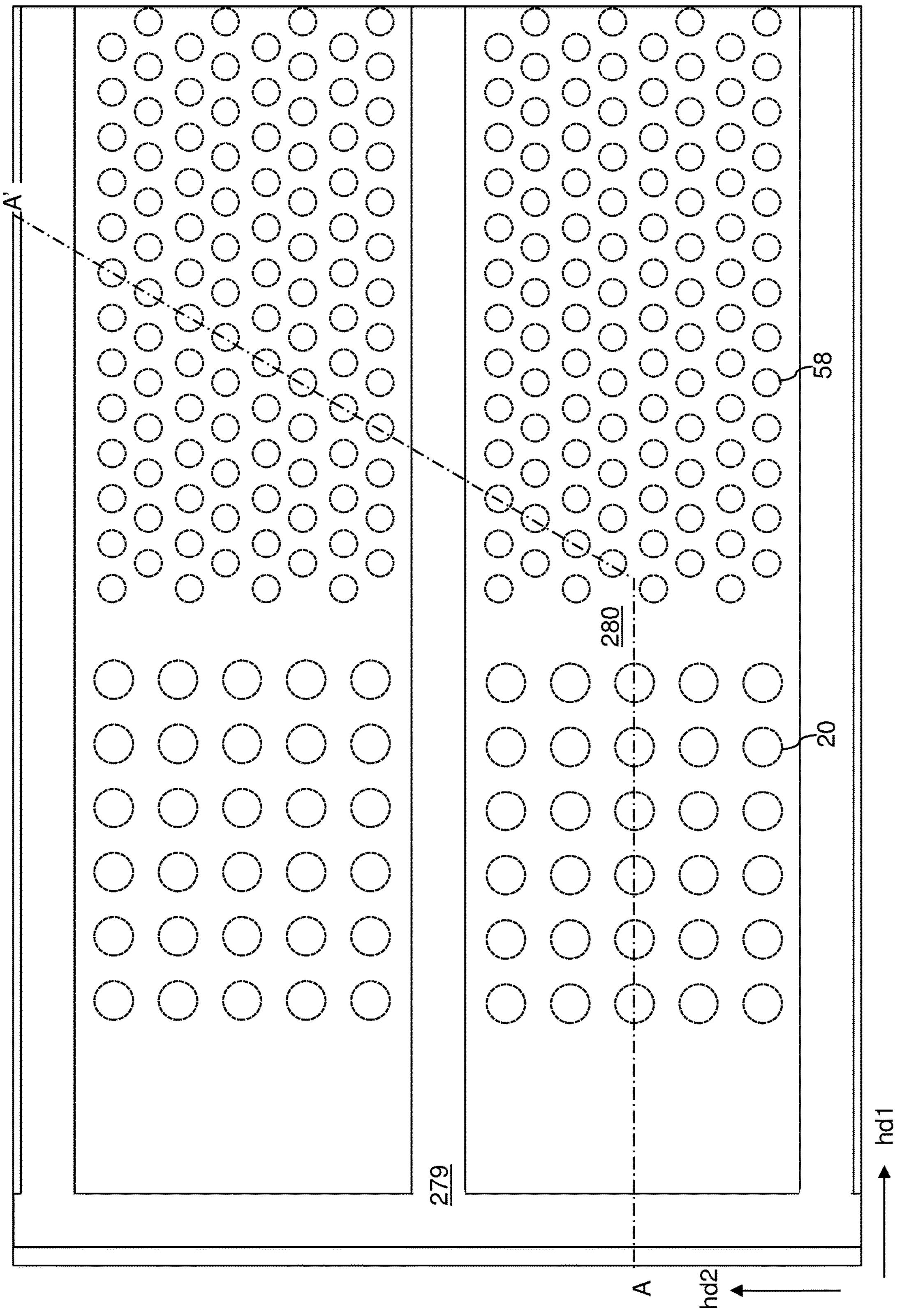
FIG. 45B is a top-down view of the second exemplary structure of FIG. 45A. The vertical plane A-A' is the cut plane of the vertical cross-sectional view of FIG. 45A.

Referring to FIGS. 45A and 45B, a contact-level dielectric layer 280 can be formed over the second-tier alternating stack (232, 242). The contact-level dielectric layer 280 includes a dielectric material such as silicon oxide, and can be formed by a conformal or non-conformal deposition process. For example, the contact-level dielectric layer 280 can include undoped silicate glass and can have a thickness in a range from 100 nm to 600 nm, although lesser and greater thicknesses can also be employed.

A photoresist layer (not shown) can be applied over the contact-level dielectric layer 280 and can be lithographically patterned to form a continuous opening including a set of interconnected opening segments. The pattern of the openings in the photoresist layer may be the same as the pattern of the first-tier backside trench 179 as formed at the processing steps of FIGS. 28A and 28B.

An anisotropic etch process can be performed to transfer the pattern of the opening in the photoresist layer though the contact-level dielectric layer 280, the second alternating stack (232, 242), the inter-tier dielectric layer 180, and the first planar dielectric liner 182. Portions of the contact-level dielectric layer 280, the second alternating stack (232, 242), the inter-tier dielectric layer 180, and the first planar dielectric liner 182 that underlie the openings in the photoresist layer can be removed to form a second-tier backside trench 279. A vertically alternating sequence of second continuous insulating layers 232 and second continuous spacer material layers (such as the second sacrificial material layers 242) can be divided into second-tier alternating stacks (232, 242) of second insulating layers 232 and second spacer material layers (such as second sacrificial material layers 242) by forming a second-tier backside trench 279. A top surface of the first-tier sacrificial backside trench fill structure 175 can be physically exposed at the bottom of the second-tier backside trench 279.

In one embodiment, the second-tier backside trench 279 may comprise at least two second elongated portions that laterally extend along a first horizontal direction hd1, and at least one second elongated portion that laterally extends along a second horizontal direction hd2 that is different from the first horizontal direction hd1 and connecting a respective neighboring pair of second elongated portions of the second-tier backside trench 279. In one embodiment, each of the at least two second elongated portions of the second-tier backside trench 279 may laterally extend along the first horizontal direction hd1 with a respective uniform width along the second horizontal direction hd2. In one embodiment, the at least two second elongated portions of the second-tier backside trench 279 may comprise three or more second elongated portions that are repeated with a periodicity along the second horizontal direction hd2. In one embodiment, lengthwise sidewalls of each of the second insulating layers 232 and each of the second sacrificial material layers 242 can be exposed to the at least two second elongated portions of the second-tier backside trench 279 upon formation of the second-tier backside trench 279. In one embodiment, the second-tier backside trench 279 may be formed as a single continuous volume in which the at least two second elongated portions and the at least one second elongated portion are interconnected among one another. In one embodiment, the second elongated portions of the second-tier backside trench 279 can be formed between clusters of memory opening fill structures 58. The clusters of the memory opening fill structures 58 can be laterally spaced apart along the second horizontal direction hd2 by the second elongated portions of the second-tier backside trench 279.

Figure 46:
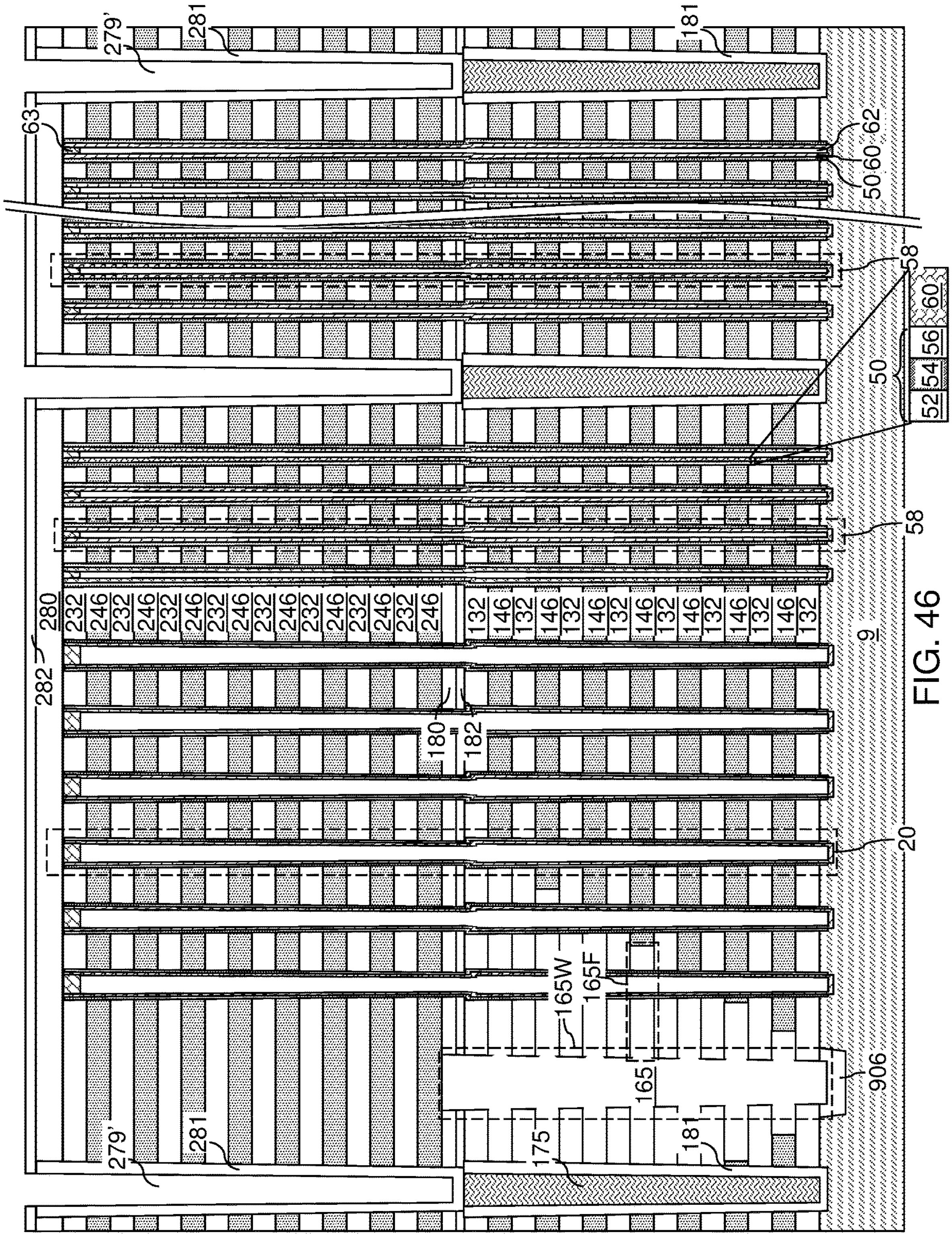
FIG. 46 is a vertical cross-sectional view of the second exemplary structure after formation of a second continuous dielectric liner layer according to the second embodiment of the present disclosure.

Referring to FIG. 46, a second continuous dielectric liner layer (281, 282) can be formed by a conformal deposition process in the second-tier backside trench 279 and over the second-tier alternating stack (232, 242). The second continuous dielectric liner layer (281, 82) comprises a second backside trench dielectric liner 281 that is formed on sidewalls and a bottom surface of the second-tier backside trench 279 and a second planar dielectric liner 282 that is formed over the second-tier alternating stack (232, 242). A backside cavity 279' can be present in a volume of the second-tier backside trench 279 that is not filled with the second continuous dielectric liner layer (281, 282). The second continuous dielectric liner layer (281, 282) comprises a dielectric material such as silicon oxide. The thickness of the second continuous dielectric liner layer (281, 282) may be in a range from 3 nm to 60 nm, such as from 60 nm to 30 nm, although lesser and greater thicknesses may also be employed.

Figure 47:
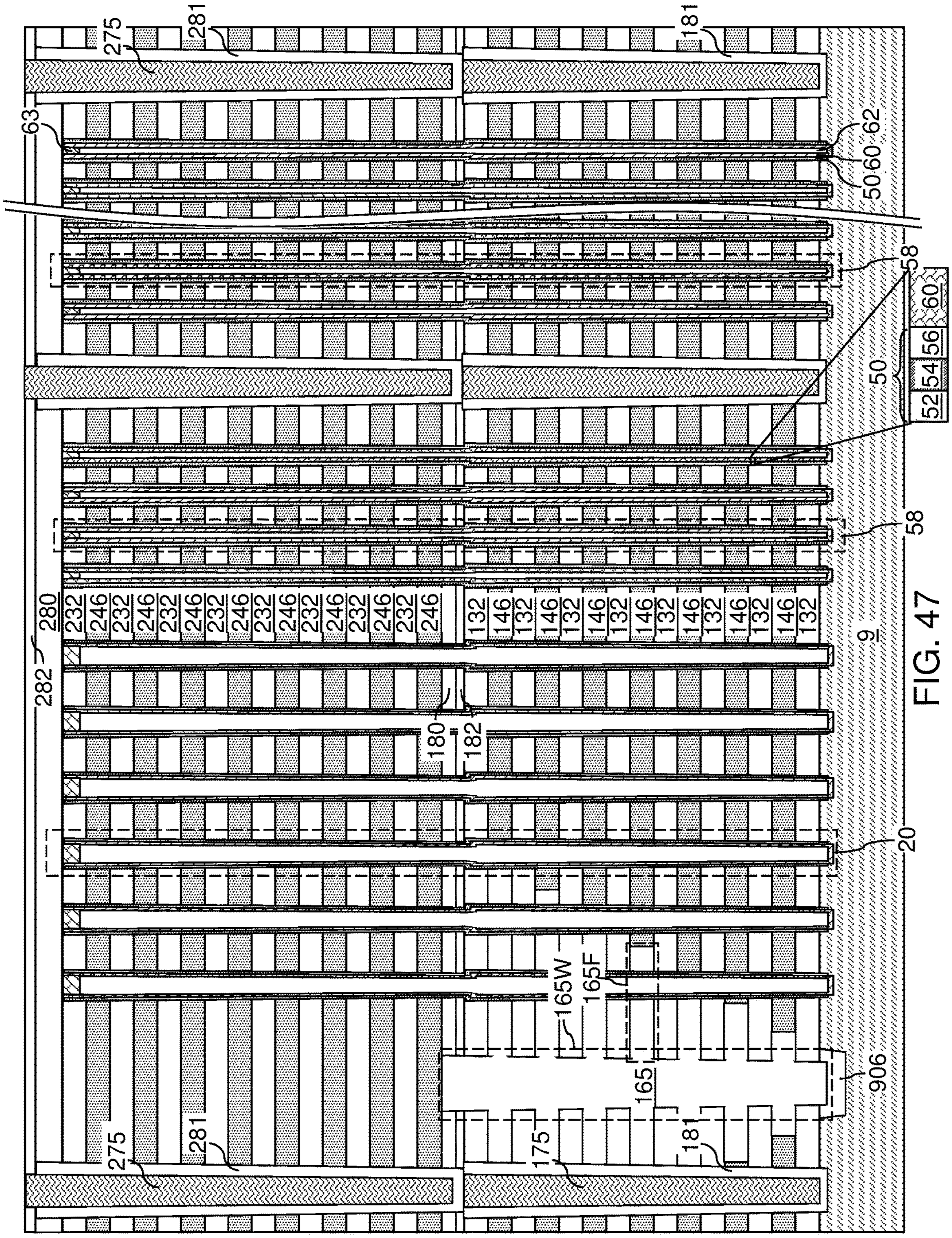
FIG. 47 is a vertical cross-sectional view of the second exemplary structure after formation of a sacrificial backside trench fill structure according to the second embodiment of the present disclosure.

Referring to FIG. 47, a second sacrificial trench fill material can be deposited in the backside cavity 279' and over the continuous dielectric liner layer (281, 282) to form a second sacrificial trench fill material layer. The second sacrificial trench fill material layer fills the volume of the backside cavity 279'. The second sacrificial trench fill material layer comprises a second sacrificial trench fill material such as a semiconductor material. For example, the second sacrificial trench fill material layer may comprise amorphous silicon, polysilicon, and/or a silicon-germanium alloy. Alternative sacrificial trench fill materials such as organosilicate glass, a carbon-based fill material, or a polymer material may also be employed.

A planarization process, such as a recess etch process or a chemical mechanical polishing process, may be performed to remove horizontally-extending portions of the second sacrificial trench fill material layer from above the horizontal plane including the second planar dielectric liner 282. The remaining portion of the second sacrificial trench fill material layer constitutes a second-tier sacrificial backside trench fill structure 275, which may have at least two second elongated portions that laterally extend along the first horizontal direction hd1 and at least one second elongated portion that laterally extends along the second horizontal direction hd2.

Figure 48:
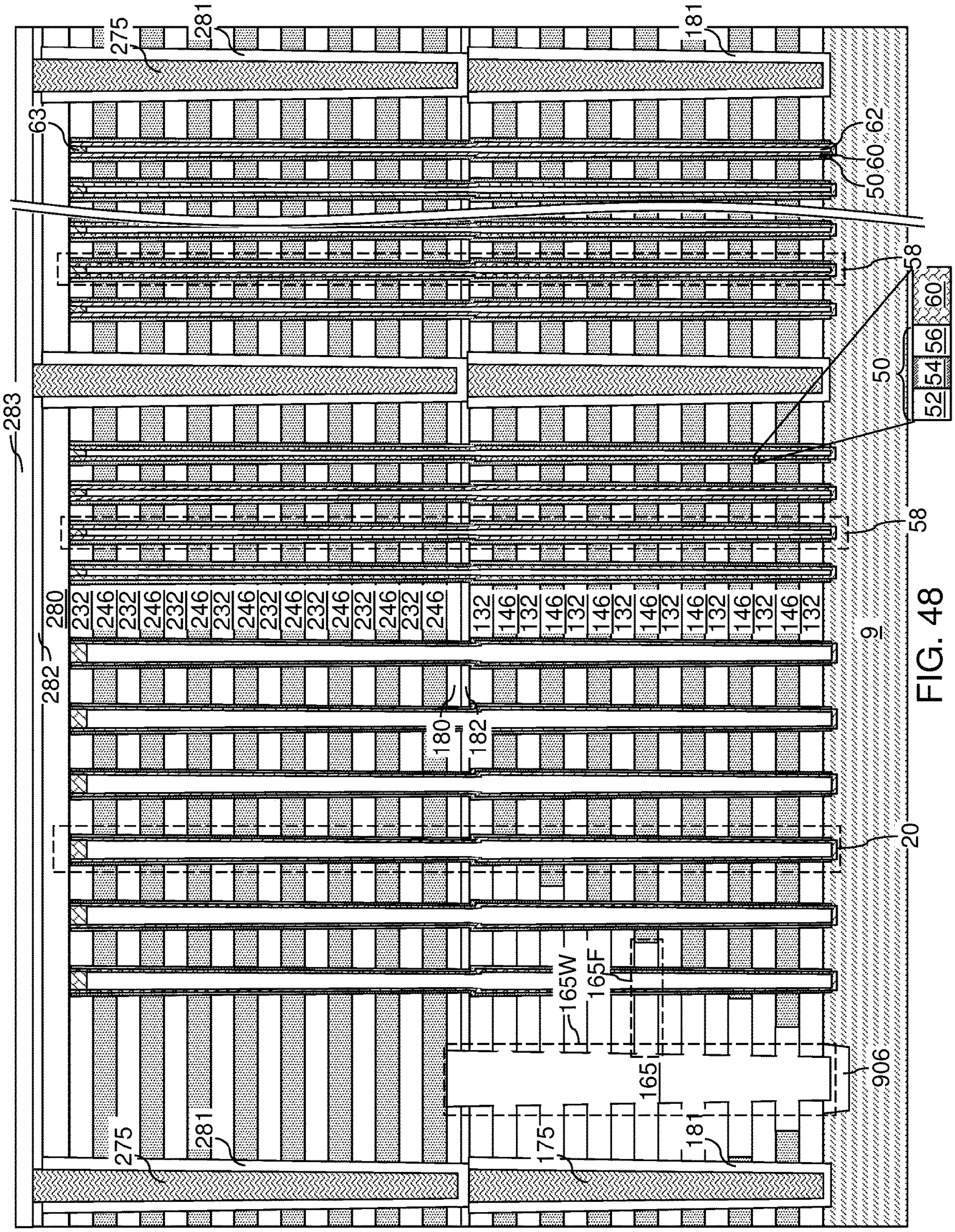
FIG. 48 is a vertical cross-sectional view of the second exemplary structure after formation of a sacrificial capping layer according to the second embodiment of the present disclosure.

Referring to FIG. 48, a sacrificial capping layer 283 can be formed above the second planar dielectric liner 282. The sacrificial capping layer 283 may comprise a dielectric material such as silicon oxide. The thickness of the sacrificial capping layer 283 may be in a range from 5 nm to 200 nm, such as from 20 nm to 50 nm, although lesser and greater thicknesses may also be employed.

Figure 49A:
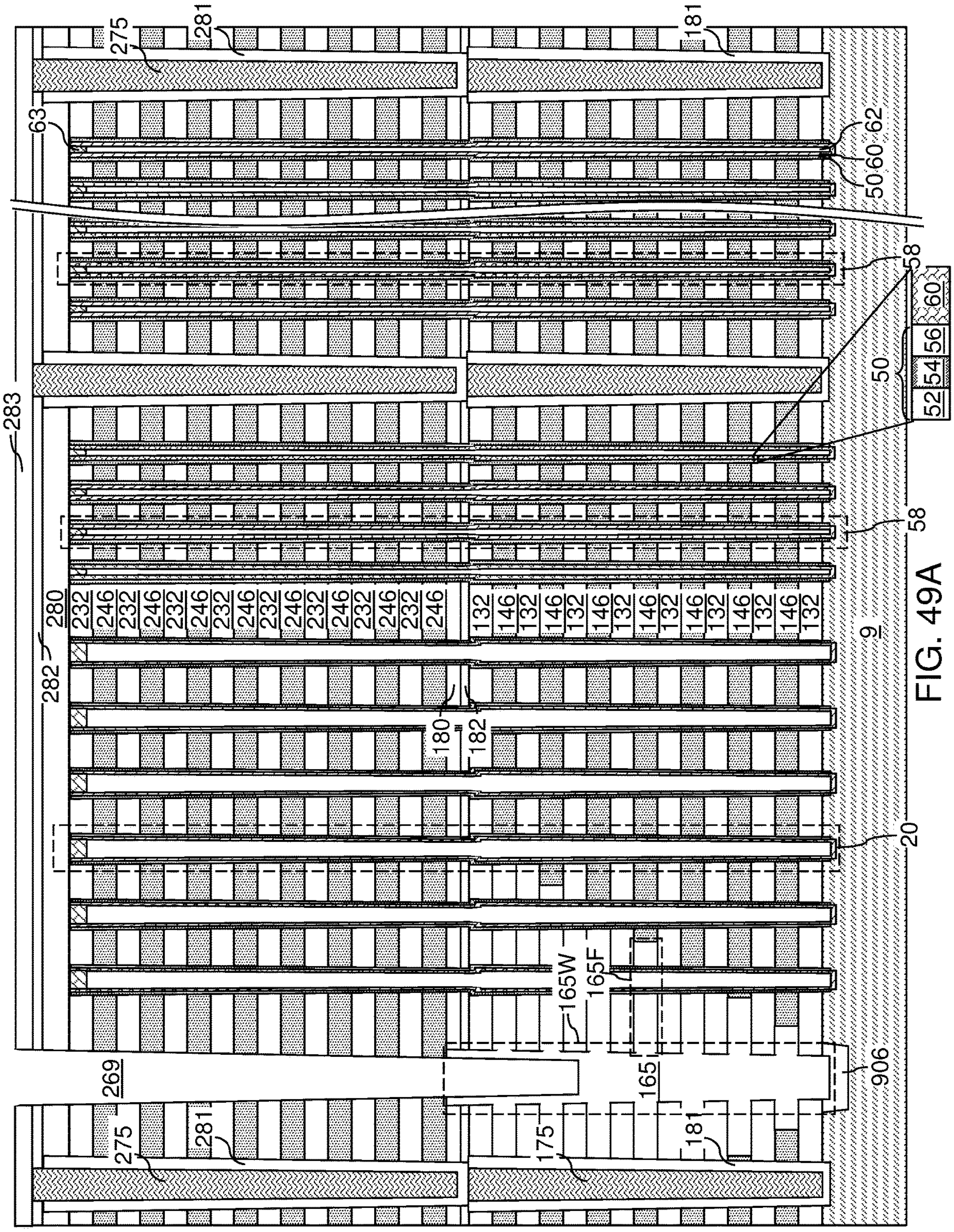
FIG. 49A is a vertical cross-sectional view of the second exemplary structure after formation of second-tier access trenches according to the second embodiment of the present disclosure.
Figure 49B:
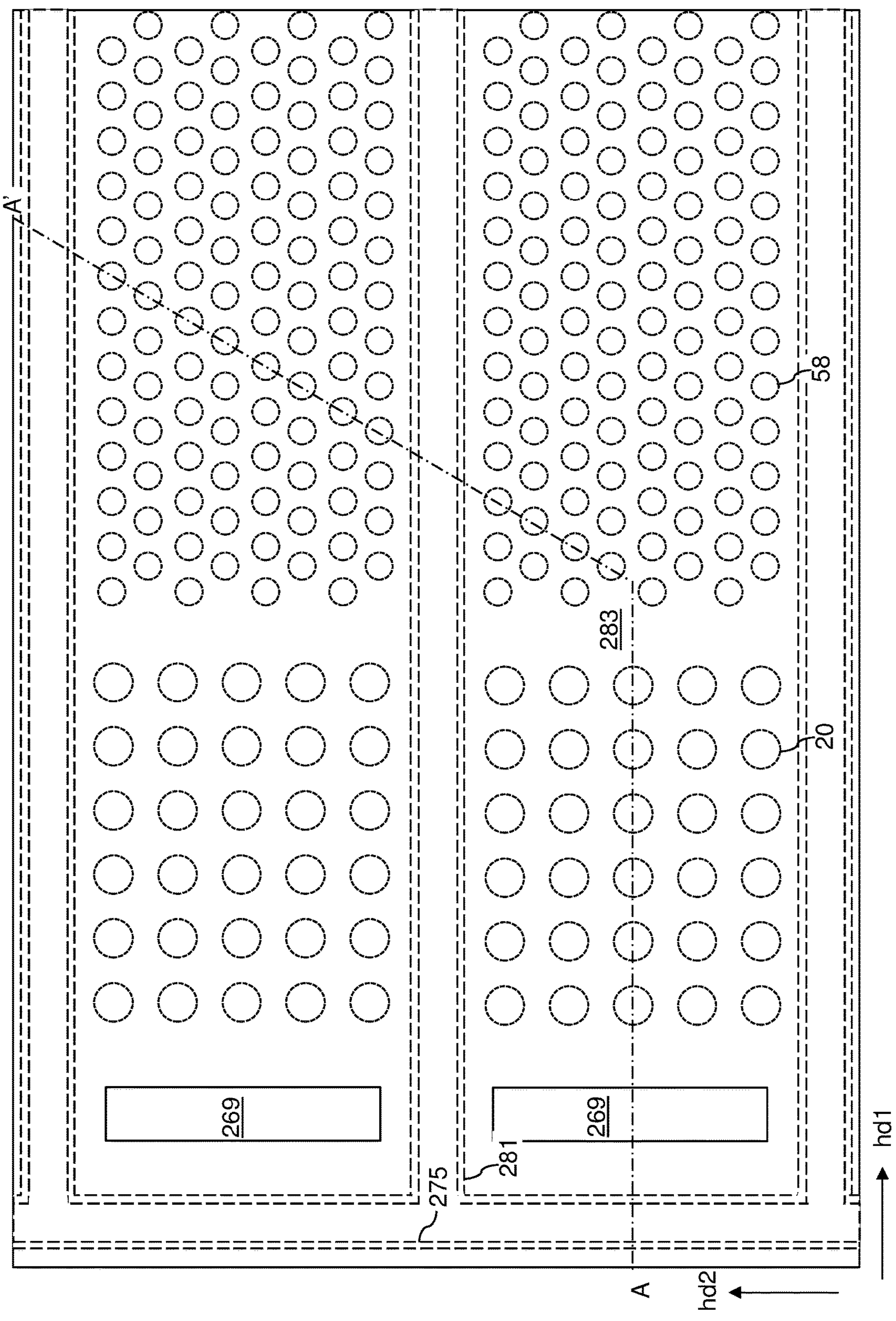
FIG. 49B is a top-down view of the second exemplary structure of FIG. 49A. The vertical plane A-A' is the cut plane of the vertical cross-sectional view of FIG. 49A.

Referring to FIGS. 49A and 49B, a photoresist layer (not shown) can be applied over the sacrificial capping layer 283, and can be lithographically patterned to form discrete openings over each of the second-tier alternating stacks (232, 242). In one embodiment, the openings in the photoresist layer may be formed in areas that are proximal to, and laterally spaced from, the at least one second elongated portion of the second-tier backside trench 279.

An anisotropic etch process can be performed to etch through unmasked portions of the second-tier alternating stacks (232, 242). Second access trenches 269 are formed underneath the openings in the photoresist layer. The second access trenches 269 can vertically extend through each layer within a respective second-tier alternating stack (232, 242), and a top surface a respective first finned dielectric support structure 165 can be physically exposed underneath each second access trench 269. In one embodiment, one, a plurality and/or each of the second access trenches 269 may protrude into an upper portion of a respective underlying first finned dielectric support structure 165. In one embodiment, all sidewalls of each second access trench 269 may be laterally spaced from the second-tier backside trench 279 by a respective portion of the second alternating stack (232, 242). In one embodiment, the second access trenches 269 may be laterally elongated along the second horizontal direction hd2 with a respective uniform width along the first horizontal direction hd1. Each second access trench 269 may be formed within a respective area that is free of any support pillar structure 20 and is free of any memory opening fill structure 58. In one embodiment, one, a plurality, or each, of the second access trenches 269 may have a respective rectangular horizontal cross-sectional area. The photoresist layer can be subsequently removed, for example, by ashing.

Figure 50:
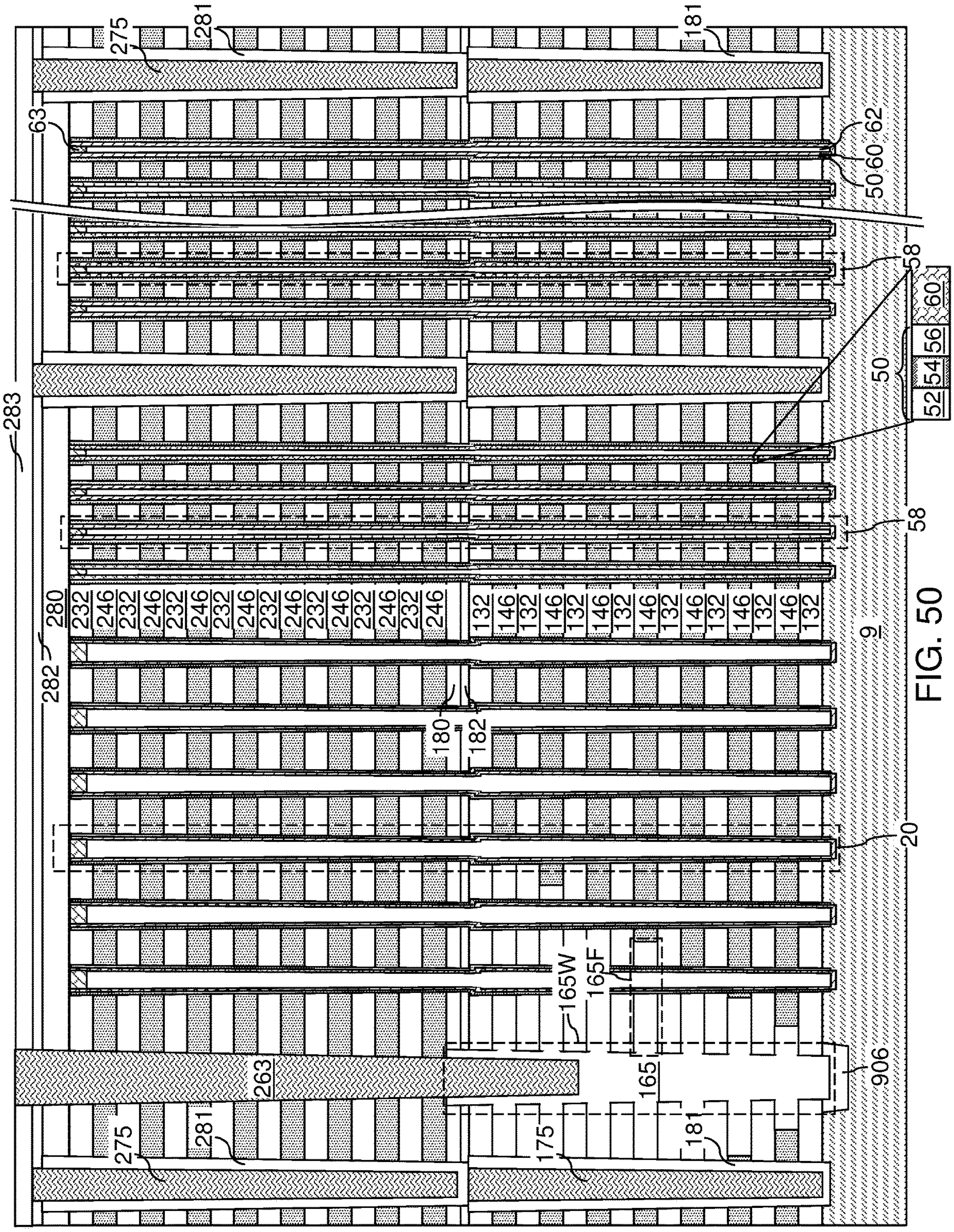
FIG. 50 is a vertical cross-sectional view of the second exemplary structure after formation of second access trench fill structures according to the second embodiment of the present disclosure.

Referring to FIG. 50, a second access trench fill material can be deposited in the second access trenches 69 and over the sacrificial capping layer 283. The access trench fill material is a sacrificial fill material. Portions of the access trench fill material that overlie the horizontal plane including the top surface of the sacrificial capping layer 283 can be removed by performing a planarization process such as a recess etch process and/or a chemical mechanical polishing process. Each remaining portion of the second access trench fill material that fills a respective second access trench 269 constitutes a second access trench fill structure 263. The second access trench fill structure 263 may comprise a semiconductor material, such as amorphous silicon.

Figure 51:
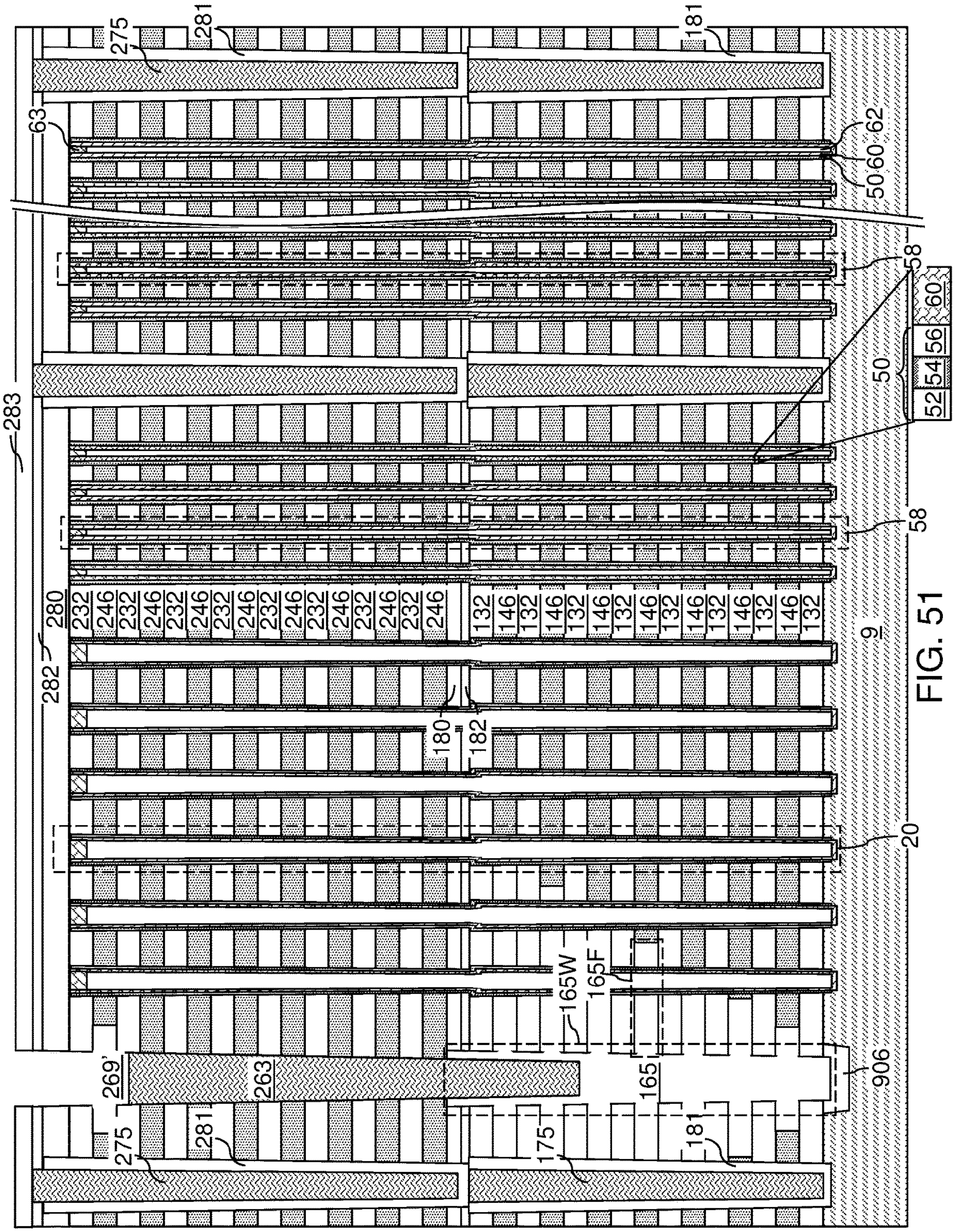
FIG. 51 is a vertical cross-sectional view of the second exemplary structure after performing a first vertical recess etch step and a first isotropic etch step according to the second embodiment of the present disclosure.

Referring to FIG. 51, a second vertical recess etch step may be performed to vertically recess the top surfaces of the second access trench fill structures 263 to a height below the horizontal plane including the bottom surfaces of the topmost second sacrificial material layers 242 and above the horizontal plane including the top surfaces of the second-from-the-top second sacrificial material layers 242. The second vertical recess etch step may comprises a dry etch step or a wet etch step that etches the material of the second access trench fill structures 263 selective to the materials of the second insulating layers 232 and the second sacrificial material layers 242. For example, if the second access trench fill structures 263 comprise a semiconductor material (e.g., amorphous silicon), then the second vertical recess etch step may comprise a wet etch process employing hot trimethyl-2 hydroxyethyl ammonium hydroxide ("hot TMY") or tetramethyl ammonium hydroxide (TMAH).

A second isotropic etch step can be performed to isotropically etch the material of the second sacrificial material layers 242 selective to the materials of the second insulating layers 232 and the second access trench fill structures 263. The topmost second sacrificial material layers 242 may be laterally recessed by the second isotropic etch step. For example, the second sacrificial material layers 242 may comprise silicon nitride, and the second isotropic etch step may comprise a wet etch process employing hot phosphoric acid or a mixture of dilute hydrofluoric acid and ethylene glycol. The lateral recess distance of the second isotropic etch step may be in a range from 50 nm to 500 nm, such as from 200 nm to 300 nm, although lesser and greater lateral recess distances may also be employed. A second finned access cavity 269' can be formed in each volume overlying a top surface of a second access trench fill structures 263. Each second finned access cavity 269' comprises a vertically-extending cavity portion that includes a volume formed by removal of a second access trench fill structure 263, and a fin cavity portion formed by removal of a portion of a topmost second sacrificial material layer 242.

Figure 52:
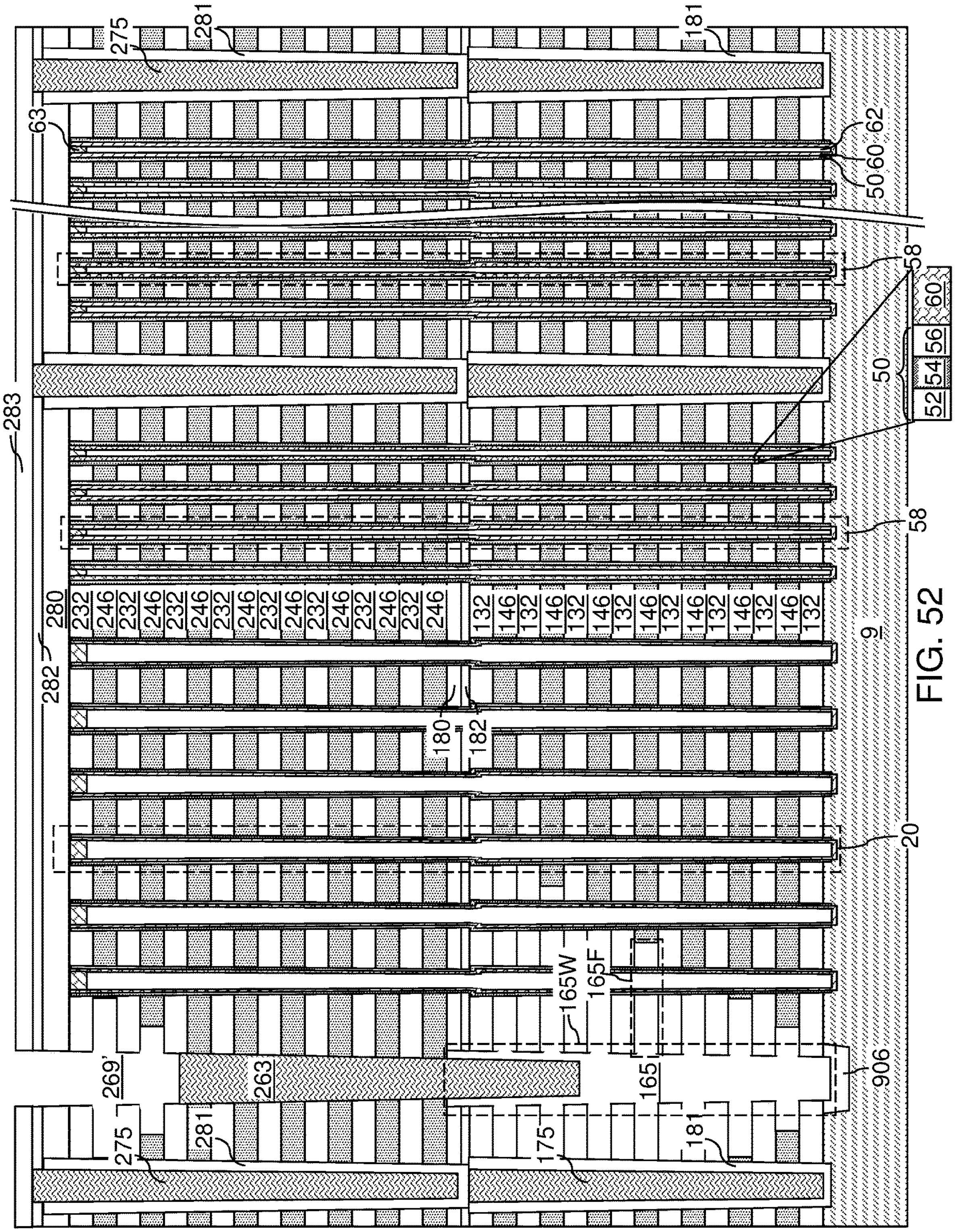
FIG. 52 is a vertical cross-sectional view of the second exemplary structure after performing a second vertical recess etch step and a second isotropic etch step according to the second embodiment of the present disclosure.

Referring to FIG. 52, a second vertical recess etch step may be performed to vertically recess the top surfaces of the second access trench fill structures 263 to a height below the horizontal plane including the bottom surfaces of the second-from-the-top second sacrificial material layers 242 and above the horizontal plane including the top surfaces of the third-from-the-top second sacrificial material layers 242. The second vertical recess etch step may comprises a dry etch step or a wet etch step that etches the material of the second access trench fill structures 263 selective to the materials of the second insulating layers 232 and the second sacrificial material layers 242. For example, if the second access trench fill structures 263 comprise amorphous silicon, then the second vertical recess etch step may comprise a wet etch process employing hot trimethyl-2 hydroxyethyl ammonium hydroxide ("hot TMY") or tetramethyl ammonium hydroxide (TMAH).

A second isotropic etch step can be performed to isotropically etch the material of the second sacrificial material layers 242 selective to the materials of the second insulating layers 232 and the second access trench fill structures 263. For example, the second sacrificial material layers 242 may comprise silicon nitride, and the second isotropic etch step may comprise a wet etch process employing hot phosphoric acid or a mixture of dilute hydrofluoric acid and ethylene glycol. The topmost second sacrificial material layers 242 and the second-from-the-top second sacrificial material layers 242 may be laterally recessed by the second isotropic etch step. The lateral recess distance of the second isotropic etch step may be in a range from 50 nm to 500 nm, such as from 200 nm to 300 nm, although lesser and greater lateral recess distances may also be employed. Each second finned access cavity 269' can be laterally expanded. Each second finned access cavity 269' comprises a vertically-extending cavity portion that includes a volume formed by removal of a second access trench fill structure 263, and two fin cavity portion formed by removal of a portion of a topmost second sacrificial material layer 242.

Figure 53:
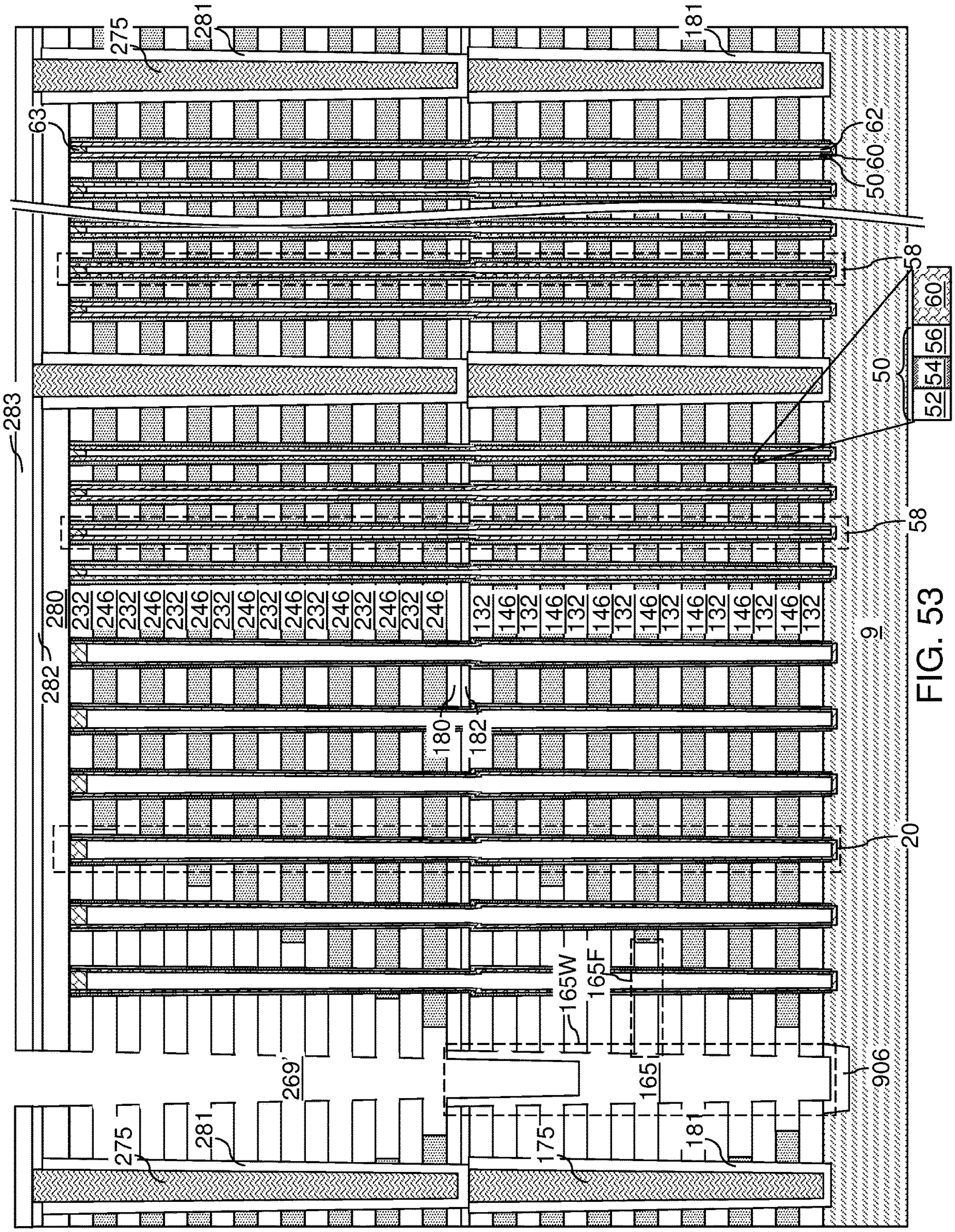
FIG. 53 is a vertical cross-sectional view of the second exemplary structure after performing a last isotropic etch step according to the second embodiment of the present disclosure.

Referring to FIG. 53, the set of processing steps described with reference to FIG. 51 or 52 can be repeated multiple times iteratively to vertically recess top surfaces of the second access trench fill structures 263 and to laterally recess physically exposed sidewalls of the second sacrificial material layers 242. Generally, multiple instances of a unit processing sequence can be iteratively performed. Each instance of the unit processing sequence comprises a vertical recess etch step (such as the second vertical recess etch step) that vertically recesses the second access trench fill structures 263 and an isotropic etch step (such as the second isotropic etch process) that isotropically recesses physically exposed portions of the second sacrificial material layers 242 around each second finned access cavity 269' that overlies a second access trench fill structure 263. The second finned access cavities 269' are expanded vertically and laterally by performing multiple instances of the unit processing sequence. In one embodiment, surface segments of sidewalls of the second continuous dielectric liner layer (281, 282) are physically exposed to one, a plurality or each of the second finned access cavities 269'.

The unit processing sequence can be repeated until the second access trench fill structures 263 are vertically recessed below the bottommost second sacrificial material layers 242 and the bottommost second sacrificial material layers 242 are laterally recessed. The entirety of the second access trench fill structures 263 can be removed after the last vertical recessing of the second access trench fill structures 263. In one embodiment, the total number of repetitions of the unit processing sequence may be the same as the total number of the second sacrificial material layers 242. The duration of each vertical recess etch step may be individually selected so that one more second sacrificial material layer 242 is physically exposed after each vertical recess etch step.

Figure 54:
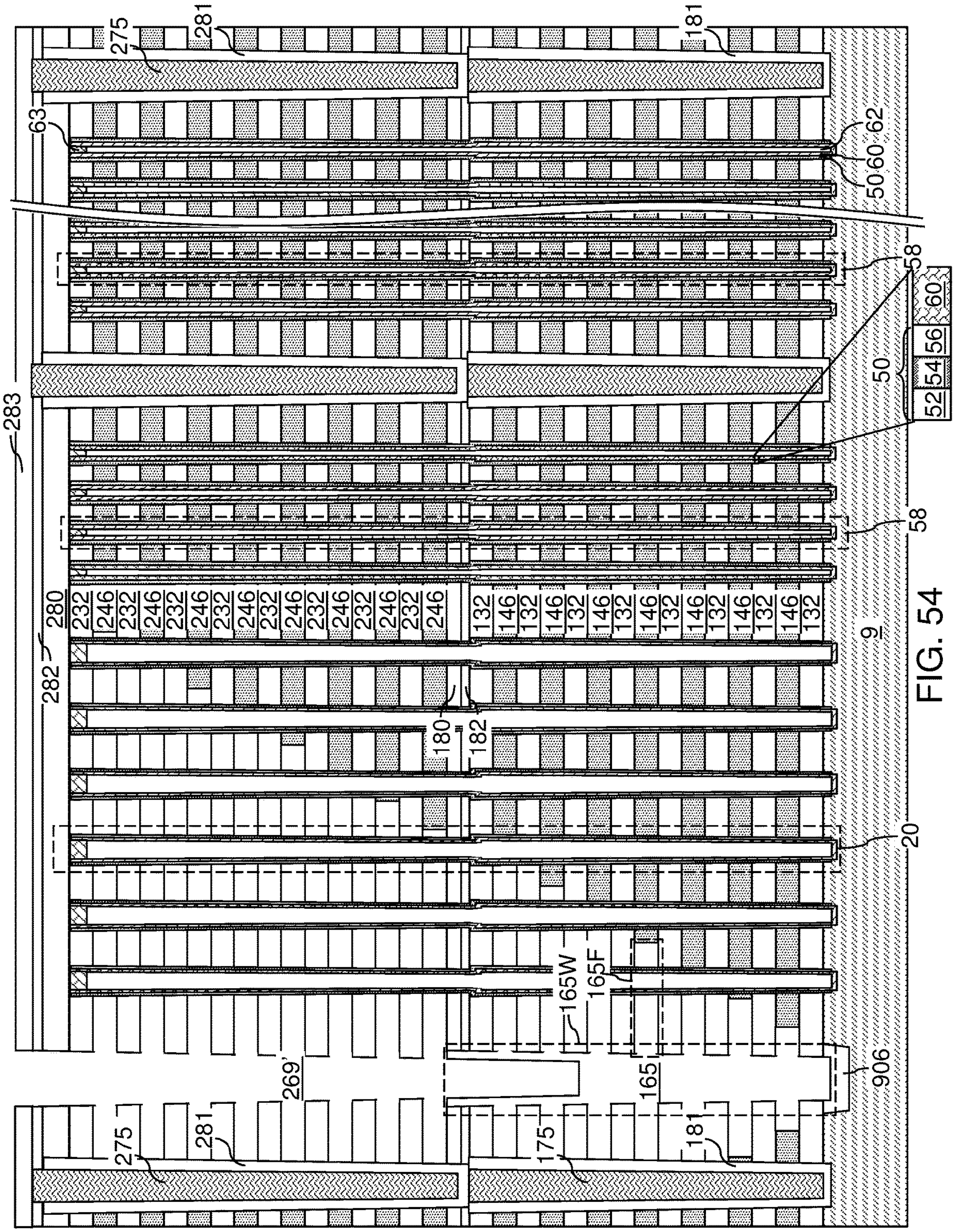
FIG. 54 is a vertical cross-sectional view of the second exemplary structure after performing an isotropic recess etch process according to the second embodiment of the present disclosure.

Referring to FIG. 54, an isotropic recess etch process can be performed to laterally recess physically exposed sidewalls of the second sacrificial material layers 242 further. In one embodiment, the duration of the isotropic recess etch process can be selected such that the lateral extent of the bottommost second sacrificial material layer 242 is greater than the lateral extent of the topmost second sacrificial material layer 242, and extent of the bottommost second sacrificial material layer 242 is less than the lateral extent of the topmost first sacrificial material layer 142. In an illustrative example, if the second sacrificial material layers 242 comprise silicon nitride, a wet etch process employing hot phosphoric acid can be employed to laterally recess the sidewalls of the second sacrificial material layers 242.

Figure 55A:
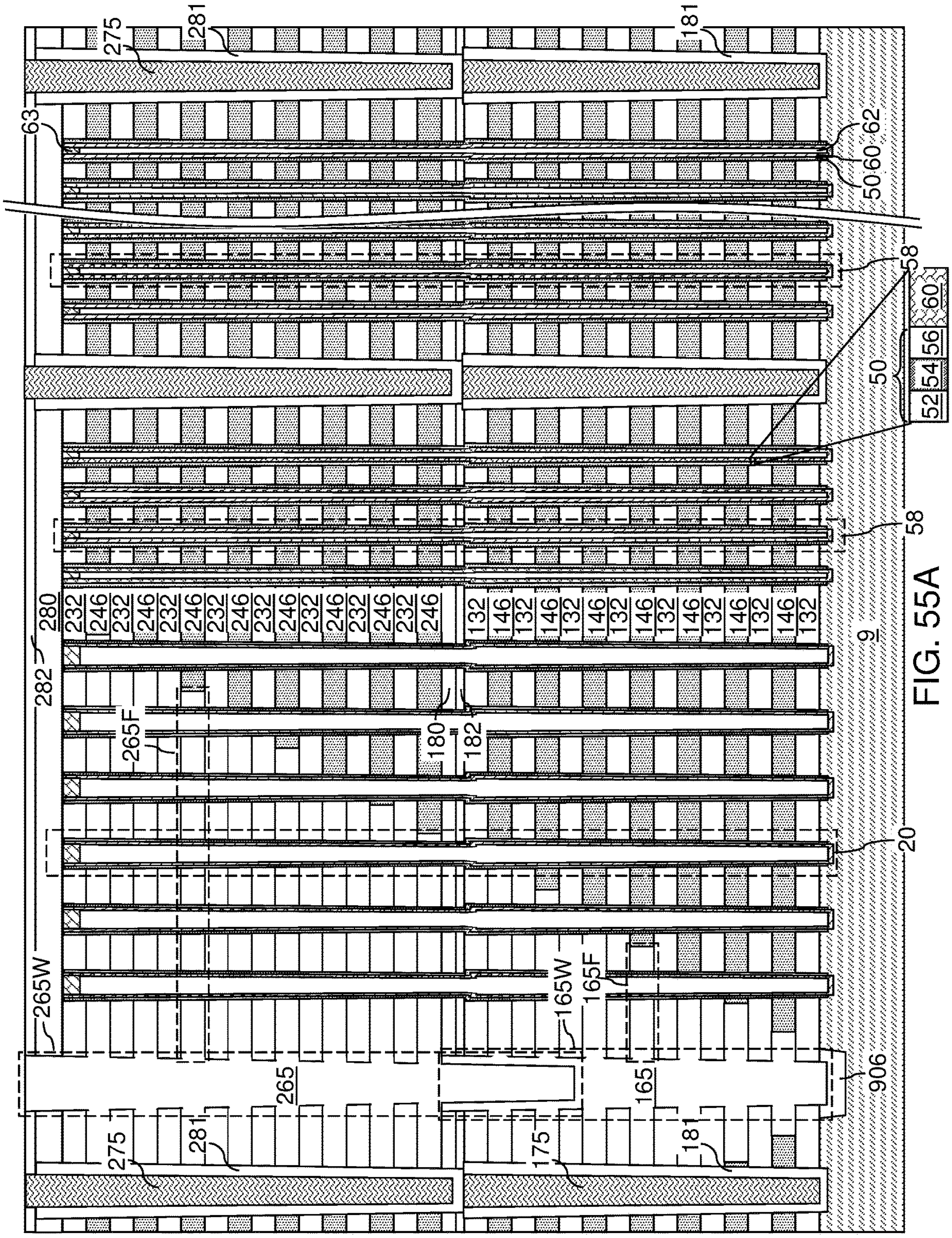
FIG. 55A is a vertical cross-sectional view of the second exemplary structure after formation of finned dielectric support structures in finned access cavities according to the second embodiment of the present disclosure.
Figure 55B:
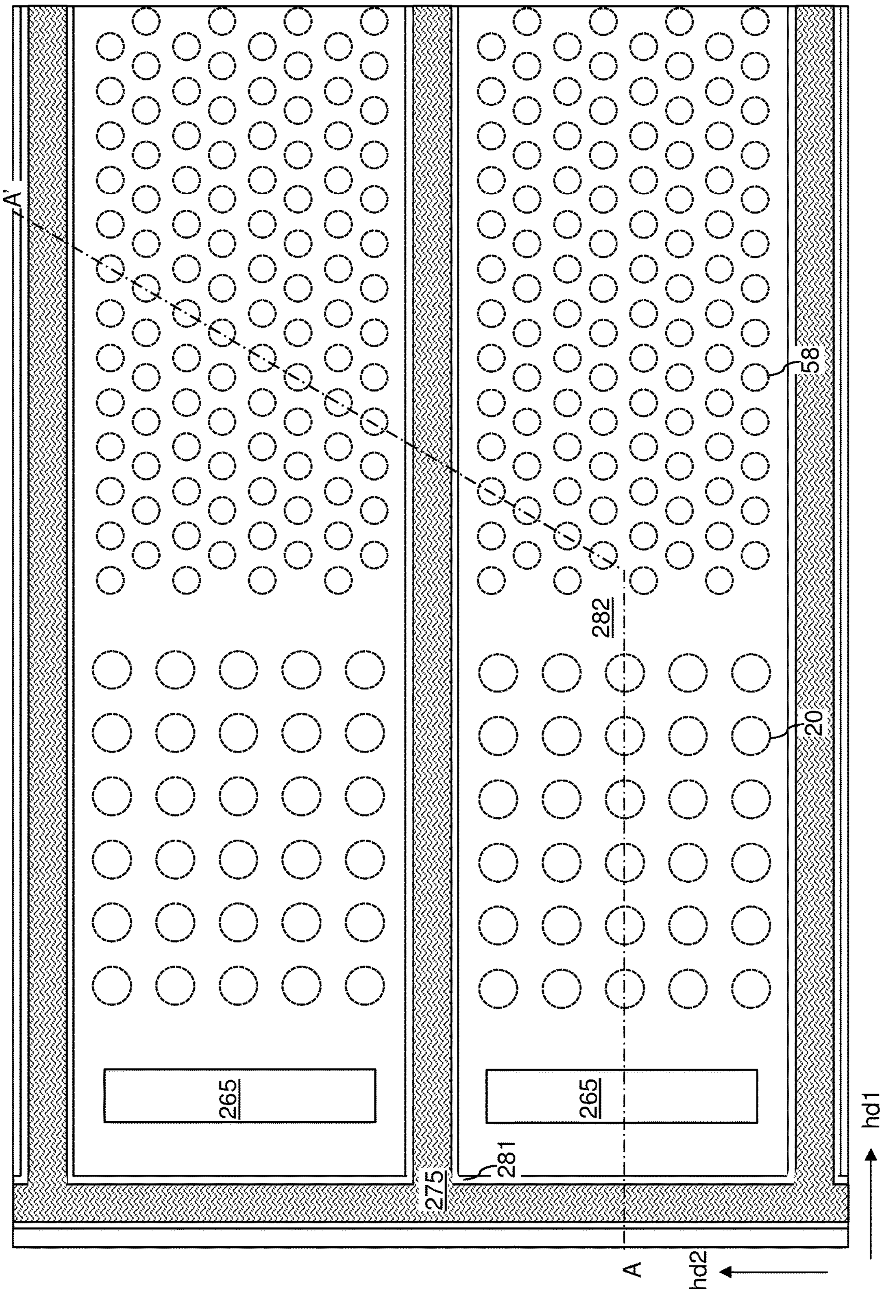
FIG. 55B is a top-down view of the second exemplary structure of FIG. 55A. The vertical plane A-A' is the cut plane of the vertical cross-sectional view of FIG. 55A.

Referring to FIGS. 55A and 55B, a second dielectric fill material such as silicon oxide can be formed in the second finned access cavities 269' and over the sacrificial capping layer 283 by a conformal deposition process such as a low pressure chemical vapor deposition process. A horizontally-extending portion of the second dielectric fill material can be removed from above the horizontal plane including the top surface of the sacrificial capping layer 283 by a recess etch process. Each remaining portion of the second dielectric fill material that fills a respective second finned access cavity 269' constitutes a second finned dielectric support structure 265.

In one embodiment, each second finned dielectric support structure 265 comprises a second dielectric wall portion 265W that continuous vertically extends from the substrate 9 to a horizontal plane including top surfaces of the sacrificial capping layer 283, and second dielectric fin structures 265F that are located at levels of the second sacrificial material layers 242 and laterally protrudes outward from the second dielectric wall portion 265W. In one embodiment, a plurality of the second dielectric fin structures 265F within each second finned dielectric support structure 265 comprises a respective second sidewall that is formed directly on a sidewall of a respective one of the second sacrificial material layers 242, and a respective second sidewall that is formed on a surface segment of the second backside trench dielectric liner 281.

In one embodiment, the second dielectric fin structures 265F have different lateral extents along a first horizontal direction hd1 that increase with a vertical distance from a top surface of the substrate 9, and each of the second dielectric fin structures 265F comprises a respective horizontal top surface that contacts a horizontal bottom surface of a respective overlying second insulating layer 232 and a respective additional horizontal top surface that contacts a horizontal top surface of the respective underlying second insulating layer 232. In one embodiment, contact areas between each contacting pair of a respective second dielectric fin structure 265F and a respective overlying second insulating layer 232 increase with a vertical distance from a top surface of the substrate 9.

One and/or a plurality of the second dielectric fin structures 265F may contact and/or may laterally surround a respective subset of the respective support pillar structures 20. In one embodiment, a subset of the second dielectric fin structures 265F including a topmost second dielectric fin structure 265F comprises a respective set of at least one opening therethrough. Each opening in a second dielectric fin structure 265F laterally surrounds a respective support pillar structure 20. In one embodiment, a total number of openings within each of the second dielectric fin structures 265F increases with a vertical distance from a top surface of the substrate 9. In one embodiment, the support pillar structures 20 vertically extend through a subset of the openings through the second dielectric fin structures 265F.

In one embodiment, one, a plurality and/or each of the second finned dielectric support structures 265 contacts lengthwise sidewalls of a pair of second elongated portions of the second-tier backside trench 279, and contact a widthwise sidewall of a second elongated portion of the second-tier backside trench 279. In one embodiment, the second dielectric wall portion 265W comprises a pair of lengthwise sidewall segments that laterally extend along the second horizontal direction hd2 at each level of the second insulating layers 232 and contact a sidewall of a respective one of the second insulating layers 232.

Figure 56:
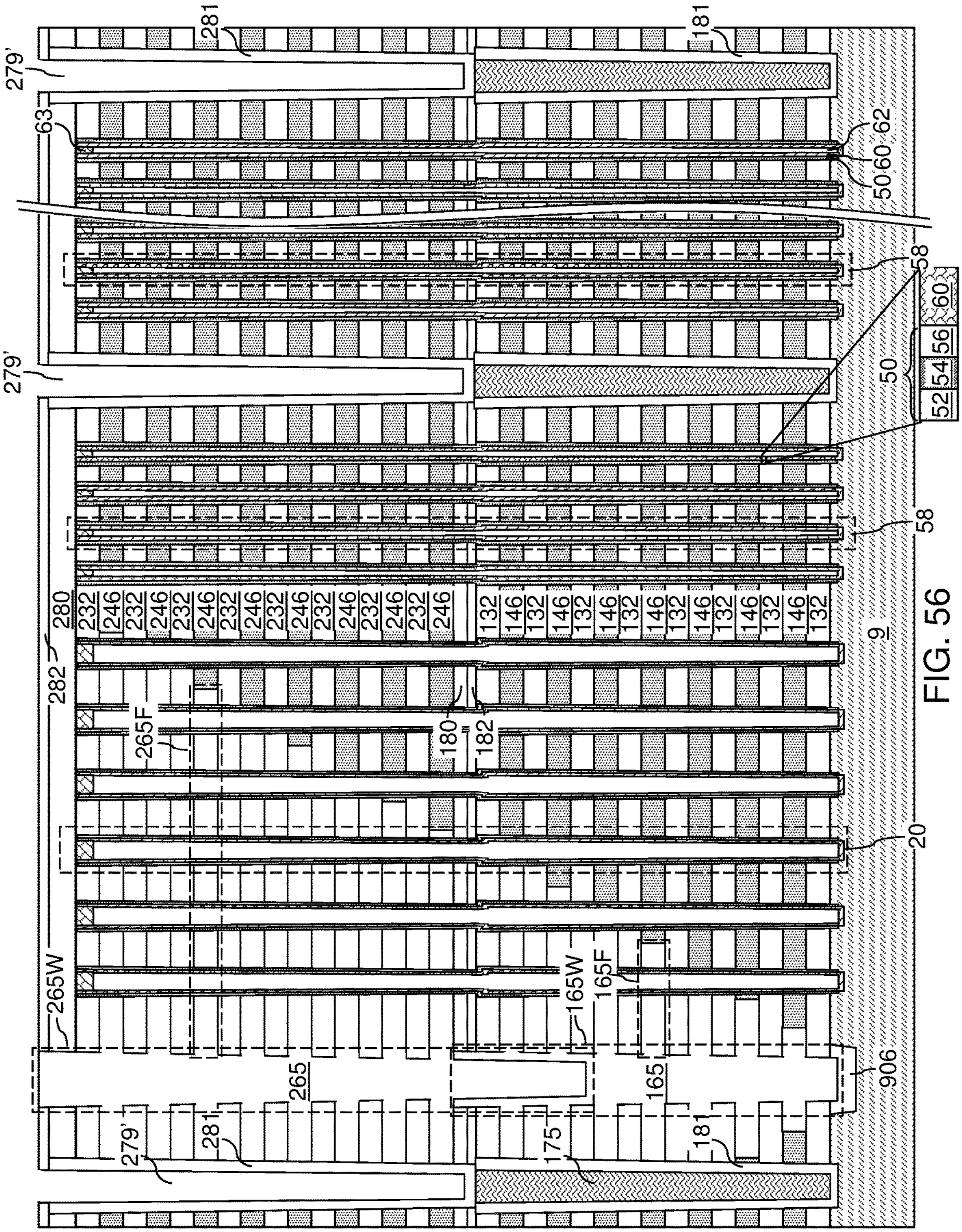
FIG. 56 is a vertical cross-sectional view of the second exemplary structure after removal of the second sacrificial backside trench fill structure according to the second embodiment of the present disclosure.

Referring to FIG. 56, the second-tier sacrificial backside trench fill structure 275 can be removed selective to the second continuous dielectric liner layer (281, 282) by performing a selective etch process. A second-tier backside cavity 279' can be formed in the volume from which the second-tier sacrificial backside trench fill structure 275 is removed.

Figure 57:
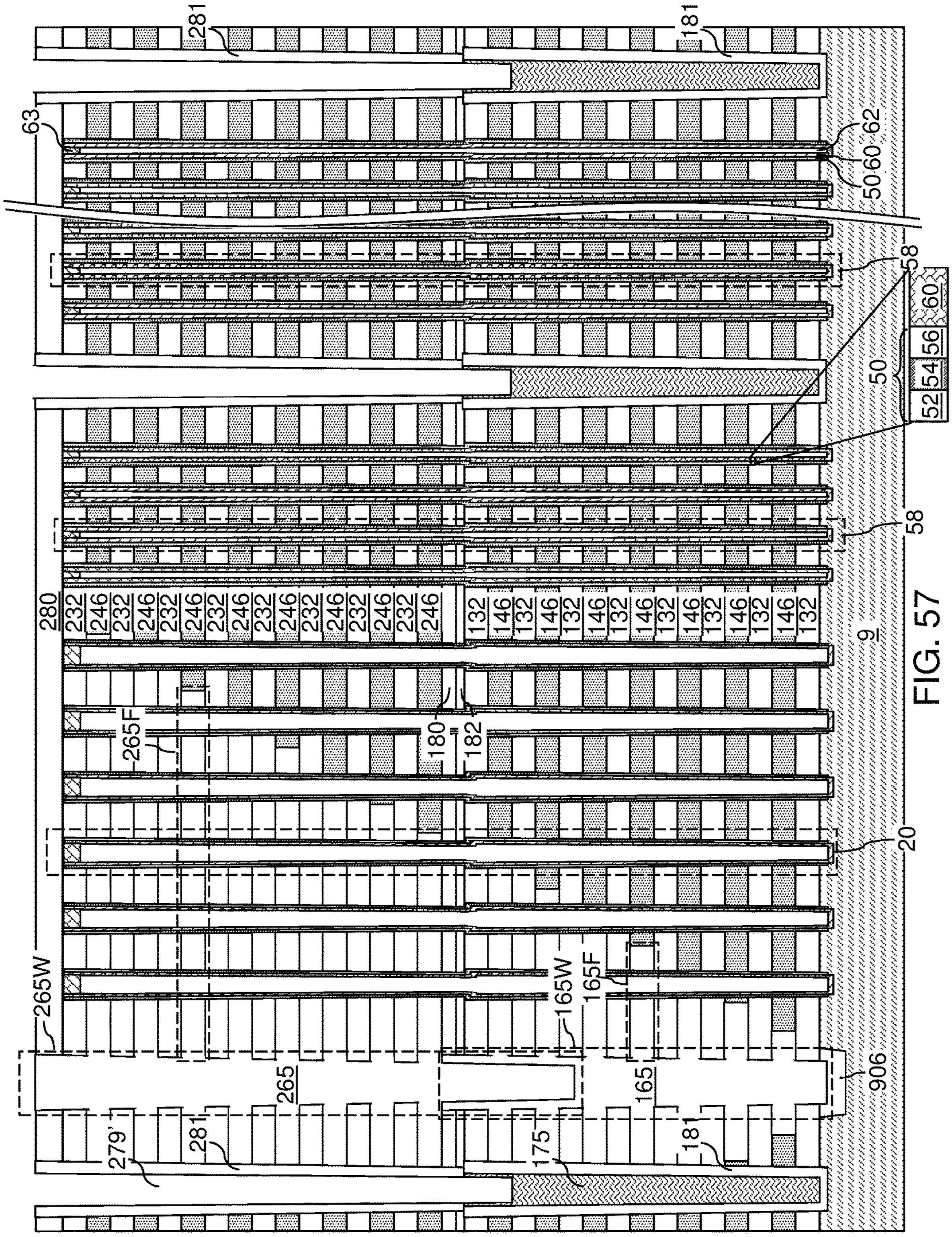
FIG. 57 is a vertical cross-sectional view of the second exemplary structure after an anisotropic etch process that removes horizontally-extending portions of the second continuous dielectric liner layer according to the second embodiment of the present disclosure.

Referring to FIG. 57, an anisotropic etch process can be performed to remove horizontally-extending portions of the second continuous dielectric liner layer (281, 282). The second planar dielectric liner 282 and bottom portions of the second backside trench dielectric liner 281 can be removed by the anisotropic etch process. Vertically-extending portions of the second backside trench dielectric liner 281 can be formed on the sidewalls of the second-tier backside trench 279.

Figure 58:
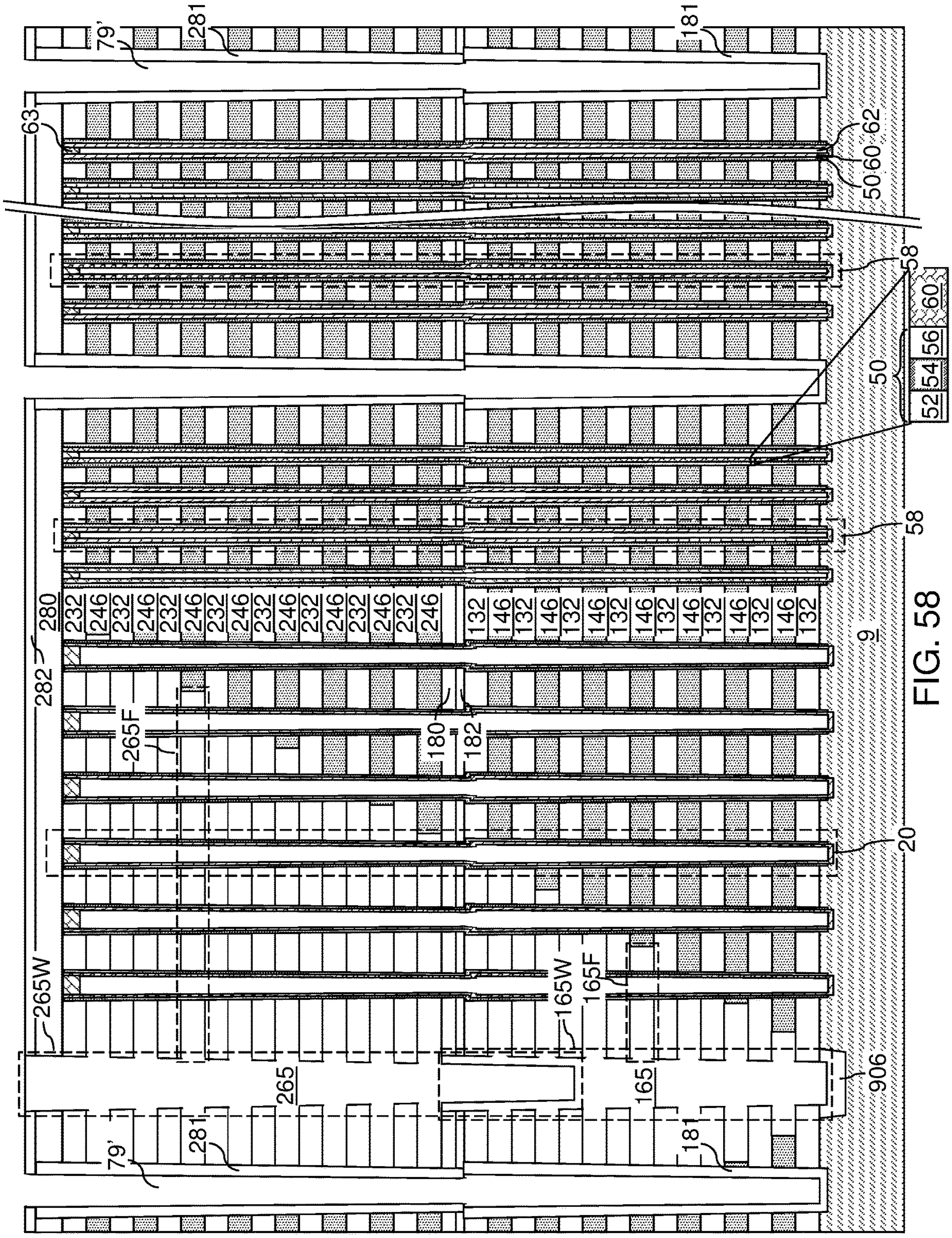
FIG. 58 is a vertical cross-sectional view of the second exemplary structure after removal of the first sacrificial backside trench fill structure according to the second embodiment of the present disclosure.

Referring to FIG. 58, the first-tier sacrificial backside trench fill structure 175 can be removed selective to the first continuous dielectric liner layer (181, 182) by performing a selective etch process. A backside cavity 79' can be formed in the volume from which the second-tier sacrificial backside trench fill structure 275 and the first-tier sacrificial backside trench fill structure 175 are removed. A first backside trench dielectric liner 181 covers the sidewalls and the bottom surface of the first-tier backside trench 179.

Figure 59:
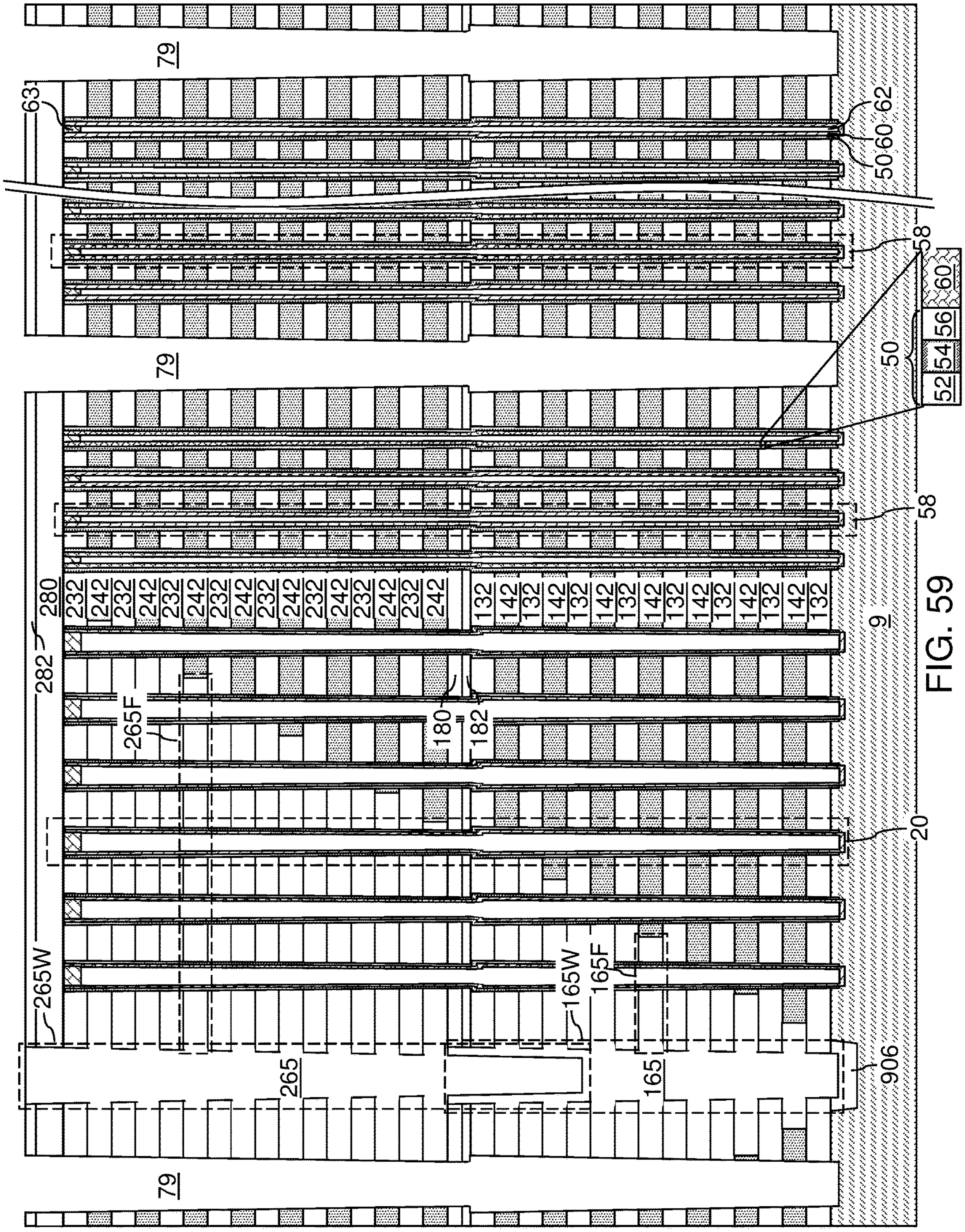
FIG. 59 is a vertical cross-sectional view of the second exemplary structure after removal of remaining portions of the continuous dielectric liner layers according to the second embodiment of the present disclosure.

Referring to FIG. 59, an isotropic etch process, such as a wet etch process employing dilute hydrofluoric acid, may be performed to remove the second backside trench dielectric liner 281 and the first backside trench dielectric liner 181. A backside trench 79 is formed in the volume from which the materials of the sacrificial backside trench fill structures (175, 175) and the backside trench dielectric liners (181, 281) are removed. The entire volume of the backside trench 79 may contain a continuously-extending void having a substantially same configuration as the backside trench 79 that is formed in the first exemplary structure described above.

Figure 60:
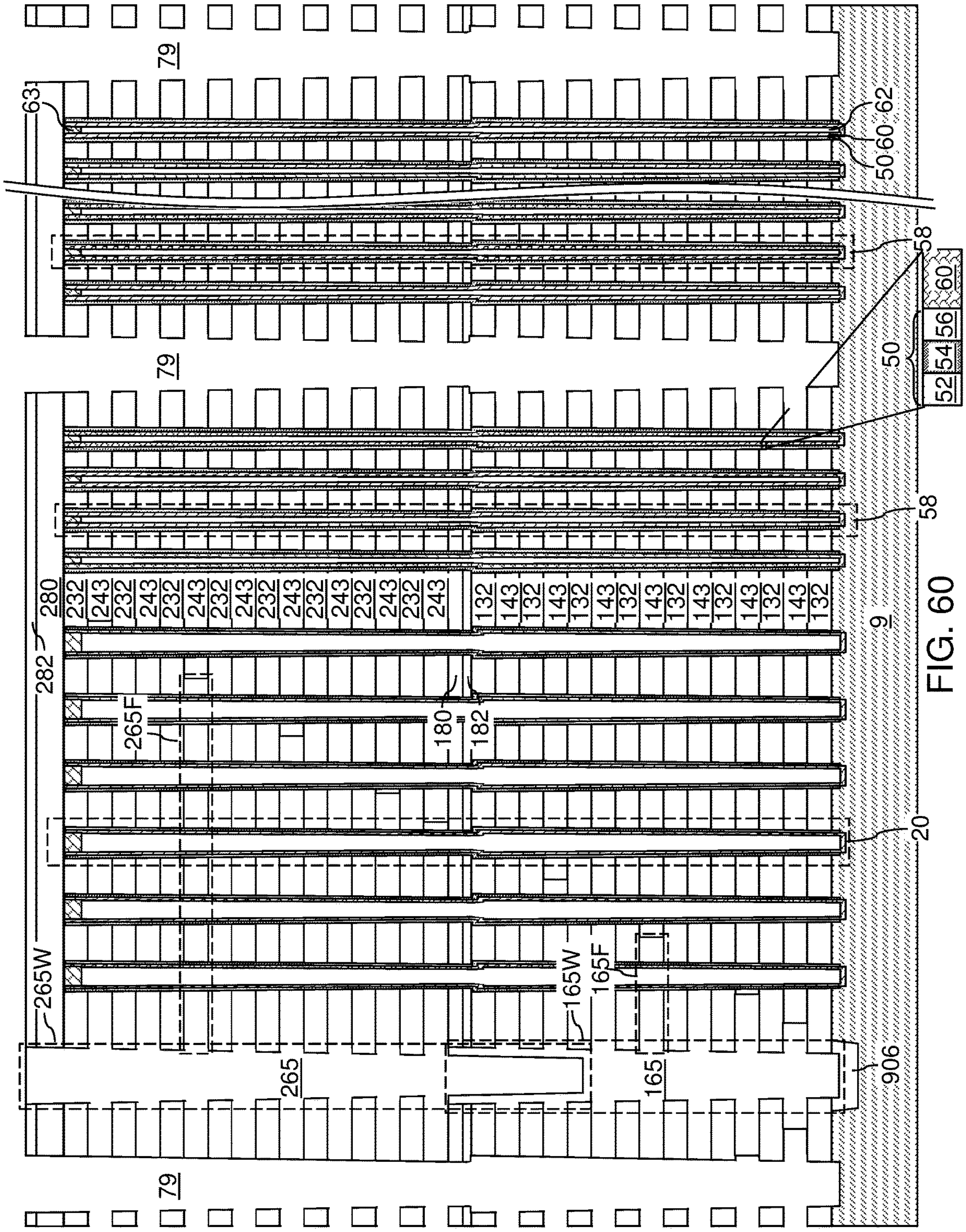
FIG. 60 is a vertical cross-sectional view of the second exemplary structure after formation of backside recesses according to the second embodiment of the present disclosure.

Referring to FIG. 60, an etchant that selectively etches the materials of the first and second sacrificial material layers (142, 242) with respect to the materials of the first and second insulating layers (132, 232), the finned dielectric support structures 65, and the material of the outermost layer of the memory films 50 can be introduced into the backside trench 79, for example, employing an isotropic etch process. First backside recesses 143 are formed in volumes from which the first sacrificial material layers 142 are removed. Second backside recesses 243 are formed in volumes from which the second sacrificial material layers 242 are removed.

The isotropic etch process can be a wet etch process employing a wet etch solution, or can be a gas phase (dry) etch process in which the etchant is introduced in a vapor phase into the backside trench 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the substrate 9. A backside recess (143, 243) can be vertically bounded by a top surface of an underlying insulating layer (132 or 232) and a bottom surface of an overlying insulating layer (132 or 232). In one embodiment, each of the first and second backside recesses (143, 243) can have a uniform height throughout.

Figure 61:
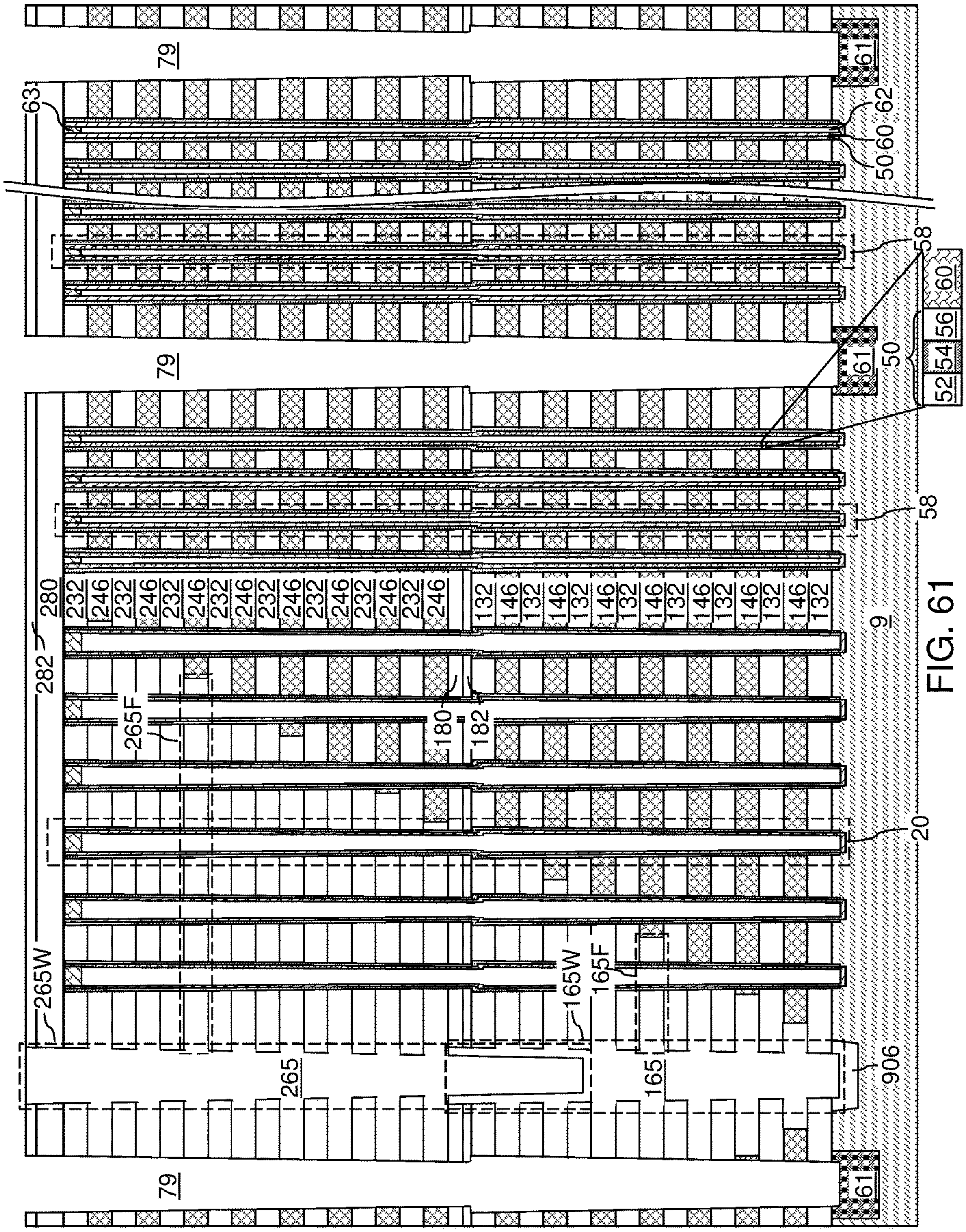
FIG. 61 is a vertical cross-sectional view of the second exemplary structure after formation of electrically conductive layers and a source region according to the second embodiment of the present disclosure.

Referring to FIG. 61, a backside blocking dielectric layer (not shown) can be optionally deposited in the backside recesses and the backside trench 79 and over the contact-level dielectric layer 280. At least one conductive material can be deposited in the plurality of backside recesses (143, 243), on the sidewalls of the backside trench 79, and over the contact-level dielectric layer 280. The at least one conductive material can include at least one metallic material, i.e., an electrically conductive material that includes at least one metallic element. Excess portions of the at least one conductive material can be removed from inside the backside trench 79 and from above the contact-level dielectric layer 280 by performing an etch back process, which may comprise an anisotropic etch process or an isotropic etch process.

A plurality of first electrically conductive layers 146 can be formed in the plurality of first backside recesses 143, a plurality of second electrically conductive layers 246 can be formed in the plurality of second backside recesses 243, and a continuous metallic material layer (not shown) can be formed on the sidewalls of each backside trench 79 and over the contact-level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

The deposited metallic material of the continuous metallic material layer can be etched back from the sidewalls of each backside trench 79 and from above the contact-level dielectric layers 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure. Each of the memory opening fill structures 58 comprises a vertical stack of memory elements (as embodied as portions of a respective memory film 50 such as portions of a charge storage layer 54) located at each level of the electrically conductive layers (146, 246). A subset of the electrically conductive layers (146, 246) can comprise word lines for the memory elements.

Dopants of the second conductivity type may be implanted into surface portions of the semiconductor material layer in the substrate 9 underneath the backside trench 79 to form a source region 61.

Figure 62A:
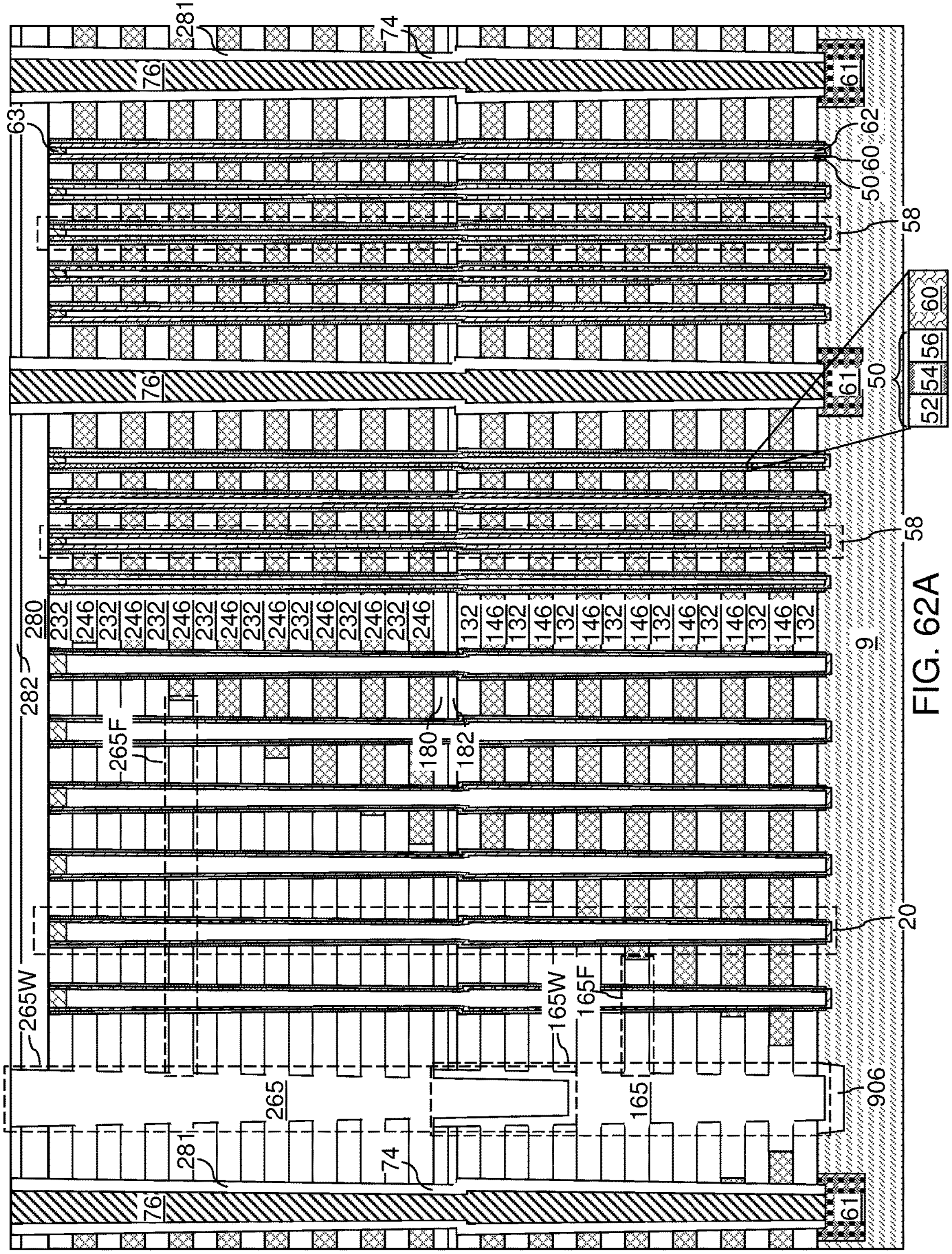
FIG. 62A is a vertical cross-sectional view of the second exemplary structure after formation of a backside trench fill structure according to the second embodiment of the present disclosure.
Figure 62B:
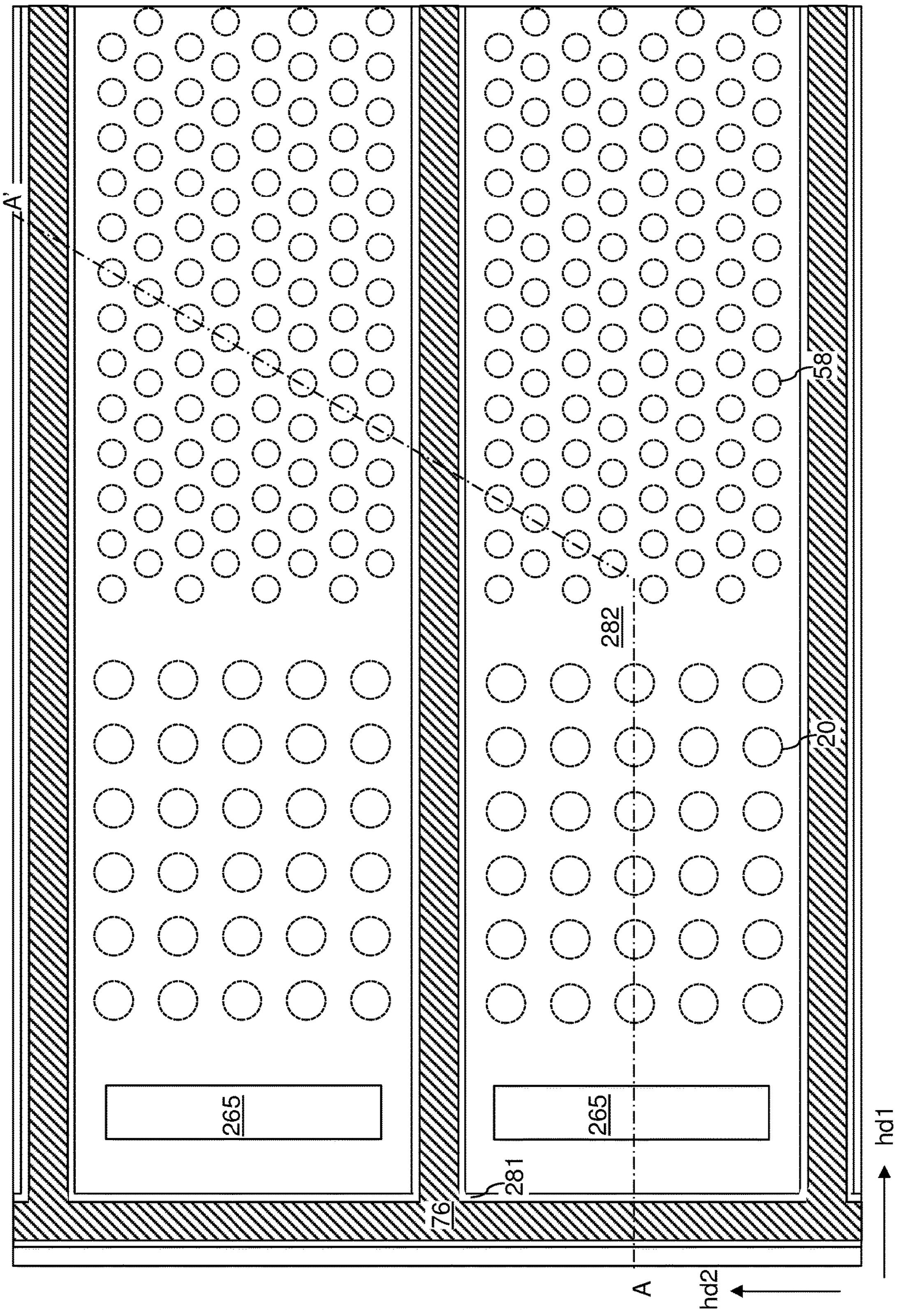
FIG. 62B is a top-down view of the second exemplary structure of FIG. 62A. The vertical plane A-A' is the cut plane of the vertical cross-sectional view of FIG. 62A.

Referring to FIGS. 62A and 62B, an insulating spacer material layer such as a silicon oxide layer can be formally deposited in the backside trench 79 and over the contact-level dielectric layers 280. An anisotropic etch process can be performed to remove horizontally-extending portions of the insulating spacer material layer from above the contact-level dielectric layers 280 and at the bottom of the backside trench 79. Each remaining vertically-extending tubular portion of the insulating spacer material layer constitutes a backside insulating spacer 74.

At least one conductive material, such as at least metallic material, can be subsequently deposited in the cavities in the backside trench 79. The at least one conductive material may comprise at least one metallic barrier material (e.g., a metallic nitride material such as TiN, TaN, and/or WN) and at least one metallic fill material (e.g., W, Cu, Co, Ru, Mo, etc.). Excess portions of the at least one metallic material can be removed from above the horizontal plane including the top surfaces of the contact-level dielectric layer 280 by a planarization process, which may employ a recess etch process and/or a chemical mechanical polishing process. The portion of the at least one metallic material constitutes a backside contact via structure 76. The combination of the backside insulating spacer 74 and the backside contact via structure 76 constitutes a backside trench fill structure (74, 76).

In one embodiment, the backside trench fill structure (74, 76) contacts sidewalls of each alternating stack {(132, 142), (232, 242)} and vertically extends through each layer within each alternating stack {(132, 142), (232, 242)}. In one embodiment, the backside trench fill structure (74, 76) comprises: at least two first elongated portions that laterally extend along a first horizontal direction hd1 and contacting lengthwise sidewalls of each of the insulating layers (132, 232) and each of the electrically conductive layers (146, 246); and at least one second elongated portion that laterally extends along a second horizontal direction hd2 that is different from the first horizontal direction hd1 and connecting a respective neighboring pair of first elongated portions of the backside trench fill structure (74, 76).

Figure 63A:
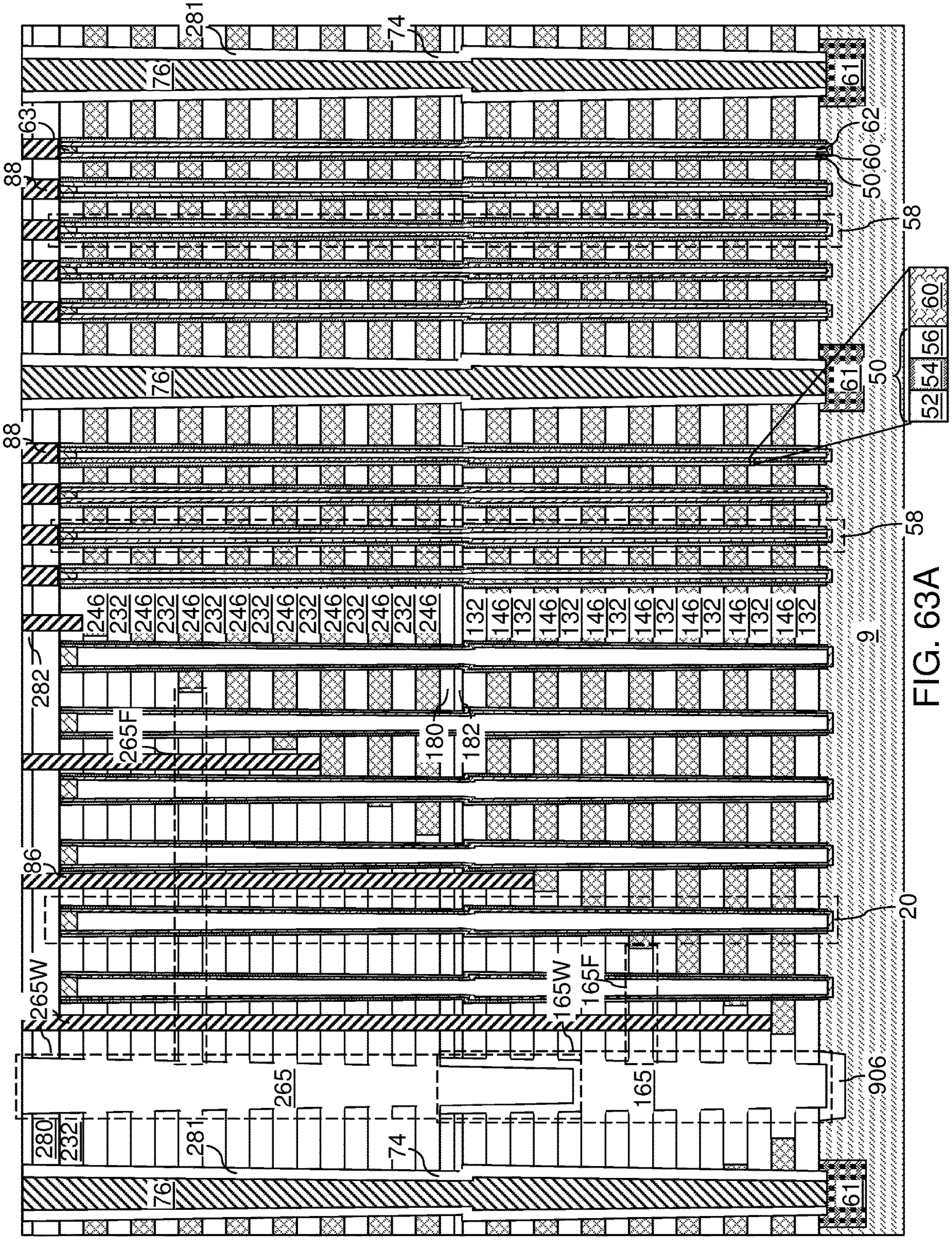
FIG. 63A is a vertical cross-sectional view of the second exemplary structure after formation of a various contact via structures according to the second embodiment of the present disclosure.
Figure 63B:
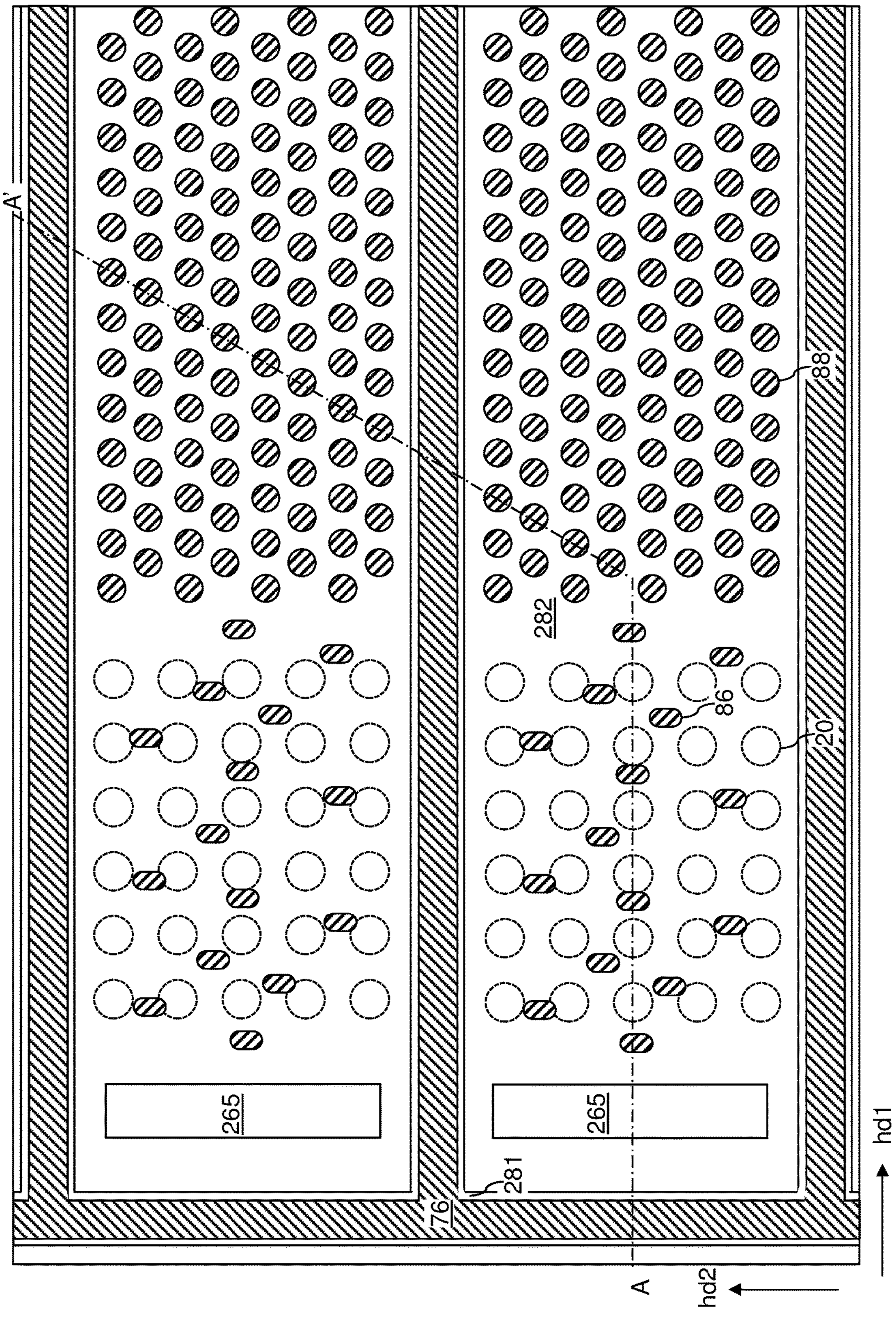
FIG. 63B is a top-down view of the second exemplary structure of FIG. 63A. The vertical plane A-A' is the cut plane of the vertical cross-sectional view of FIG. 63A.

Referring to FIGS. 63A and 63B, contact via structures (88, 86) can be formed through the contact-level dielectric layer 280 and through the finned dielectric support structures 65. Specifically, drain contact via structures 88 can be formed directly on a respective one of the drain regions 63. Layer contact via structures 86 can be formed on a top surface of a respective one of the electrically conductive layers (146, 246). A subset of the layer contact via structures 86 can vertically extend through a respective subset of the dielectric fin structures (165F, 265F). In one embodiment, layer contact via structures 86 can vertically extend through a first subset of the openings through a subset of the dielectric fin structures (165F, 265F); and each of the layer contact via structures 86 contacts a top surface of a respective one of the electrically conductive layers (146, 246).

Referring to all drawings and according to various embodiments of the present disclosure, a memory device is provided, which comprises: an alternating stack {(132, 146), (232, 246)} of insulating layers (132, 232) and electrically conductive layers (146, 246) located over a substrate 9, the electrically conductive layers (146, 246) having different lateral extents in a contact region (i.e., a staircase region) that decrease with a vertical distance from a top surface of the substrate 9; memory openings 49 vertically extending through the alternating stack {(132, 146), (232, 246)} and located in a memory array region in which each of the electrically conductive layers (146, 246) is present; memory opening fill structures 58 located in the memory openings 49 and comprising a vertical semiconductor channel 60 and respective vertical stack of memory elements (e.g., portions of the memory film 50) located at levels of the electrically conductive layers (146, 246); and a finned dielectric support structure (65, 165, 265) located in the contact region (i.e., a staircase region) and comprising a dielectric wall portion (65W, 165W, 265W) that continuous vertically extends from the substrate 9 at least to a horizontal plane including top surfaces of the memory opening fill structures 58, and further comprises dielectric fin structures (65F, 165F. 265F) that are located at levels of the electrically conductive layers (146, 246) and laterally protrude outward from the dielectric wall portion (65W, 165W, 265W).

In one embodiment, the dielectric fin structures (65F, 165F, 265F) have different lateral extents along a first horizontal direction hd1 that increase with a vertical distance from a top surface of the substrate 9.

In one embodiment, each of the dielectric fin structures (65F, 165F, 265F) comprises a respective horizontal top surface that contacts a horizontal bottom surface of a respective overlying insulating layer (132, 232) among the insulating layers (132, 232).

In one embodiment, contact areas between each contacting pair of a respective dielectric fin structure (65F, 165F, 265F) and a respective overlying insulating layer (132, 232) increase with a vertical distance from a top surface of the substrate 9.

In one embodiment, a subset of the dielectric fin structures (65F, 165F, 265F) including a topmost dielectric fin structure (65F, 165F, 265F) comprises a respective set of at least one opening therethrough. In one embodiment, a total number of openings within each of the dielectric fin structures (65F, 165F, 265F) increases with a vertical distance from a top surface of the substrate 9.

In one embodiment, layer contact via structures 86 vertically extend through a first subset of the openings through the subset of the dielectric fin structures (65F, 165F, 265F); and each of the layer contact via structures 86 contacts a top surface of a respective one of the electrically conductive layers (146, 246). In one embodiment, support pillar structures 20 vertically extend through a second subset of the openings through the subset of the dielectric fin structures (65F, 165F, 265F) and contacts the substrate 9.

In one embodiment, the memory device comprises a backside trench fill structure (74, 76) contacting sidewalls of the alternating stack {(132, 146), (232, 246)} and vertically extending through each layer within the alternating stack {(132, 146), (232, 246)}. In one embodiment, the backside trench fill structure (74, 76) comprises: at least two first elongated portions that laterally extend along a first horizontal direction hd1 and contact lengthwise sidewalls of each of the insulating layers (132, 232) and each of the electrically conductive layers (146, 246); and at least one second elongated portion that laterally extends along a second horizontal direction hd2 that is different from the first horizontal direction hd1 and connecting a respective neighboring pair of first elongated portions of the backside trench fill structure (74, 76).

In one embodiment, the finned dielectric support structure (65, 165, 265) contacts lengthwise sidewalls of a pair of first elongated portions of the backside trench fill structure (74, 76) and contacts a widthwise sidewall of a second elongated portion of the backside trench fill structure (74, 76); and the dielectric wall portion (65W, 165W, 265W) comprises a pair of lengthwise sidewall segments that laterally extend along the second horizontal direction hd2 at each level of the insulating layers (132, 232).

In one embodiment, each of the dielectric fin structures (65F, 165F, 265F) comprises: a first sidewall that contacts a respective one of the electrically conductive layers (146, 246) or is laterally spaced from the respective one of the electrically conductive layers (146, 246) by a backside blocking dielectric layer; and a second sidewall that is parallel to the first sidewall and contacts the backside trench fill structure (74, 76).

The various embodiments of the present disclosure can be employed to provide a contact region (i.e., staircase region) in which lateral extents of the electrically conductive layers (146, 246) decrease with a vertical distance from the top surface of a substrate 9 so that layer contact via structures 86 can provide electrical contact to each of the electrically conductive layers (146, 246) within at least one alternating stack of insulating layers (132, 232) and electrically conductive layers (146, 246). The embodiment structures may reduce the backside trench 79 widening and bending in the contact region, which improves the reliability of the device. Furthermore, dummy staircases which are mirror image of active staircases that are present in prior art structures are eliminated, thus increasing the active area of the embodiment structures compared to prior art structures. Furthermore, the methods of making the embodiment structures reduces the number of lithography and reactive ion etching steps that are used to form prior art staircase regions. Furthermore, the prior art planarization of wide dielectric layer over the staircase region is eliminated, thus simplifying the process.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:

an alternating stack of insulating layers and electrically conductive layers located over a substrate, the electrically conductive layers having different lateral extents in a contact region that decrease with a vertical distance from a top surface of the substrate;

memory openings vertically extending through the alternating stack and located in a memory array region in which each of the electrically conductive layers is present;

memory opening fill structures located in the memory openings and comprising a vertical semiconductor channel and a respective vertical stack of memory elements located at levels of the electrically conductive layers;

a finned dielectric support structure located in the contact region and comprising a dielectric wall portion that continuous vertically extends from the substrate at least to a horizontal plane including top surfaces of the memory opening fill structures, and further comprises dielectric fin structures that are located at levels of the electrically conductive layers and laterally protrude outward from the dielectric wall portion; and a backside trench fill structure contacting sidewalls of the alternating stack and vertically extending through each layer within the alternating stack, wherein the backside trench fill structure comprises:

at least two first elongated portions that laterally extend along a first horizontal direction and contact lengthwise sidewalls of each of the insulating layers and each of the electrically conductive layers; and at least one second elongated portion that laterally extends along a second horizontal direction that is different from the first horizontal direction and connecting a respective neighboring pair of first elongated portions of the backside trench fill structure.

2. The memory device of claim 1, wherein the dielectric fin structures have different lateral extents along a first horizontal direction that increase with a vertical distance from a top surface of the substrate.

3. The memory device of claim 1, wherein each of the dielectric fin structures comprises a respective horizontal top surface that contacts a horizontal bottom surface of a respective overlying insulating layer among the insulating layers.

4. The memory device of claim 3, wherein contact areas between each contacting pair of a respective dielectric fin structure and a respective overlying insulating layer increase with a vertical distance from a top surface of the substrate.

5. The memory device of claim 1, wherein a subset of the dielectric fin structures including a topmost dielectric fin structure comprises a respective set of at least one opening therethrough.

6. The memory device of claim 5, wherein a total number of openings within each of the dielectric fin structures increases with a vertical distance from a top surface of the substrate.

7. The memory device of claim 5, wherein:

layer contact via structures vertically extend through a first subset of the openings through the subset of the dielectric fin structures; and each of the layer contact via structures contacts a top surface of a respective one of the electrically conductive layers.

8. The memory device of claim 5, wherein support pillar structures vertically extend through a second subset of the openings through the subset of the dielectric fin structures and contacts the substrate.

9. The memory device of claim 1, wherein:

the finned dielectric support structure contacts lengthwise sidewalls of a pair of first elongated portions of the backside trench fill structure and contacts a widthwise sidewall of a second elongated portion of the backside trench fill structure; and the dielectric wall portion comprises a pair of lengthwise sidewall segments that laterally extend along the second horizontal direction at each level of the insulating layers.

10. The memory device of claim 1, wherein each of the dielectric fin structures comprises:

a first sidewall that contacts a respective one of the electrically conductive layers or is laterally spaced from the respective one of the electrically conductive layers by a backside blocking dielectric layer; and a second sidewall that is parallel to the first sidewall and contacts the backside trench fill structure.

* * * * *